United States Patent [19]
Shimizu et al.

[11] Patent Number: 6,017,781
[45] Date of Patent: Jan. 25, 2000

[54] METHOD FOR MAKING A THIN FILM TRANSISTOR

[75] Inventors: Satoshi Shimizu; Shuichi Ueno; Shigenobu Maeda; Takashi Ipposhi, all of Hyogo, Japan

[73] Assignee: Mitsubishi Denki Kabushiki Kaisha, Tokyo, Japan

[21] Appl. No.: 08/755,734

[22] Filed: Nov. 25, 1996

Related U.S. Application Data

[62] Division of application No. 08/546,514, Oct. 20, 1995, Pat. No. 5,600,154, which is a continuation of application No. 08/257,414, Jun. 7, 1994.

[30] Foreign Application Priority Data

Jun. 10, 1993 [JP] Japan .................................. 5-138432
Jun. 1, 1994 [JP] Japan .................................. 6-120224

[51] Int. Cl.$^7$ .................................................. H01L 21/84
[52] U.S. Cl. ............................................ 438/158; 438/479
[58] Field of Search ...................................... 438/158, 479

[56] References Cited

U.S. PATENT DOCUMENTS 5,266,816  11/1993  Seto et al. .
5,278,093   1/1994  Yonehara et al. ........................ 438/479

OTHER PUBLICATIONS

"Oxidation and MOS Characteristics of Silicon by $N^+$–Ion–Implantation Process," Kudo et al., SDM89–160, pp. 7–12.

"Nucleation Controlled Poly–Si TFT by Selective Doping," T. Katoh et al., Extended Abstracts of the 1993 Inter. Conference on Solid State Devices and Materials, pp. 428–430.

Polycrystalline Si Thin–Film Transistors Fabricated at 800° C: Effects of Grain Size and {110} Fiber Texture, K. T. Y. Kung et al., J. Apl. Phys. 62 (4), Aug. 15, 1987, pp. 1503–1509.

Influence of $^{16}O$, $^{12}C$, $^{14}N$, and Noble Gases on the Crystallization of Amorphous Si Layers, E.F. Kennedy et al., Journal of Applied Physics, vol. 48, No. 10, Oct. 1977, pp. 4241–4246.

Novel NICE (Nitrogen Implantation Itno CMOS Gate Electrode and Source–Drain) Structure for High Reliability and High Performance 0.25 $\mu$m Dual Gate CMOS, T. Kuroi et al., IEDM 93, pp. 325–328.

*Primary Examiner*—Chandra Chaudhari
*Assistant Examiner*—Craig Thompson
*Attorney, Agent, or Firm*—McDermott, Will & Emery

[57] ABSTRACT

According to a method of manufacturing a thin film transistor (TFT), amorphous silicon is formed by ion-implanting either silicon or nitrogen into a region of polysilicon while a region located at the sidewall of a gate electrode is selectively left using the stepped portion of the gate electrode. Then, a heat treatment is applied to convert the amorphous silicon into polysilicon with the remaining polysilicon as a seed crystal. As a result, polysilicon having crystal grains of great grain size can be formed in uniform. Thus, the electric characteristics of a TFT can be improved with no difference in the electric characteristics between each TFT.

5 Claims, 51 Drawing Sheets

FIG.76
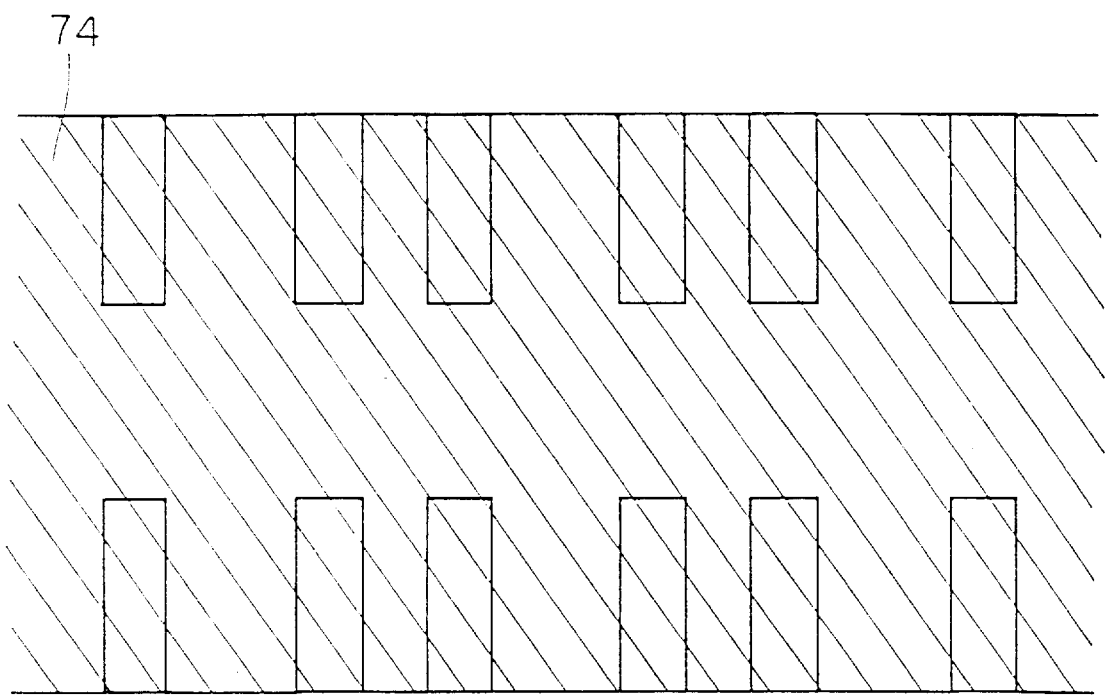
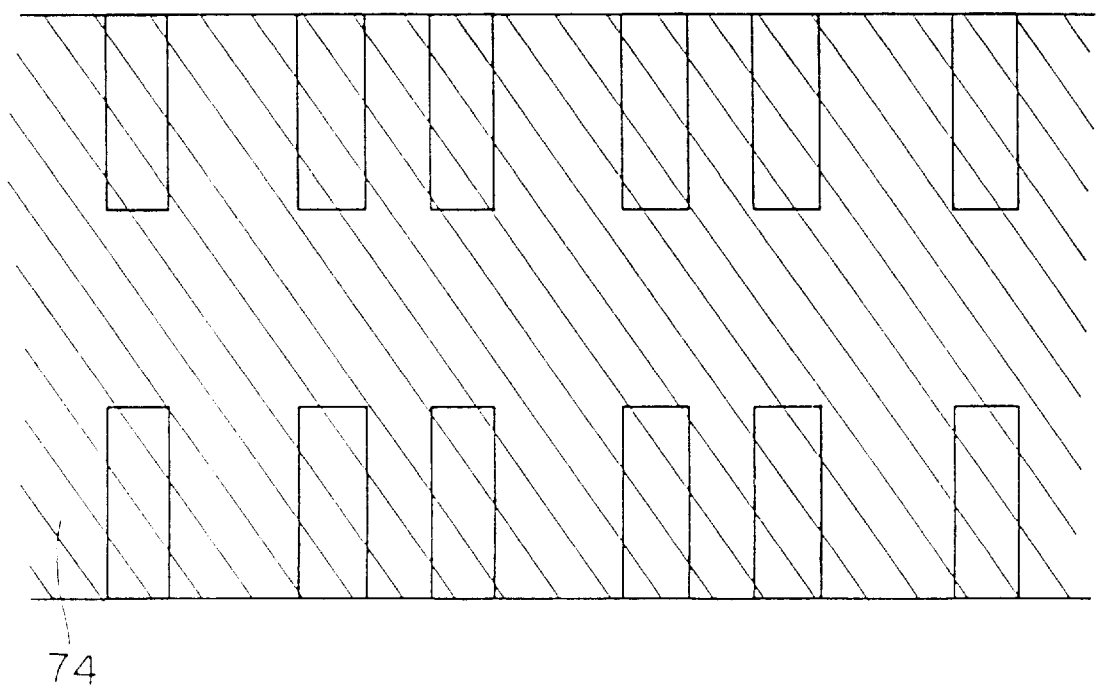

METHOD FOR MAKING A THIN FILM TRANSISTOR

This application is a division of application Ser. No. 08/546,514 filed Oct. 20, 1995, now U.S. Pat. No. 5,600,154, which is a continuation is application Ser. No. 08/257,414 filed Jun. 7, 1994.

BACKGROUND OF THE INVENTION

1. Field of the Invention

The present invention relates to a thin film transistor and a method of manufacturing thereof, and more particularly, to a thin film transistor of a polysilicon film and a method of manufacturing thereof.

2. Description of the Background Art

A thin film transistor (TFT) is a known semiconductor device, used as a load transistor of a highly integrated SRAM, and a drive transistor for a liquid crystal panel display. To meet the demand of high performance of devices employing TFTs, significant improvement in the electric characteristics of a TFT itself is desired.

A TFT is generally formed of a polysilicon film. The electric characteristics thereof are greatly affected by the grain boundary in a field region. The localized level depending on a grain boundary acts as a capture trap of carriers and as a generation center of an electron-hole pair. The presence of a grain boundary in a channel region of a TFT results in the capture of carriers to form a potential barrier by which passage of carriers are prevented. This induces a problem of lowering the ON current of a TFT. The presence of a grain boundary in the pn junction at the drain side will cause generation of a great amount of electron-hole pairs, resulting in increase of OFF current in a TFT. Conventionally, the electric characteristics of a TFT was improved by increasing the grain size of polysilicon for the channel to reduce the number of grain boundaries.

FIG. 80 is a sectional view of a conventional TFT for describing a method of manufacturing thereof; FIG. 81 is a plan view of the conventional TFT of FIG. 80; and FIG. 82 is a perspective view of a TFT formed according to a conventional manufacturing method.

A conventional manufacturing process of a TFT will be described hereinafter with reference to FIGS. 80–82.

Referring to FIG. 80, a polysilicon layer (not shown) of approximately 1500 Å in thickness is formed by CVD on an insulating film 101, which is patterned to result in a gate electrode 102. A gate insulating film 103 of approximately 300 Å in thickness is formed so as to cover gate electrode 102 by CVD. An amorphous silicon layer 104 is formed by CVD on gate insulating film 103 to a thickness of approximately 800 Å. A heat treatment at a temperature condition of approximately 600° C. is applied to solid phase grow an amorphous silicon layer 104. Thus, polysilicon 105 as shown in FIG. 81 is formed. Referring to FIG. 81, there is a grain boundary 106 at the boundary region of polysilicon 105. By growing polysilicon 105 according to the above-described process, polysilicon 105 having a grain size of approximately several thousand Å can be formed. Since the grain size of polysilicon formed by CVD is approximately 100 Å, the above-described manufacturing process provides polysilicon 105 of a grain size several ten times thereof.

Then, source/drain regions 111 and 112, and a field 150 are formed.

FIG. 83 is a graph showing the electric characteristics of a TFT obtained by the conventional manufacturing method of FIG. 82. Referring to FIG. 83, gate voltage is plotted along the abscissa, and drain current is plotted along the ordinate. The drain current plotted along the ordinate shows the measured result of a pattern where 10000 TFTs are connected in parallel, each TFT having a channel length of 1.3 μm and a channel width of 0.6 μm. The TFT shown in FIG. 82 is a solid phase grown poly TFT. It is apparent from the graph of FIG. 82 that the ON current is one order of magnitude greater than that of a CVD poly TFT manufactured by CVD. Conventionally, the characteristics of a TFT was improved by forming polysilicon 105 increased in grain size by solid phase growing amorphous silicon layer 104, as shown in FIG. 82.

However, it is to be noted that the data shown in FIG. 83 represents the average value of 10000 TFTs. The property of each TFT for all the 10000 TFTs is not necessarily improved. FIG. 84 is a graph showing the electric characteristics of three single TFTs on the same wafer manufactured according to the process shown in FIGS. 80–82. It is appreciated from the graph of FIG. 84 that there is a variation of approximately one order of magnitude in the drain current between each of the three TFTs.

This variation is due to the fact that the crystals are grown in random since there is no selectivity in the solid phase growth when converting amorphous silicon layer 104 into polysilicon 105. A TFT with a grain boundary in the channel or a TFT with no grain boundary will be formed in random, resulting in difference in the characteristics of each TFT as shown in FIG. 84. Although it can be observed that the grain size of the solid phase grown polysilicon 105 according to the process shown in FIG. 81 is increased in average, the grain is not in uniform, and there are partially extremely small grains. The presence of such small grains in a channel portion of a TFT will degrade the characteristics of a TFT. This is also considered to be the cause of reducing the uniformity of characteristics of each TFT.

Thus, it was difficult to selectively grow polysilicon 105 according to the above-described method of forming polysilicon 105 having a large grain size from an amorphous silicon layer 104. This results in a problem that there is variation in the characteristics between each TFT.

SUMMARY OF THE INVENTION

In order to solve the above-described problems, an object of the present invention is to provide a method of manufacturing a thin film transistor (TFT) having improved electrical characteristics of each TFT improved and to obtain a plurality of TFTs having similar, i.e., uniform, characteristics.

According to an aspect of the present invention, a method of manufacturing a thin film transistor includes the steps of: forming a gate electrode on an insulating film; forming a gate insulating film to cover the gate electrode; forming a polysilicon film on the gate insulating film; forming amorphous silicon by ion-implanting either silicon or nitrogen into a predetermined region of the polysilicon film to render a portion of the polysilicon film amorphous with the polysilicon film partially remaining; and applying a heat treatment to convert the amorphous silicon into polysilicon with the remaining polysilicon film as a seed crystal.

According to the above-described method of manufacturing a thin film transistor, a polysilicon film serving as a seed crystal can be selectively left by the above-described silicon ion implantation, whereby solid phase recrystallization of the amorphous silicon is carried out in uniform. By forming a thin film transistor using such solid phase recrystallized polysilicon, the characteristics of each thin film transistor is made uniform. Furthermore, the characteristics of each thin film transistor is improved by the recrystallized polysilicon of a large grain size.

According to another aspect of the present invention, a method of manufacturing a thin film transistor includes the steps of: forming a polysilicon film on an insulating film; forming a first mask layer on a first region of the polysilicon film; forming a first amorphous silicon by ion-implanting either silicon or nitrogen into the polysilicon film using the first mask layer as a mask to render the region of the polysilicon film other than the first region amorphous; applying a heat treatment to convert the first amorphous silicon into polysilicon with the polysilicon film of the first region as a seed crystal; forming a second mask layer on a second region of the polysilicon film; forming a second amorphous silicon by ion-implanting either silicon or nitrogen into the polysilicon film using the second mask layer as a mask to render the region of the polysilicon film other than the second region amorphous; and applying a heat treatment to convert the second amorphous silicon into polysilicon with the polysilicon film of the second region as a seed crystal.

According to the above-described method of manufacturing a thin film transistor, polysilicon of a great grain size is formed in the region other than the first region. Furthermore, polysilicon of a great grain size is easily formed in the region other than the second region. By appropriately adjusting the position of the first region covered with the first mask layer and the second region covered with the second mask layer, the polysilicon portion corresponding to an active region of a thin film transistor can be made in one great crystal. Thus, a thin film transistor with no grain boundary in an active region can be readily formed, whereby a thin film transistor is obtained having a high ON current and a low OFF current.

According to a further aspect of the present invention, a method of manufacturing a thin film transistor includes the steps of: forming a polysilicon. film on an insulating film; forming a first mask layer on a first region of the polysilicon film; forming a first amorphous silicon by ion-implanting either silicon or nitrogen into the polysilicon film using the first mask layer as a mask to render the region of the polysilicon film other than the first region amorphous; applying a heat treatment to convert the first amorphous silicon into polysilicon with the polysilicon film of the first region as a seed crystal; forming a second amorphous silicon by ion-implanting either silicon or nitrogen into the polysilicon film at an implantation energy that penetrates the first mask layer to render the first region of the polysilicon film under the first mask layer amorphous; and applying a heat treatment to convert the second amorphous silicon into polysilicon with the polysilicon film in the region other than the first region as a seed crystal.

According to the above-described method of manufacturing a thin film transistor, polysilicon having a great grain size is formed in the region other than the first region. Furthermore, polysilicon having a great grain size is formed in the first region. Therefore, polysilicon of a great grain size can easily be formed without increasing the number of mask layers.

According to still another aspect of the present invention, a thin film transistor includes a gate electrode, a gate insulating film, and a polysilicon film. The gate electrode is formed on the insulating film. The gate insulating film is formed to cover the gate electrode. The polysilicon film is formed on the gate insulating film. On the main surface of the polysilicon film, a pair of source/drain regions is formed with a predetermined distance therebetween so as to sandwich a channel region. The grain size of all the crystals located in at least the channel region and the source/drain region of the polysilicon film is at least 1000 Å. Nitrogen is included in at least the channel region and the source/drain region of the polysilicon film.

Because the grain size of all the crystals located in at least the channel region and the source/drain region of the polysilicon film formed on the gate insulating film is at least 1000 Å, the characteristics of each thin film transistor formed by the polysilicon film is made uniform. Also, the characteristics of each thin film transistor is improved by polysilicon of a great grain size. Because nitrogen is included in at least the channel region and the source/drain region of the polysilicon film, generation of interfacial level is suppressed. This suppresses generated hot carriers from being trapped between the polysilicon film and the gate insulating film, whereby the hot carrier resistance is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 72–77 are plan views of a TFT for describing 1st–6th manufacturing steps according to a twelfth embodiment of the present invention.

DESCRIPTION OF THE PREFERRED EMBODIMENTS

The embodiments of the present invention will be described hereinafter with reference to the drawings.

A first embodiment of a TFT manufacturing method will be described with reference to FIGS. 1–6.

Figure 1:
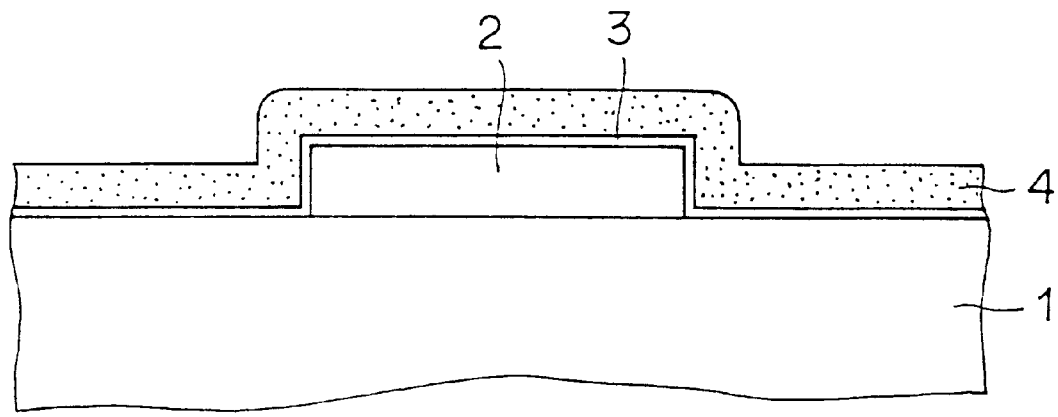
FIGS. 1 and 2 are sectional views of a TFT for describing first and second manufacturing steps, respectively of a first embodiment of the present invention.
Figure 2:
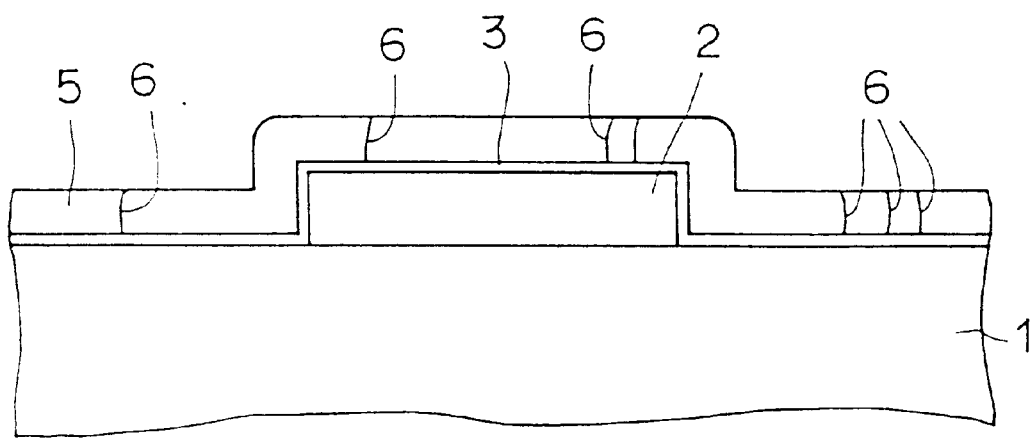

As shown in FIG. 1, a polysilicon layer (not shown) of approximately 1500 Å in thickness is formed by CVD on an insulating film 1, which is patterned to form a gate electrode 2 of polysilicon. A gate insulating film 3 of an oxide film of approximately 300 Å in thickness is formed by CVD to cover gate electrode 2. An amorphous silicon film 4 is formed to cover gate insulating film 3 by CVD. Then, a heat treatment is applied under a temperature condition of approximately 600° C. to solid phase crystallize amorphous silicon film 4. As a result, a polysilicon film 5 is obtained as shown in FIG. 2. There is a grain boundary 6 at the interface region of each crystal grain in polysilicon film 5.

Figure 3:
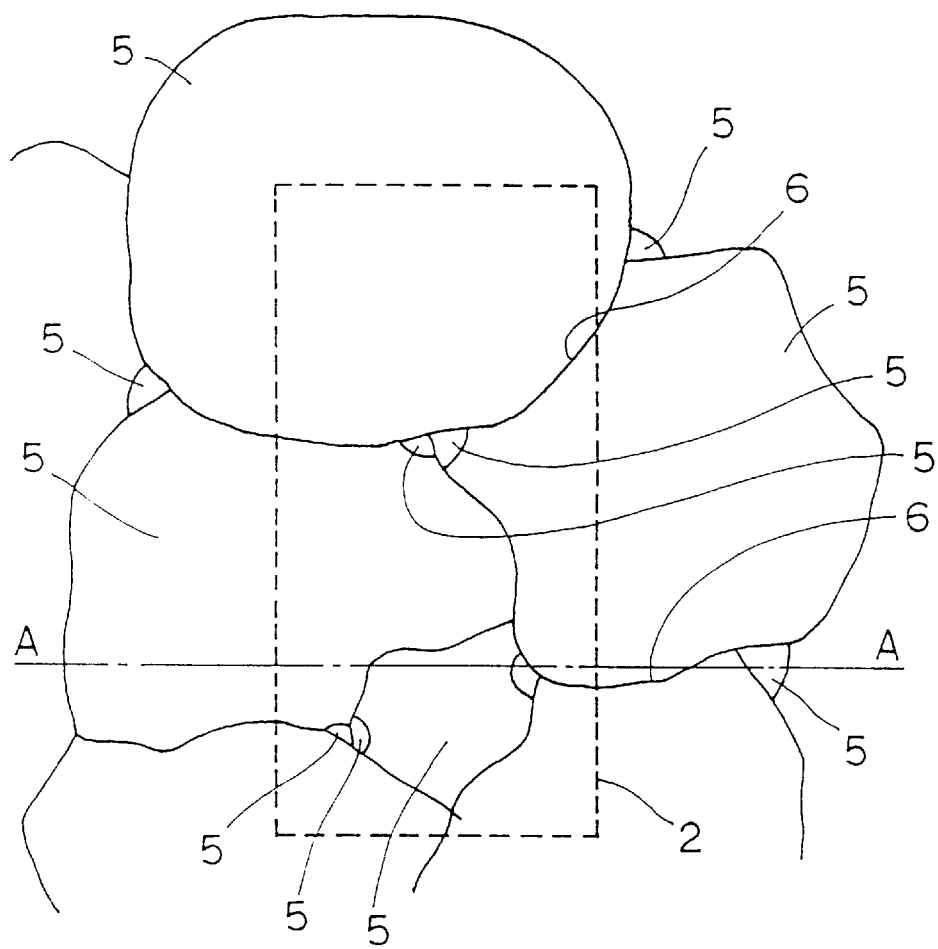
FIG. 3 is a plan view of a TFT corresponding to the second manufacturing step shown in FIG. 2.

FIG. 3 is a plan view corresponding to the sectional view of FIG. 2. The sectional view of FIG. 2 is taken along line A—A of FIG. 3. It is appreciated from FIG. 3 that the grain size is random as in a conventional case.

Figure 4:
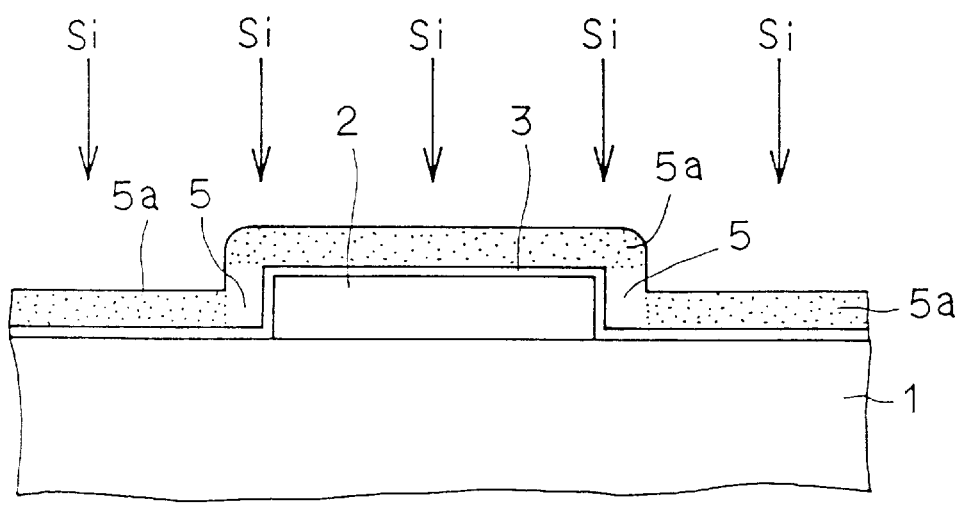
FIG. 4 is a sectional view of a TFT for describing a third manufacturing step according to the first embodiment of the present invention.

Referring to FIG. 4, silicon is ion-implanted all over the surface, whereby polysilicon 5 is rendered amorphous (amorphous silicon 5a) except for the portion at the sidewall of gate electrode 2. The reason why polysilicon 5 located at the sidewall of gate electrode 2 is not rendered amorphous is due to the fact that the film thickness of that portion is too thick to be entirely rendered amorphous.

The depth susceptible of an amorphous state depends upon the ion-implantation energy of silicon. The implantation energy and implantation amount must be appropriately selected so that gate insulating film 3 located under polysilicon 5 is not degraded. For example, gate insulating film 3 will not be degraded if the range of ion implantation is set to the center of polysilicon film 5 with the implantation amount at approximately $2 \times 10^{15}$ cm$^{-2}$ when the film thickness of polysilicon film 5 is at most approximately 2000 Å.

Figure 5:
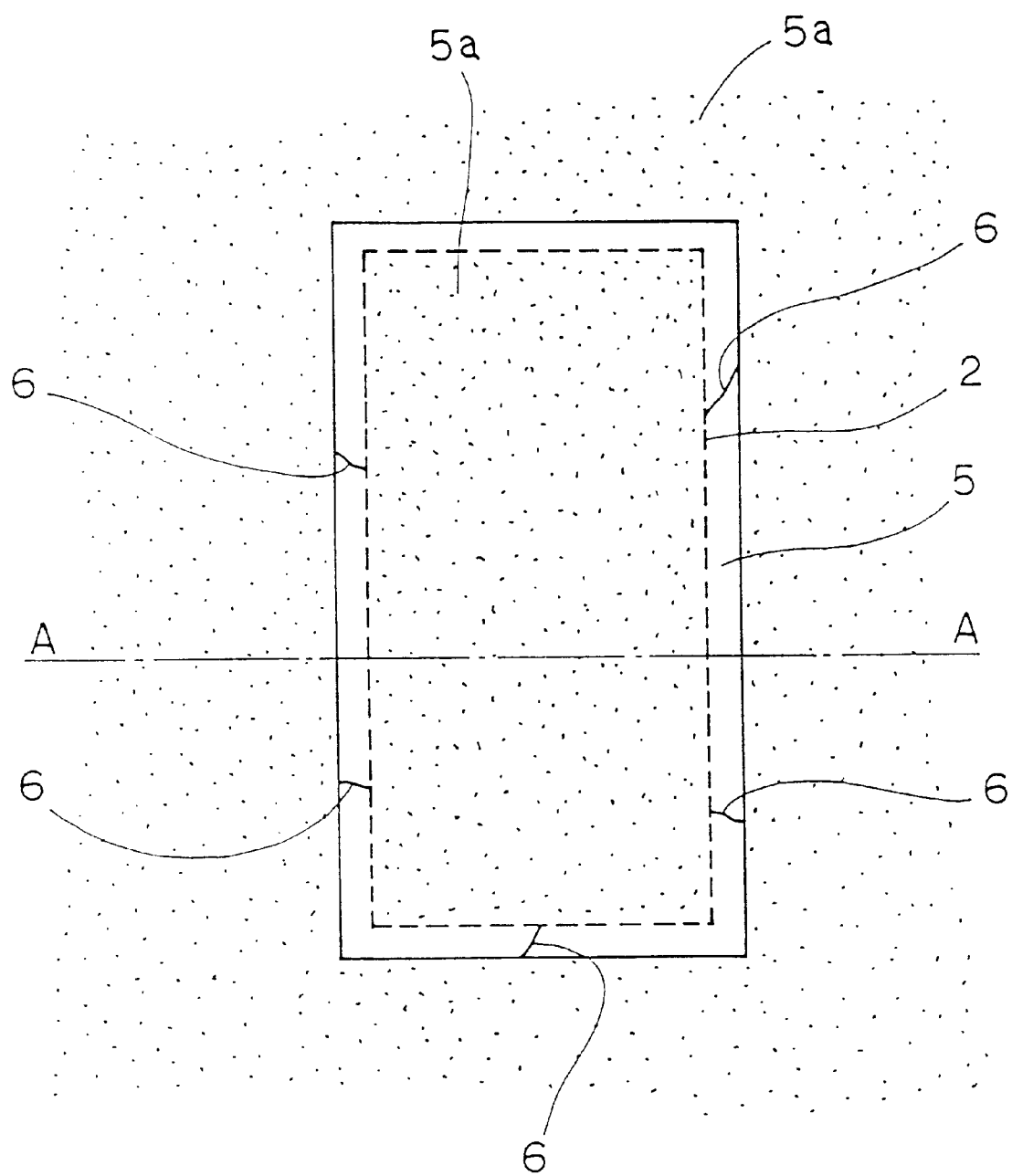
FIG. 5 is a plan view of a TFT corresponding to the third step shown in FIG. 4.

FIG. 5 is a plan view showing a state following the silicon ion-implantation of the manufacturing step of FIG. 4. It is appreciated from FIG. 5 that the portion of polysilicon 5 surrounding the periphery of gate electrode 2 indicated by a dotted line is selectively left without being rendered amorphous. There is a grain boundary 6 between adjacent crystals of polysilicon 5. All the region except for polysilicon 5 attains an amorphous state to become amorphous silicon 5a.

Figure 6:
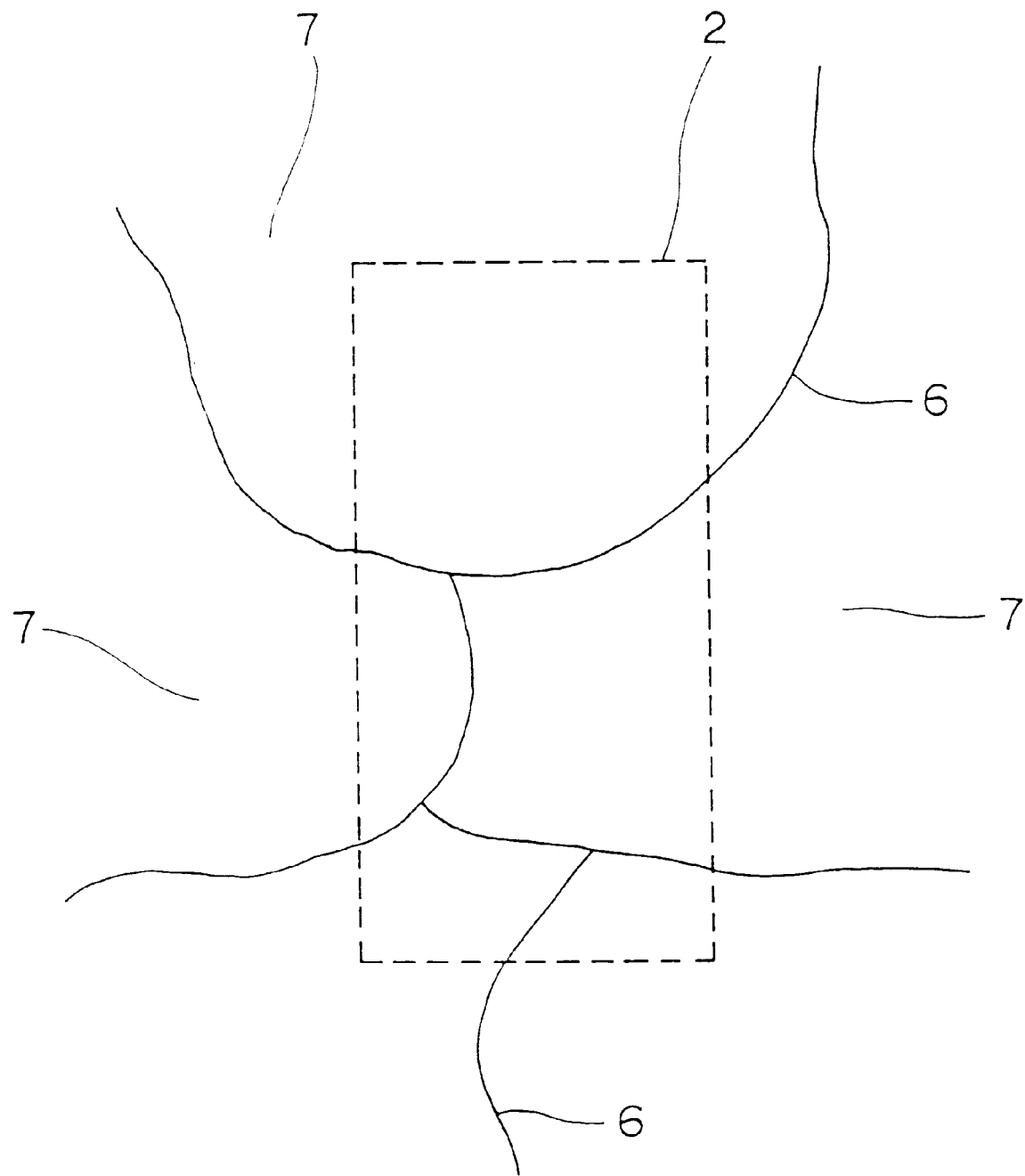
FIG. 6 is a plan view of a TFT for describing a fourth manufacturing step of the first embodiment of the present invention.

Then, a heat treatment at a temperature condition of approximately 600° C. is applied to solid phase recrystallize amorphous silicon 5a. This solid phase recrystallization of amorphous silicon 5a is promptly carried out prior to generation of a new crystal nucleus since polysilicon 5 selectively left without attaining an amorphous state is used as the seed crystal. Thus, polysilicon 7 having a uniform and great grain size is obtained as shown in FIG. 6 without any polysilicon of reduced grain size. Then, polysilicon 7 is patterned after channel doping, and a source/drain region is formed. Such a TFT has the channel portion formed of polysilicon 7 with uniform and great grain size. The electric characteristics of a TFT can be improved since there are no small grains in the channel portion as in a conventional case. Because the crystal grain of polysilicon formed in the channel region of each TFT is increased uniformly, the problem of variation in the electric characteristics between each TFT does not occur.

A method of manufacturing a TFT according to a second embodiment of the present invention will be described hereinafter with reference to FIGS. 7–9.

Figure 7:
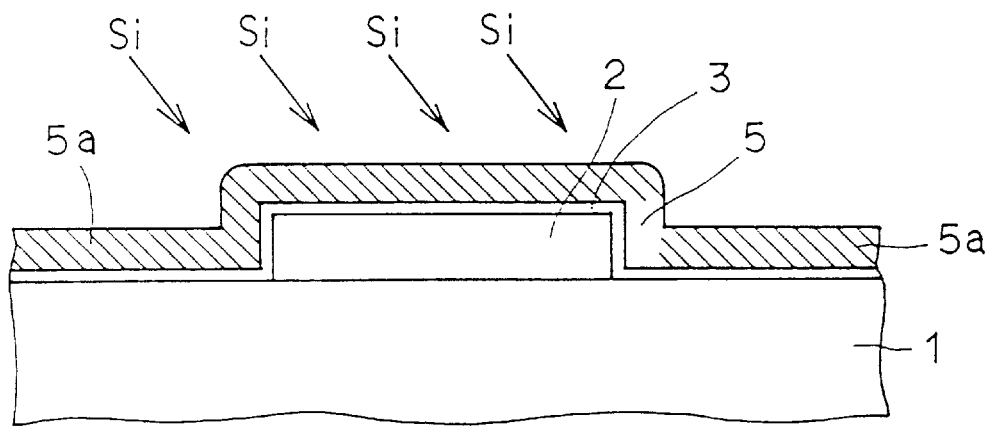
FIG. 7 is a sectional view of a TFT for describing a first manufacturing step according to a second embodiment of the present invention.

As shown in FIG. 7, the second embodiment has amorphous silicon 5a formed with polysilicon 5 remaining partially by carrying out ion implantation of silicon in a oblique manner. This oblique ion implantation renders polysilicon 5 to become amorphous silicon 5a except for the portion of polysilicon 5 at one side of gate electrode 2. FIG. 8 is a plan view corresponding to the process shown in FIG. 7. The sectional view taken along line A—A of FIG. 8 shows the structure of FIG. 7. Referring to FIG. 8, polysilicon 5 is selectively left only at the three sidewall portions of gate electrode 2. A heat treatment at a temperature condition of approximately 600° C. is applied thereto with polysilicon 5 as the seed crystal, whereby amorphous solid phase 5a is recrystallized. Thus, polysilicon 7 of a uniform and great grain size as shown in FIG. 9 is obtained. Because the region of polysilicon 5 serving as the seed crystal is smaller than that of the first embodiment, the number of grain boundaries of the solid phase grown polysilicon 7 is reduced. Therefore, the electric characteristics of a TFT can further be improved in comparison with that of the first embodiment.

A method of manufacturing a TFT according to a third embodiment of the present invention will be described hereinafter with reference to FIGS. 10–12.

Figure 8:
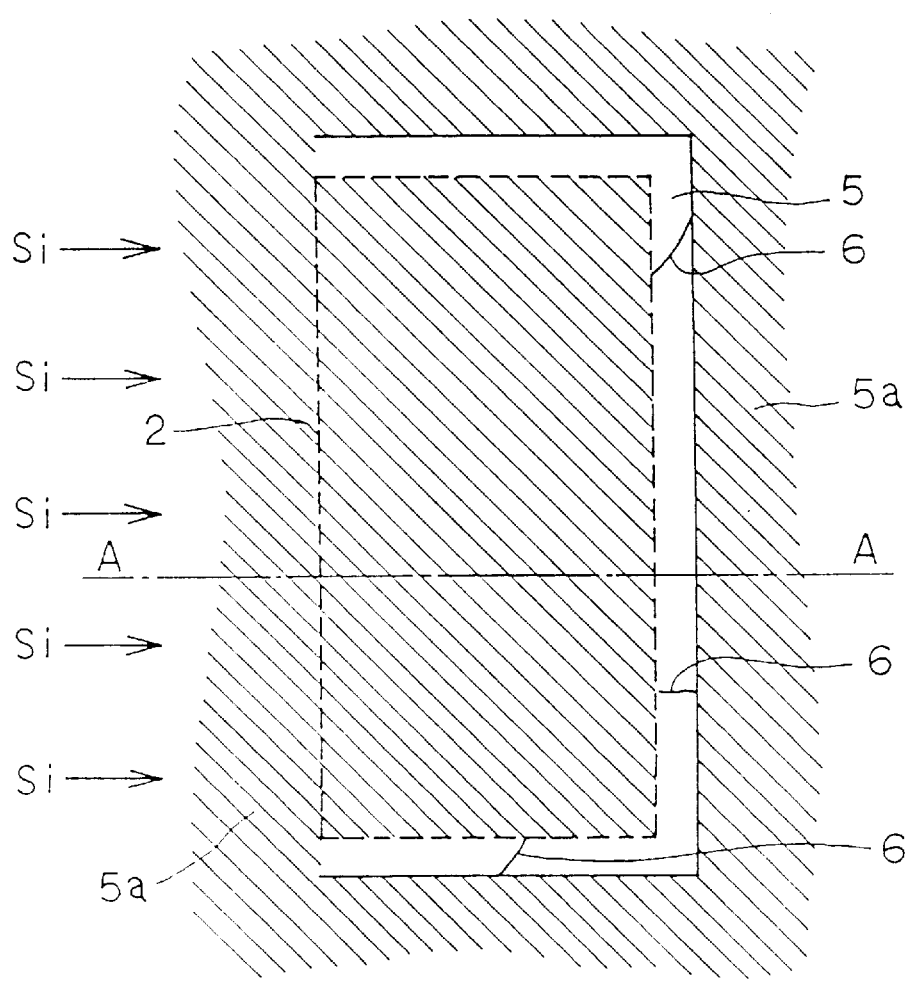
FIG. 8 is a plan view of a TFT corresponding to the first step of FIG. 7.
Figure 9:
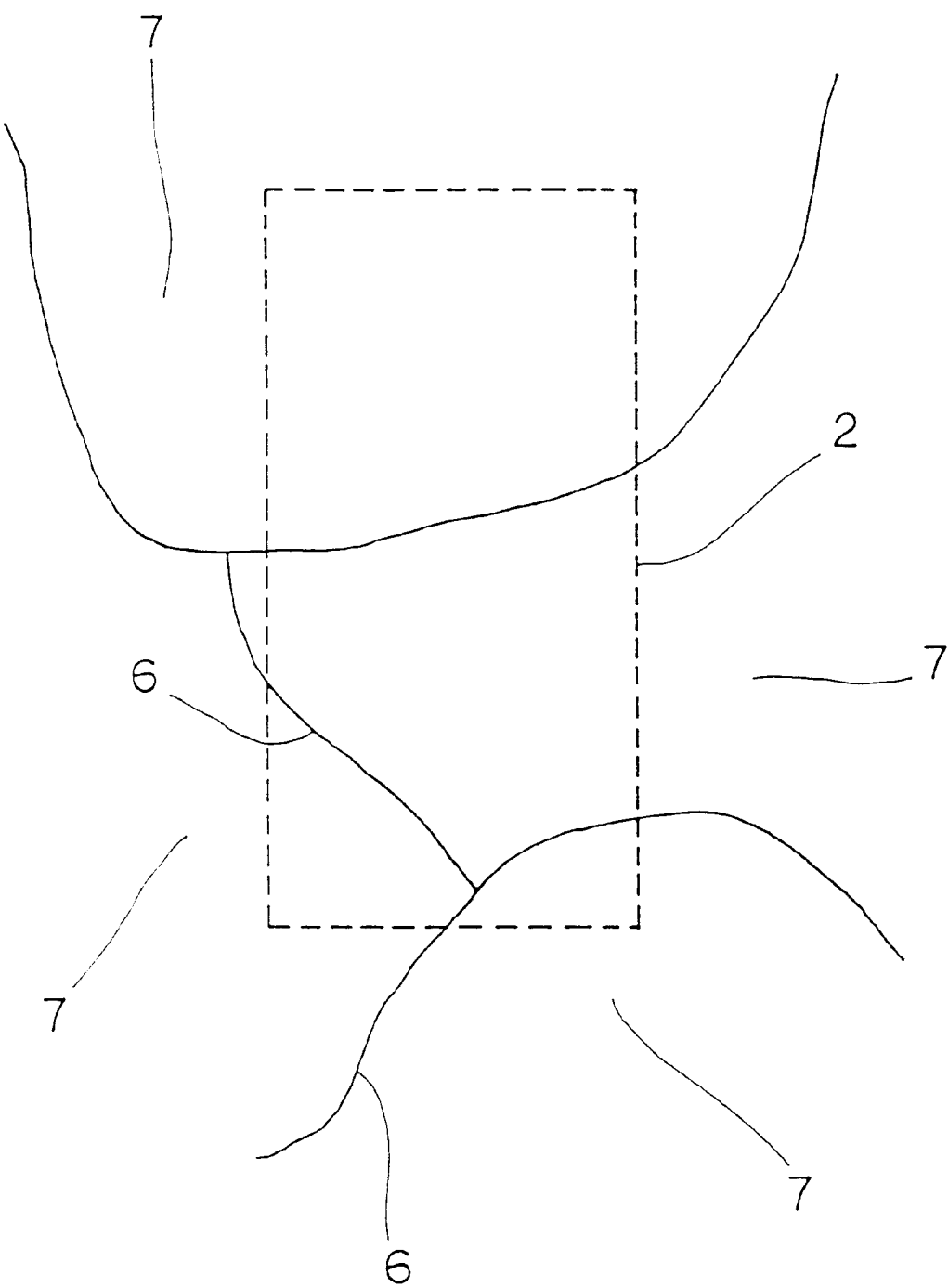
FIG. 9 is a plan view of a TFT for describing a second manufacturing step according to the second embodiment of the present invention.
Figure 10:
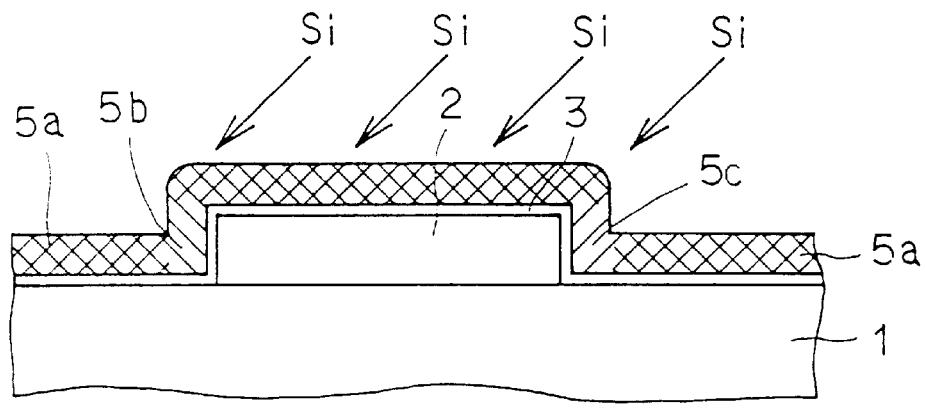
FIG. 10 is a sectional view of a TFT for describing a first manufacturing step according to a third embodiment of the present invention.
Figure 11:
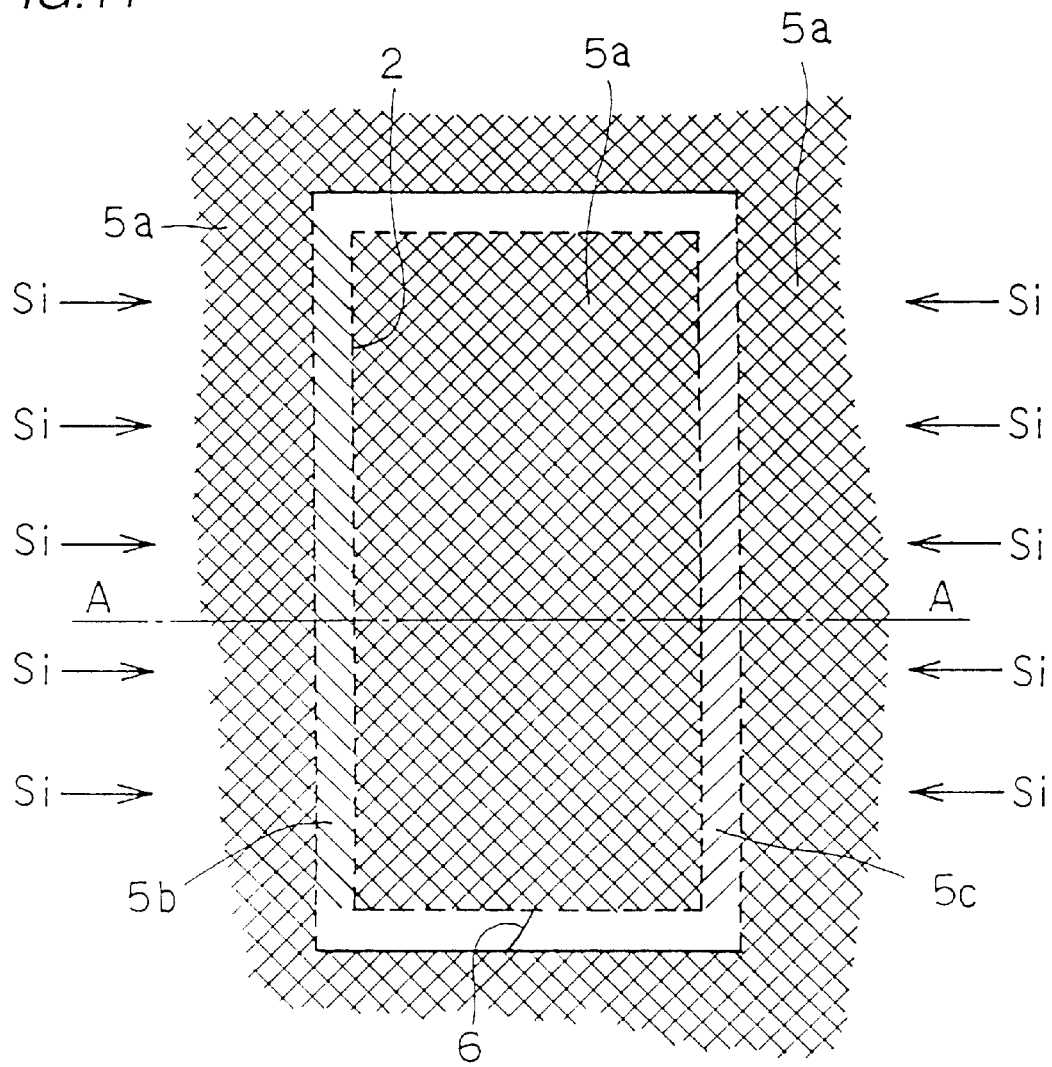
FIG. 11 is a plan view of a TFT corresponding to the first manufacturing step of FIG. 10.

Following the process of the second embodiment shown in FIGS. 7 and 8, ion implantation of silicon is carried out in an oblique direction opposite to that of the process of FIG. 7, as shown in FIG. 10. The area of polysilicon 5 left at the sidewall portion of gate electrode 2 can further be reduced by these two oblique silicon ion implantation steps. FIG. 11 is a plan view corresponding to the manufacturing process shown in FIG. 10. Referring to FIG. 11, silicon ion implantation carried out in an oblique manner from both right and left directions causes polysilicon 5 to remain only at two sides of gate electrode 2. At the other two sides of gate electrode 2, amorphous silicon 5b and 5c are formed.

In the actual silicon implantation step, the wafer (not shown) is rotated by 180° after the first silicon implantation step from a left oblique direction to be set appropriately on a stage in an ion implantation apparatus. Then, silicon implantation is carried out again. This is identical to a second silicon implantation step from an oblique direction from the right side.

Figure 12:
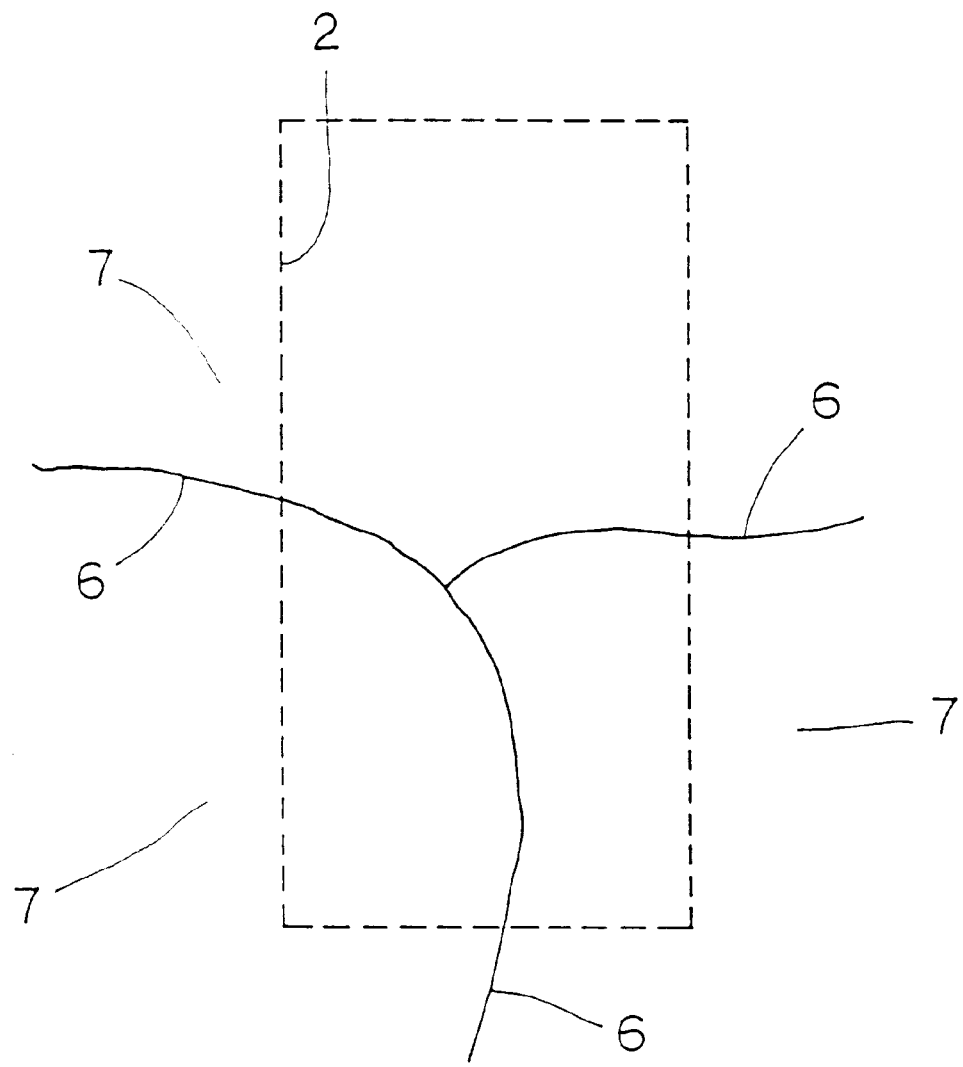
FIG. 12 is a plan view of a TFT for describing a second manufacturing step according to the third embodiment of the present invention.

Following the formation of amorphous silicon 5a, 5b and 5c, a heat treatment at a temperature condition of approximately 600° C. is carried out to obtain polysilicon 7 which is further increased in grain size in comparison with that of the second embodiment shown in FIG. 12. In other words, polysilicon 7 greater in grain size can be obtained as the area of polysilicon 5 serving as a seed crystal is reduced.

Figure 13:
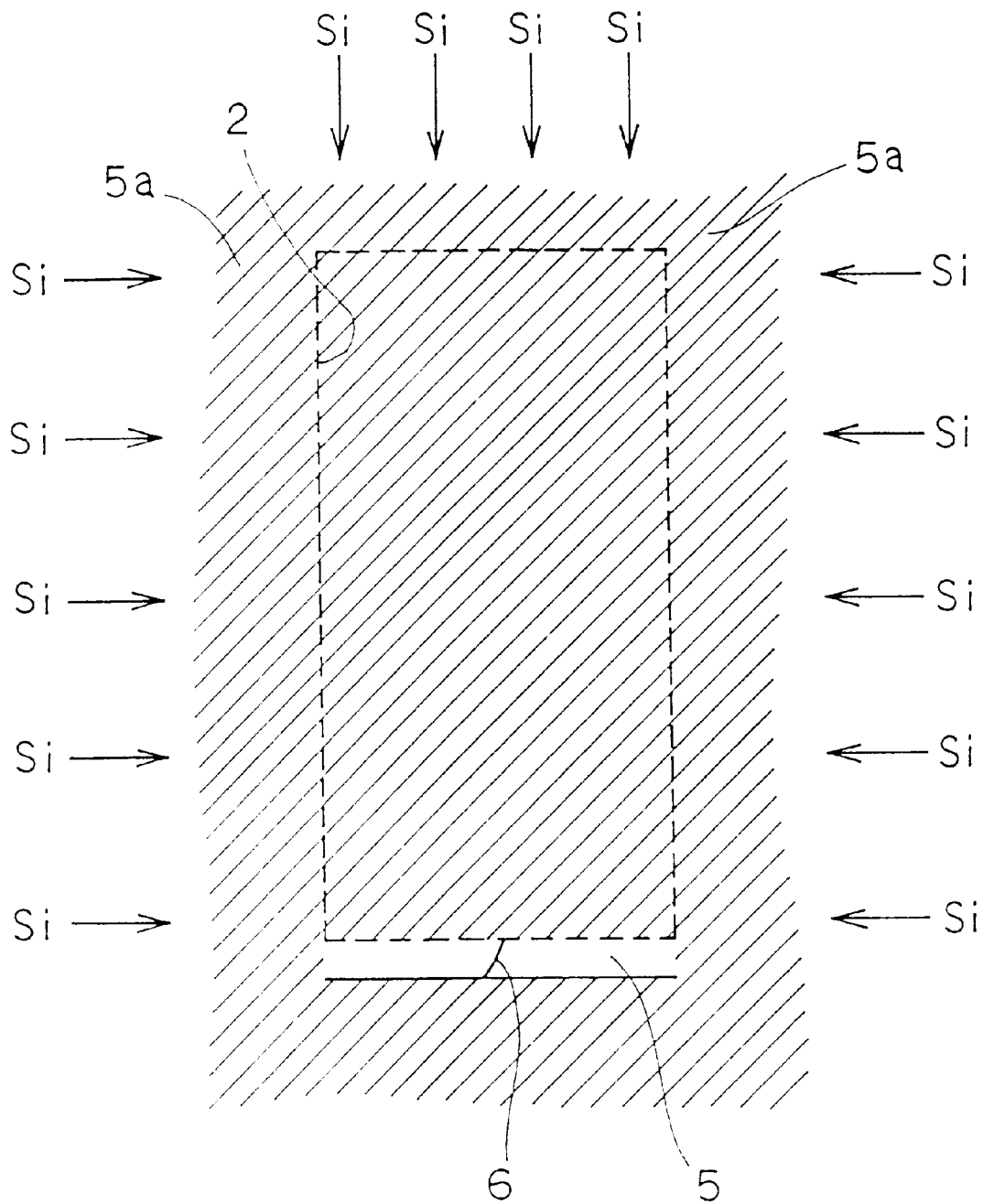
FIGS. 13 and 14 are plan views of a TFT for describing first and second manufacturing steps according to a fourth embodiment, respectively, of the present invention.
Figure 14:
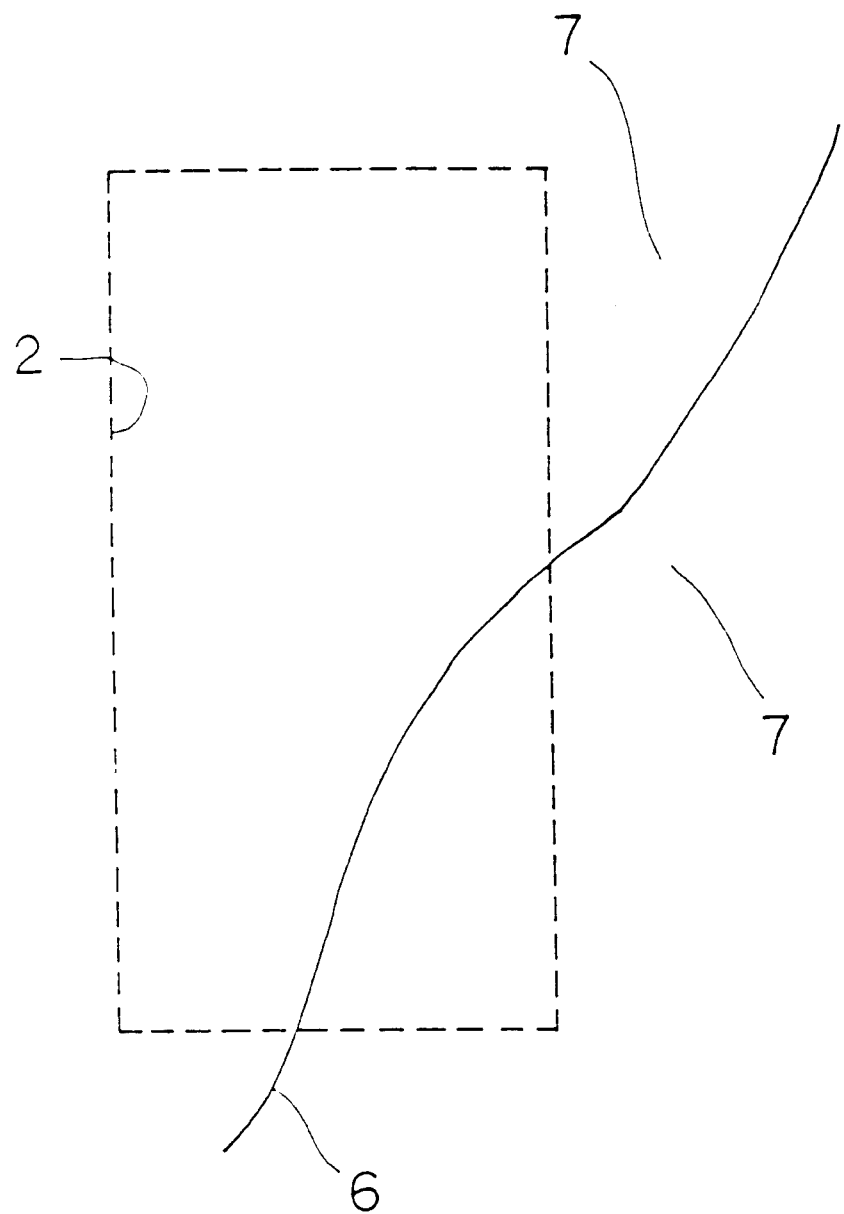

A manufacturing method of a TFT according to a fourth embodiment of the present invention will be described with reference to FIGS. 13 and 14. The manufacturing method of the fourth embodiment is an advancement of that of the third embodiment. More specifically, a third silicon implantation step is carried out in a direction from the top area of the paper plane of FIG. 13 in addition to the two silicon implantations steps from the left and right sides of the third embodiment shown in FIG. 11. Thus, the region of the remaining polysilicon 5 can further be reduced. This third silicon implantation step can easily be carried out by just altering the positioning angle of the wafer on a stage in the ion implantation apparatus.

By repeating a silicon implantation step while changing the wafer positioning angle on the stage in the ion implantation apparatus, the area of polysilicon 5 acting as the seed crystal can be limited. By applying a heat treatment of approximately 600° C. to recrystallize amorphous silicon 5a with polysilicon 5 as the seed crystal, polysilicon 7 can be formed having a channel region with a great grain size and the number of grain boundaries extremely reduced as shown in FIG. 14.

The present invention is not limited to the present embodiment in which the area of polysilicon 5 serving as a seed crystal is located at the short side of gate electrode 2. Polysilicon 5 serving as a seed crystal can be located also at the long side of gate electrode 2 by changing arbitrarily the wafer positioning angle in carrying out silicon implantation.

Figure 16:
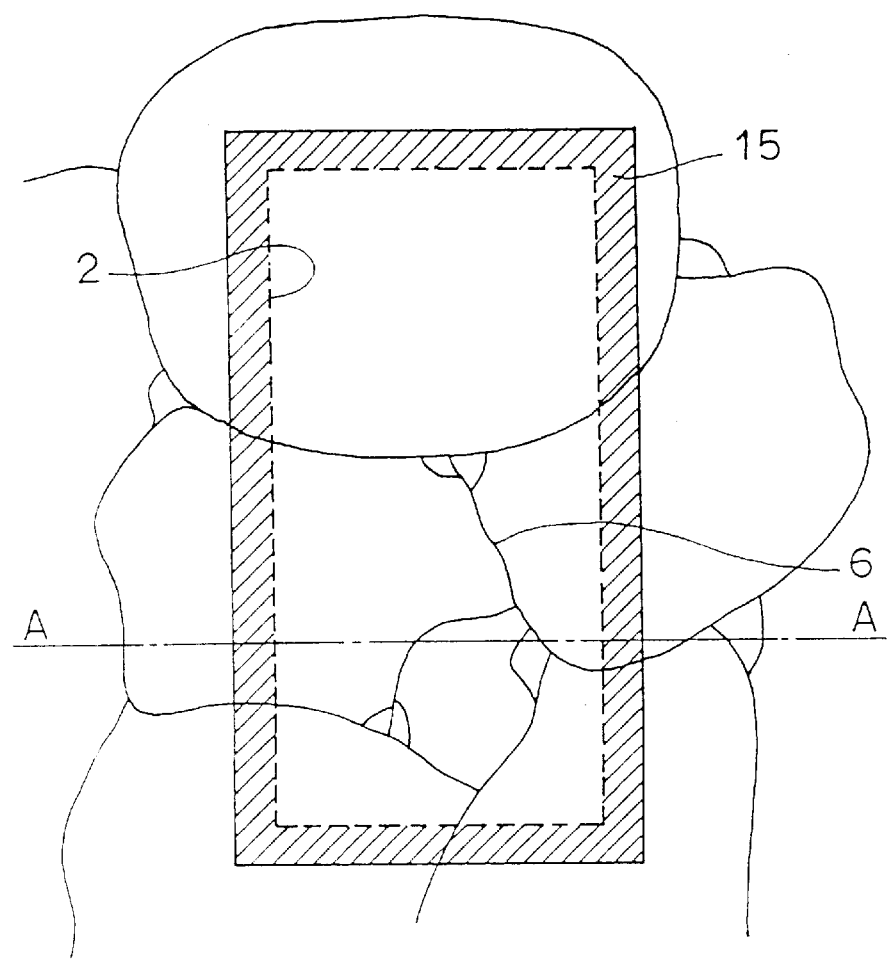
FIG. 16 is a plan view of a TFT corresponding to the first manufacturing step of FIG. 15.
Figure 17:
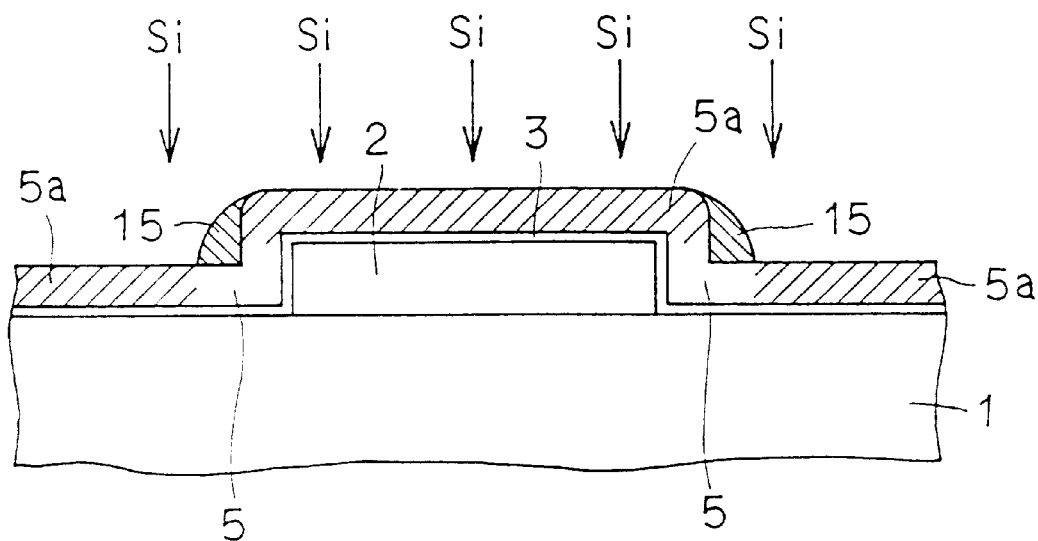
FIG. 17 is a sectional view of a TFT for describing a second manufacturing step according to the fifth embodiment of the present invention.
Figure 18:
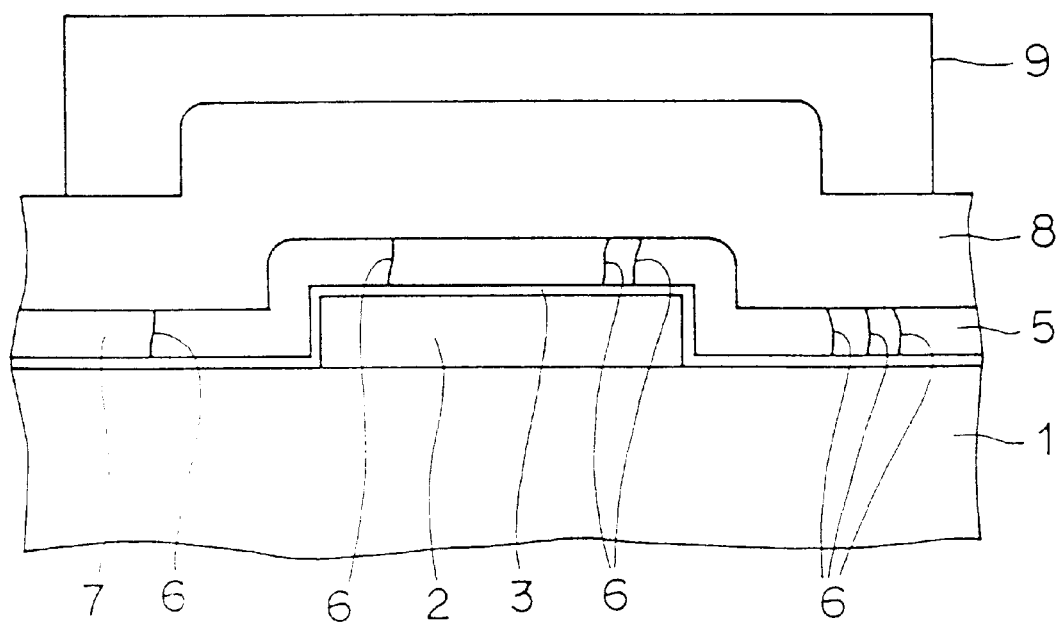
FIG. 18 is a sectional view of a TFT for describing a first manufacturing step according to a sixth embodiment of the present invention.

A method of manufacturing a TFT according to a fifth embodiment of the present invention will be described hereinafter with reference to FIGS. 15–17.

Figure 15:
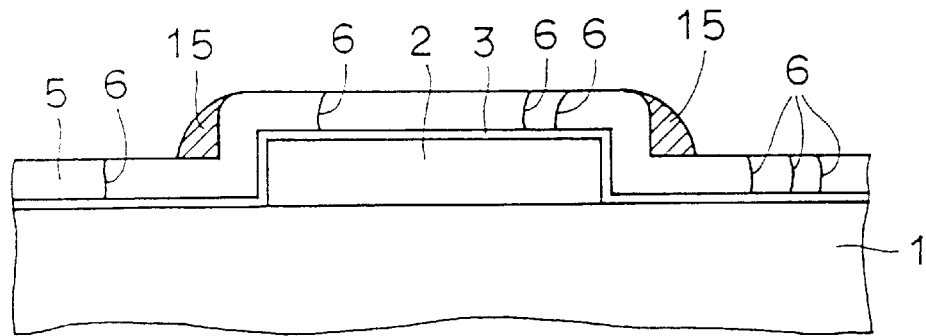
FIG. 15 is a sectional view of a TFT for describing a first manufacturing step according to a fifth embodiment of the present invention.

Following the manufacturing process of the first embodiment described with reference to FIGS. 1–3, a sidewall oxide film 15 is formed on the sidewall of polysilicon 5 corresponding to gate electrode 2 as shown in FIG. 15. Sidewall oxide film 15 can easily be formed by etching anisotropically an oxide film formed all over the surface. FIG. 16 is a plan view corresponding to FIG. 15. The sectional view taken along line A—A of FIG. 16 shows the structure of FIG. 15. By carrying out silicon ion implantation thereto, polysilicon 5 serving as a seed crystal can reliably be left at the sidewall of gate electrode 2 where sidewall oxide film 15 functions as a mask. Then, a heat treatment of approximately 600° C. is applied to recrystallize amorphous silicon 5a with polysilicon 5 as a seed crystal. Thus, polysilicon crystal of uniform grain size can be formed. The fifth embodiment is advantageous over the first embodiment by increasing stability of the manufacturing process by ensuring the remainder of polysilicon 5 serving as a seed crystal. It is to be noted that the fifth embodiment may be combined with the manufacturing process of the second or third embodiment.

A manufacturing method of a TFT according to a sixth embodiment of the present invention will be described hereinafter with reference to FIGS. 18–22.

Following the manufacturing step of the first embodiment shown in FIG. 2, an oxide film 8 is formed on polysilicon film 5. The film thickness of oxide film 8 is selected so that silicon ions are not penetrated through at an implantation energy required to render a bare polysilicon film 5 amorphous with a silicon implantation process. More specifically, this condition can be substantially satisfied if oxide film 8 is greater than the film thickness of polysilicon 5 when oxide film 8 is formed of a general oxide film. Oxide film 8 may be formed by CVD or by thermal oxidation of polysilicon film 5.

Figure 19:
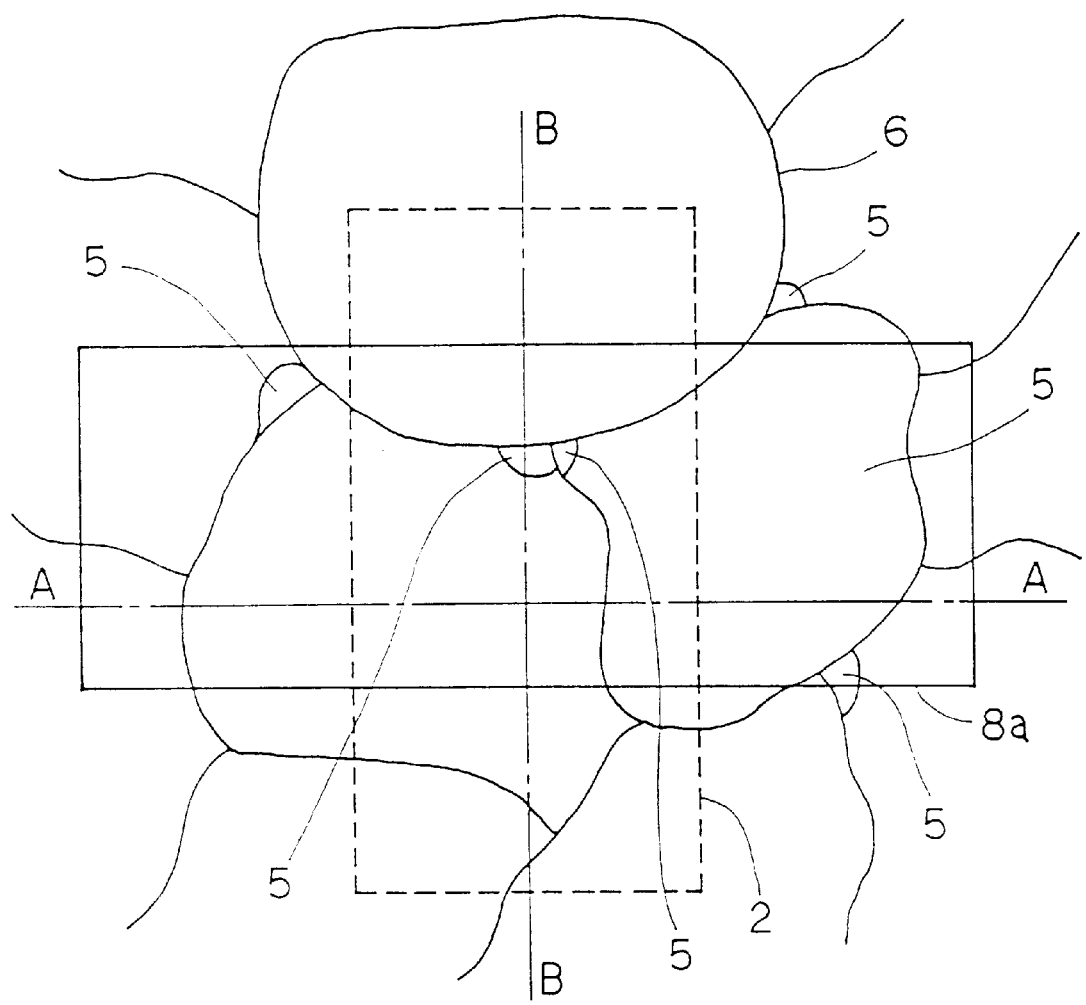
FIG. 19 is a plan view of a TFT corresponding to the first manufacturing step of FIG. 18.
Figure 20:
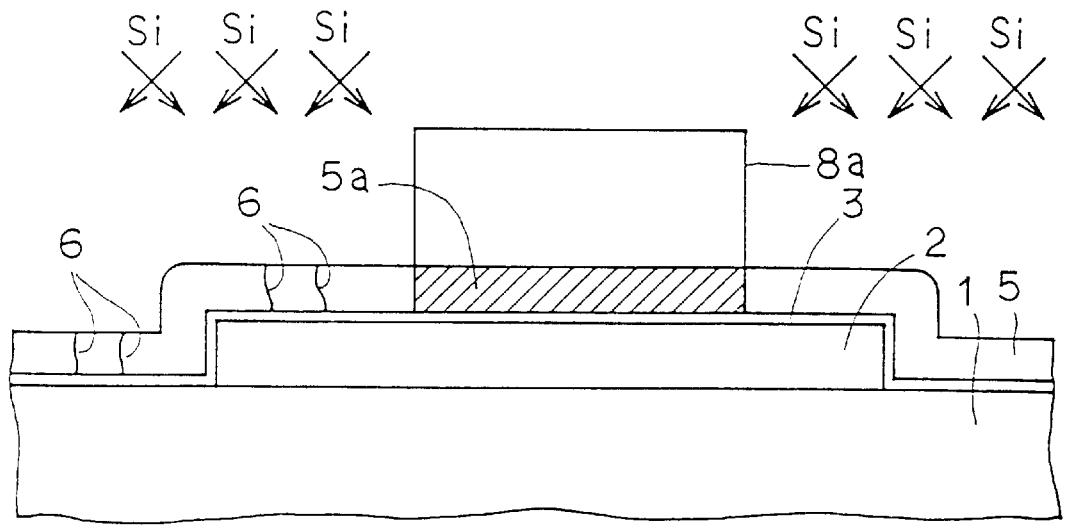
FIG. 20 is a sectional view of a TFT for describing a second manufacturing step according to the sixth embodiment of the present invention.

A resist pattern 9 is formed at a predetermined region on oxide film 8. Using resist pattern 9 as a mask, oxide film 8 is etched to form an oxide film 8a of a field configuration of a TFT as shown in FIGS. 19 and 20. It is appreciated from the plan view of FIG. 19 that an oxide film 8a of a field configuration is formed with respect to gate electrode 2 is formed. Here, polysilicon 5 of small grain size is included in the channel portion of this TFT.

FIG. 20 is a sectional view taken along line B—B of the plan view of FIG. 19. Following the step shown in FIG. 19, silicon ion implantation is carried out at a high implantation energy so that ions pass through oxide film 8a to render polysilicon 5 right under oxide film 8a amorphous. The portion of polysilicon 5 not covered with oxide film 8a is not rendered amorphous since the crystals are hardly damaged due to a sufficiently high implantation energy. Only the portion of polysilicon 5 right under oxide film 8a attains an amorphous state to become amorphous silicon 5a. Here, the sidewall portion of gate electrode 2 at right angles to the paper plane of FIG. 20 is covered with oxide film 8a. Therefore, silicon implantation is carried out at an oblique direction while continuously rotating the wafer to render that portion of polysilicon amorphous. An amorphous state can be achieved by a method of repeating ion implantation several times with the inplane angle altered in mounting wafer on a stage in the ion implantation apparatus as described in the third embodiment.

Figure 21:
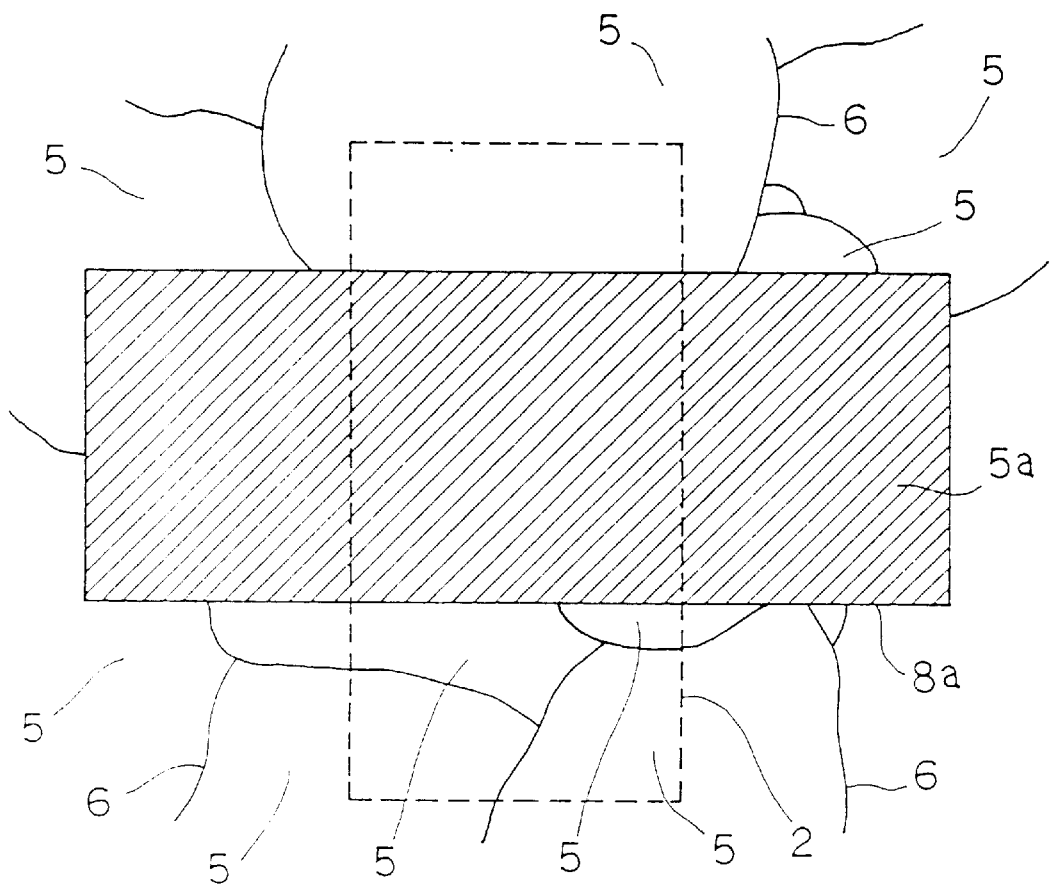
FIG. 21 is a plan view of the TFT corresponding to the second manufacturing step of FIG. 20.
Figure 22:
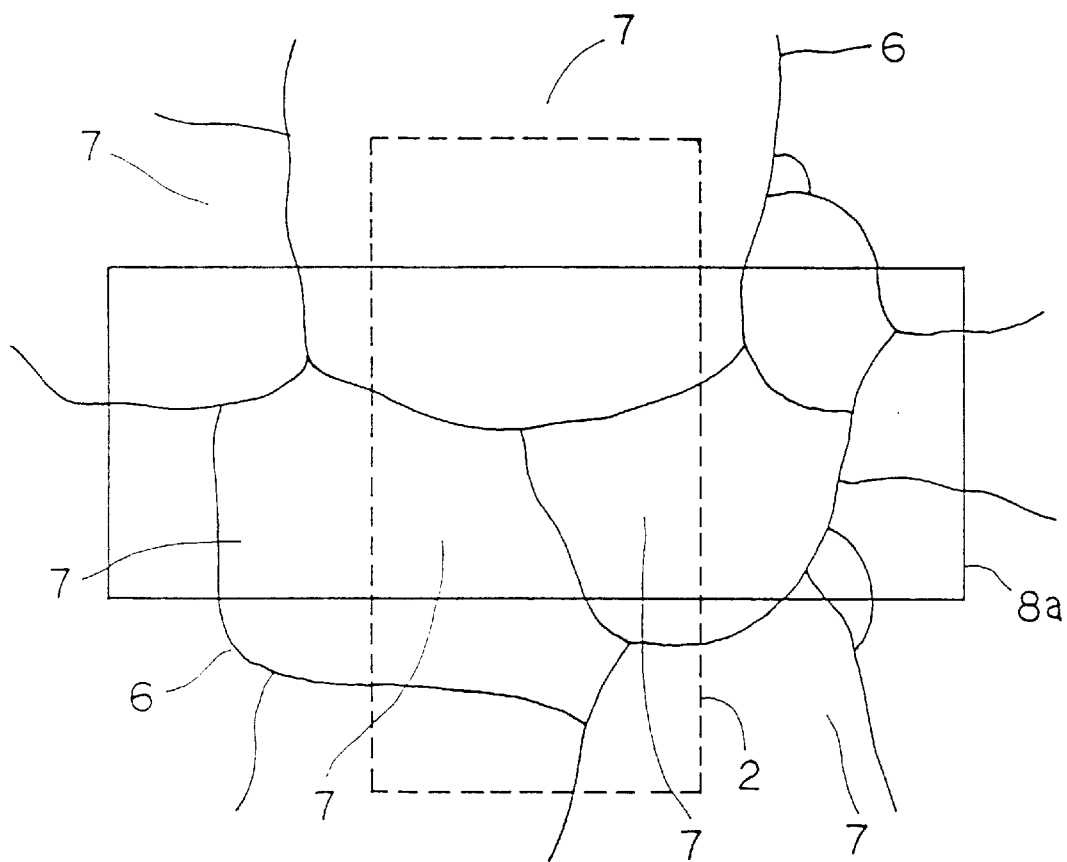
FIG. 22 is a plan view of the TFT for describing a third manufacturing step according to the sixth embodiment of the present invention.

FIG. 21 is a plan view corresponding to the step shown in FIG. 20. Referring to FIG. 21, polysilicon 5 which is to function as a seed crystal remains at the periphery of the field region of the TFT. A heat treatment of approximately 600° C. is applied thereto to solid phase recrystallize amorphous silicon 5a. Thus, polysilicon 7 of a uniform and large grain size can be obtained as shown in FIG. 22.

The heat treatment is carried out with oxide film 8a left. By etching polysilicon 7 using oxide film 8a as a mask after recrystallization, the field of the TFT is patterned. Because polysilicon 7 can be etched using oxide film 8a as a mask, the portion improved in crystal characteristics (the portion right under oxide film 8a) can be used in self alignment as the field of a TFT. Thus, the electric characteristics of a TFT can be improved.

A method of manufacturing a TFT according to a seventh embodiment of the present invention will be described hereinafter with reference to FIGS. 23–26.

Figure 23:
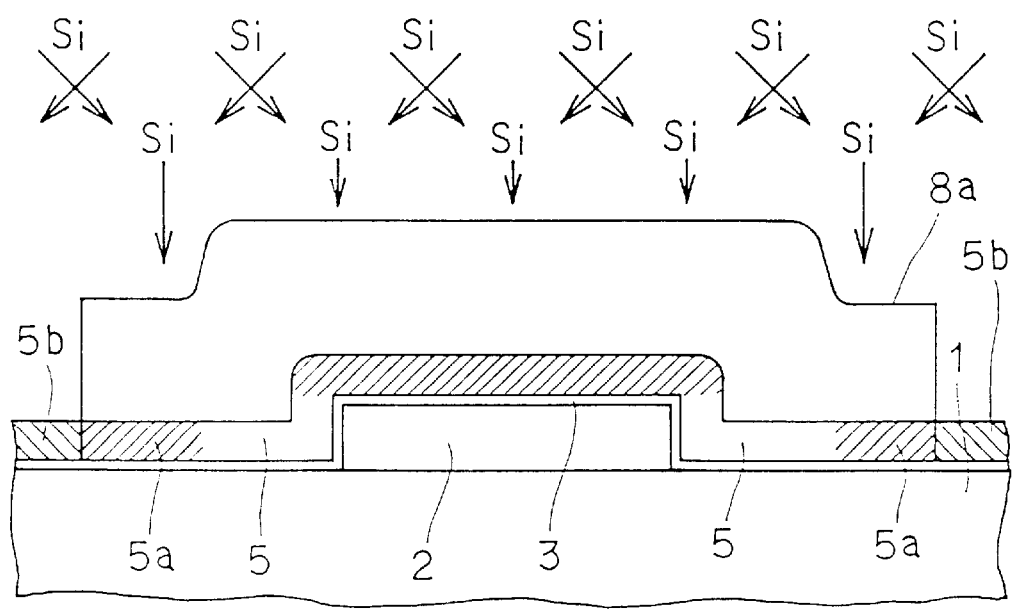
FIG. 23 is a sectional view of a TFT for describing a first manufacturing step according to a seventh embodiment of the present invention.

The seventh embodiment is subsequent to the manufacturing process of the sixth embodiment shown in FIG. 19. FIG. 23 is a sectional view taken along line A—A of the plan view of FIG. 19. Referring to FIG. 23, silicon ion implantation is carried out through oxide film 8a in a perpendicular direction at an energy by which polysilicon 5 is rendered amorphous. Thus, all the portion is rendered amorphous to become amorphous silicon 5a except for the portion of polysilicon 5 not covered by oxide film 8a and the portion of polysilicon which is covered with oxide film 8 and located at the sidewall of gate electrode 2.

Figure 24:
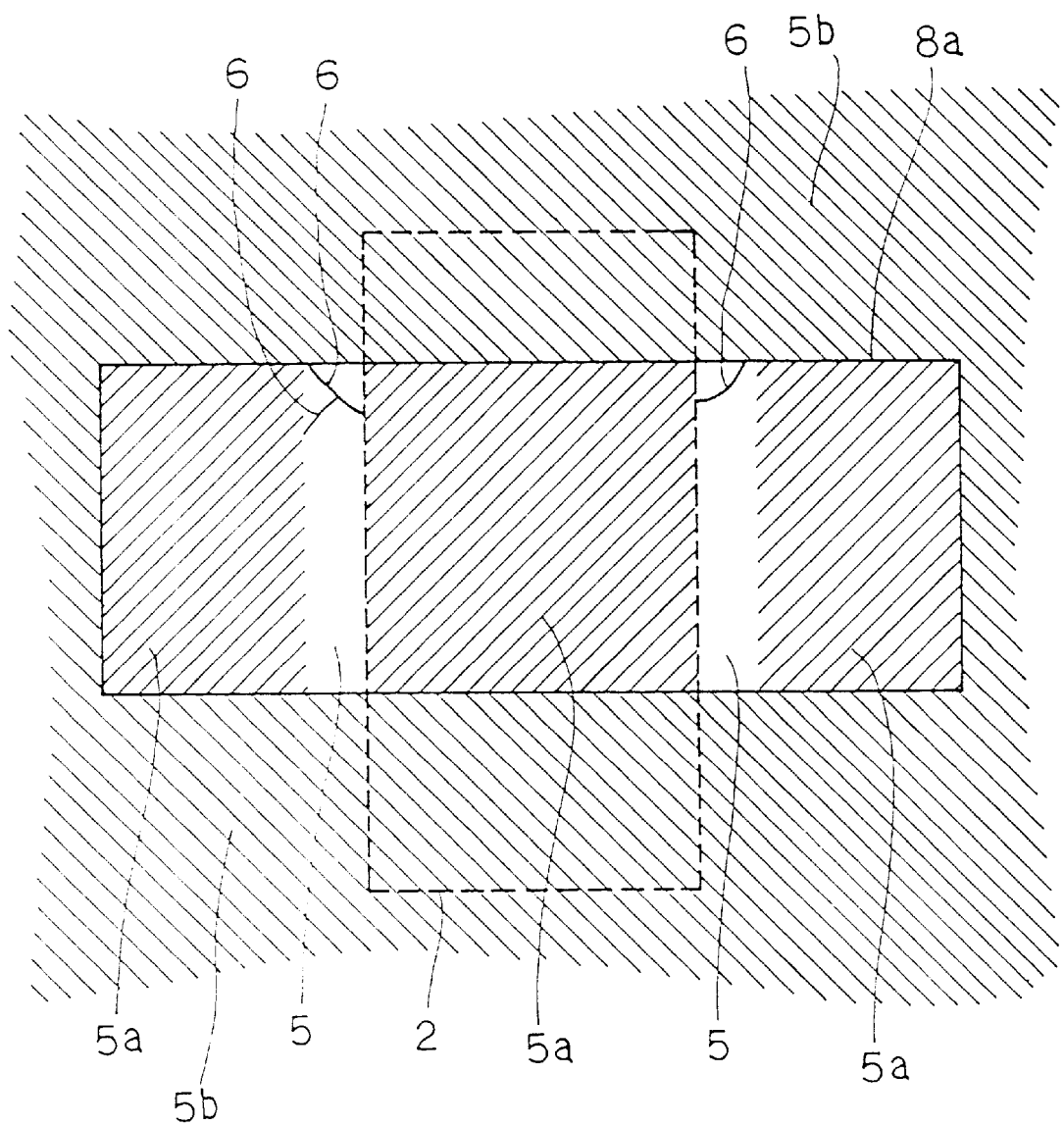
FIG. 24 is a plan view of a TFT corresponding to the first manufacturing step of FIG. 23.
Figure 25:
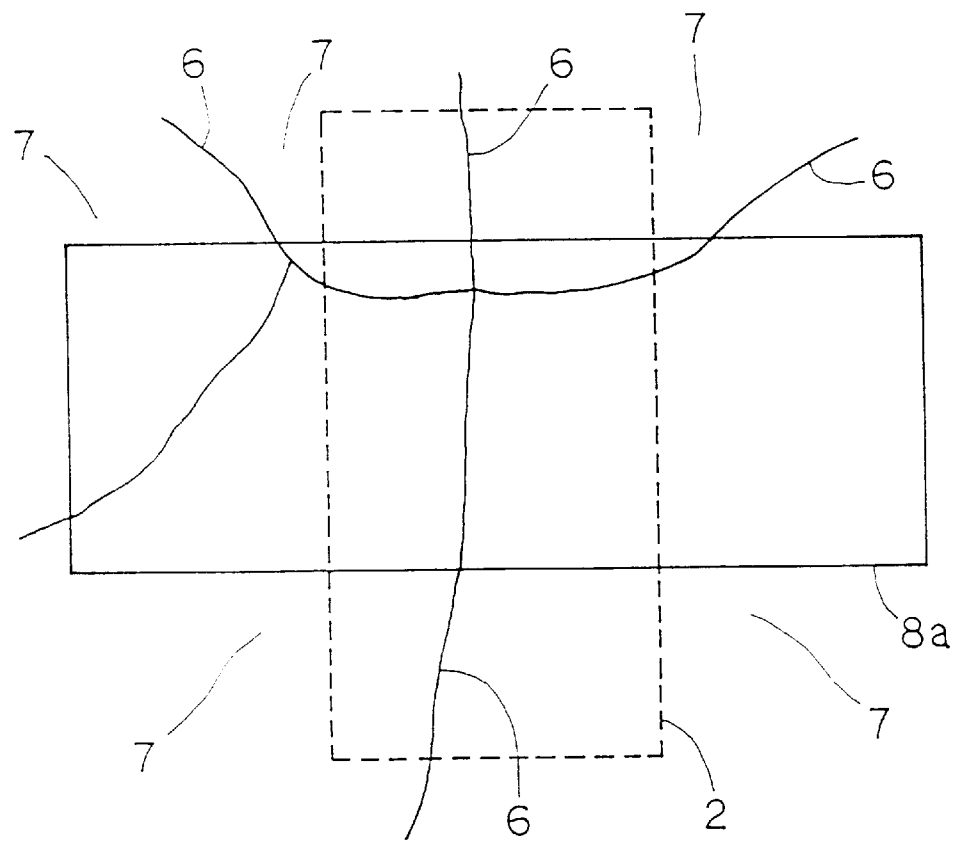
FIG. 25 is a plan view of a TFT for describing a second manufacturing step according to the seventh embodiment of the present invention.

Then, in order to render amorphous the portion of polysilicon 5 not covered with oxide film 8a, silicon ion implantation is carried out from an oblique direction while rotating the wafer continuously with a lower implantation energy. Thus, amorphous silicon 5b as shown in FIGS. 23 and 24 is obtained. FIG. 24 is a top view showing the state after implantation. In the present embodiment, the area of polysilicon 5 serving as a seed crystal is limited to a small range. Therefore, polysilicon 7 of a great grain size as shown in FIG. 25 is obtained by carrying out a heat treatment at a temperature condition of approximately 600° C.

Figure 26:
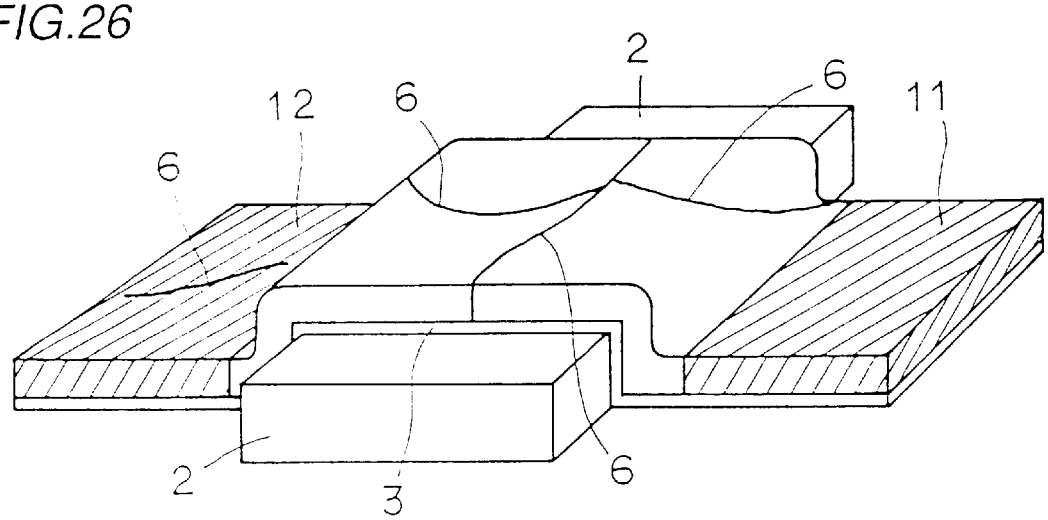
FIG. 26 is a perspective view of a TFT for describing a third manufacturing step according to the seventh embodiment of the present invention.

Oxide film 8a is still left in forming polysilicon 7 of a great grain size. Then, using oxide film 8a as a mask, polysilicon 7 is etched to pattern a field of the TFT. As a result, the portion of polysilicon 7 improved in crystal characteristics, i.e. the portion located under oxide film 8a, can be used in self alignment as a field of a TFT. Therefore, the electric characteristics of a TFT can further be improved. FIG. 26 is a perspective view of a TFT formed by above-described manufacturing process. Source/drain regions 11 and 12 of a TFT are formed by ion implantation or the like.

Although the seventh embodiment has polysilicon 5 serving as a seed crystal left at the sidewall of gate electrode 2 covered with oxide film 8a, it is possible to leave polysilicon 5 only at one sidewall portion of gate electrode 2 by carrying out silicon implantation at an oblique direction similar to the second embodiment shown in FIG. 7. In this case, polysilicon of a great grain size and with fewer grain boundaries can be formed in the channel region of a TFT since the position and area of polysilicon 5 serving as a seed crystal are further linmited. As a result, the electric characteristics of a TFT can further be improved.

Although the method of rendering amorphous the polysilicon in the seventh embodiment is carried out by a first silicon ion implantation step in a perpendicular direction to render amorphous the polysilicon portion under oxide film 8a and a second silicon ion implantation step at an oblique direction while rotating the wafer continuously to render amorphous the polysilicon portion not covered with oxide film 8a, a method as set forth in the following can alternatively be used. A first silicon ion implantation step is carried out at an oblique direction while rotating continuously the wafer to render amorphous the entire polysilicon under oxide film 8a. Then, a second ion implantation step is carried out at an oblique direction without rotating the wafer to selectively leave the polysilicon serving as a seed crystal in the proximity of the sidewall portion of oxide film 8a taking advantage of the shadowing effect of oxide film 8a.

A method of manufacturing a TFT according to an eighth embodiment of the present invention will be described hereinafter with reference to FIGS. 27–30.

Figure 27:
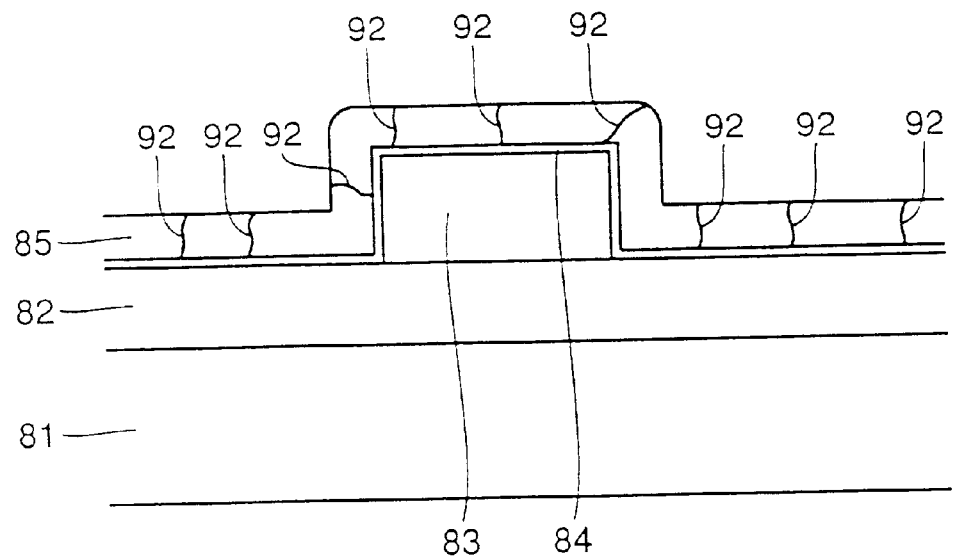
FIG. 27 is a sectional view of a TFT for describing a first manufacturing step according to an eighth embodiment of the present invention.

Referring to FIG. 27, an insulating film 82 is formed on a semiconductor substrate 81. An undoped polysilicon film (not shown) is formed on insulating film 82 to a thickness of approximately 1500 Å by CVD. Arsenic (As) is then ion implanted into the undoped polysilicon film. The polysilicon film having arsenic ions implanted is patterned by photolithography and anisotropic etching, whereby a gate electrode 83 is formed.

Figure 28:
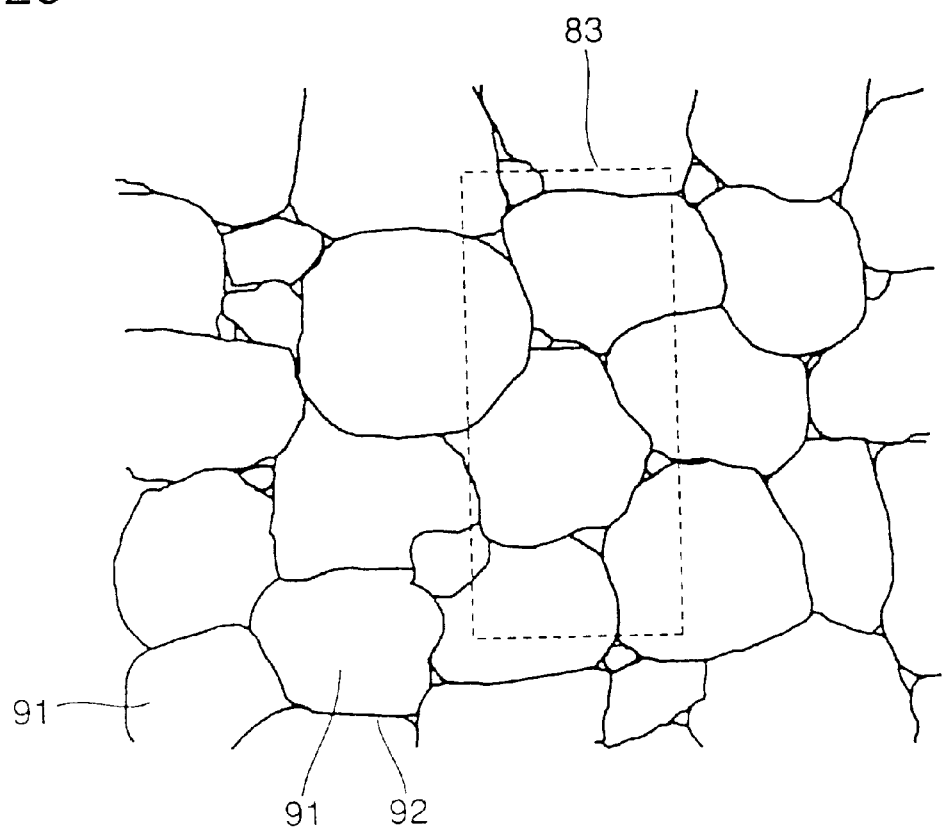
FIG. 28 is a plan view of a TFT for describing the first manufacturing step according to the eighth embodiment of the present invention.

Then, a gate oxide film 84 having a thickness of approximately 300 Å is formed by thermal oxidation. An undoped polysilicon film 85 is formed to a thickness of approximately 2000 Å by CVD. The undoped polysilicon film 85 may be formed by solid phase crystallizing an amorphous silicon film after forming the amorphous silicon film by CVD. Crystallization of undoped polysilicon film 85 is shown in FIG. 28. It is appreciated from FIG. 28 that a grain 91 of undoped polysilicon film 85 is small in this state. Furthermore, a grain boundary 92 is present between each crystal grain 91.

Figure 29:
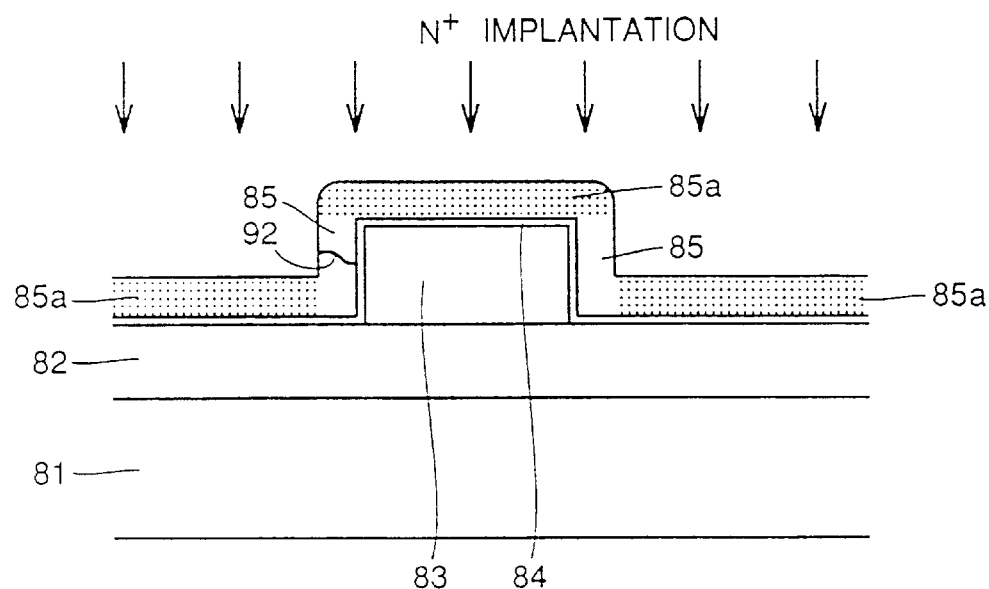
FIG. 29 is a sectional view of a TFT for describing a second manufacturing step according to the eighth embodiment of the present invention.
Figure 30:
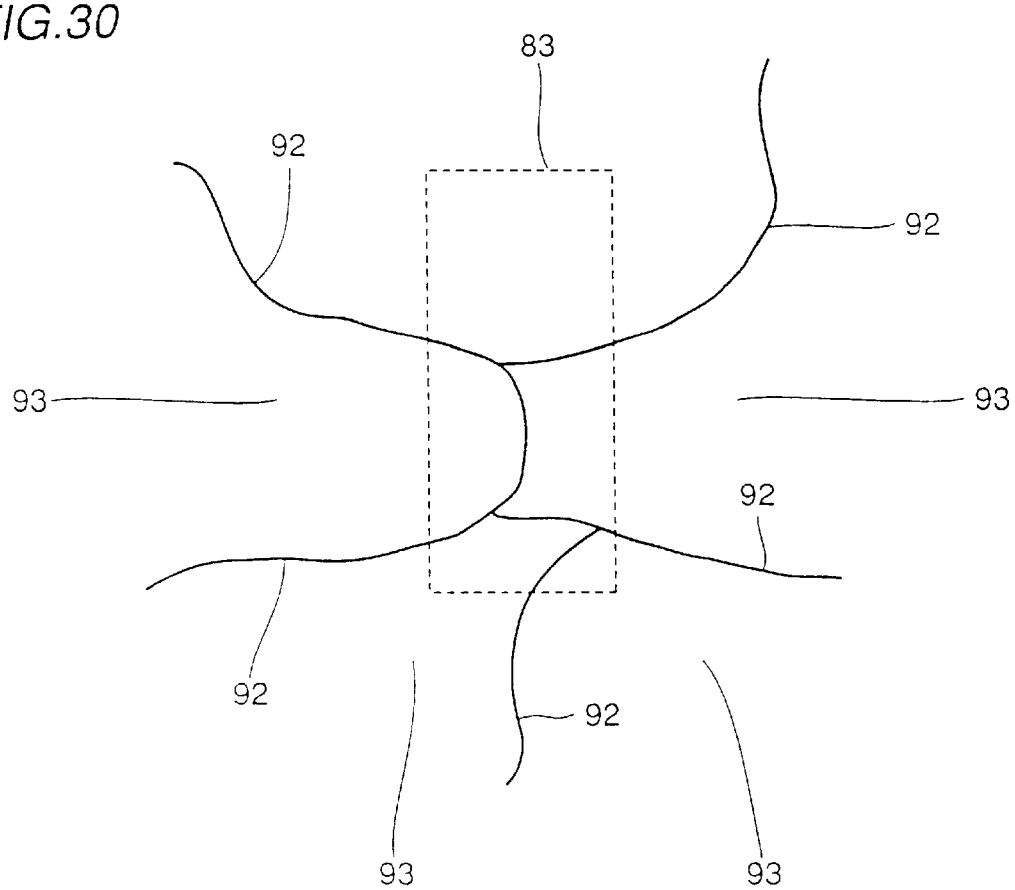
FIG. 30 is a plan view of a TFT for describing a third manufacturing step according to the eighth embodiment of the present invention.

Referring to FIG. 29, nitrogen is ion implanted into undoped polysilicon film 85 at an implantation energy of 10 keV with an impurity concentration of $1\times10^{15}$–$1\times10^{16}$/cm$^2$. Polysilicon film 85 is rendered amorphous except for the portion at the sidewall of gate electrode 83, to result in amorphous silicon 85a. Amorphous silicon 85a is recrystallized by a laser anneal method with polysilicon film 85 as a seed crystal. Thus, a grain 93 having the grain size increased is formed as shown in FIG. 30.

Figure 31:
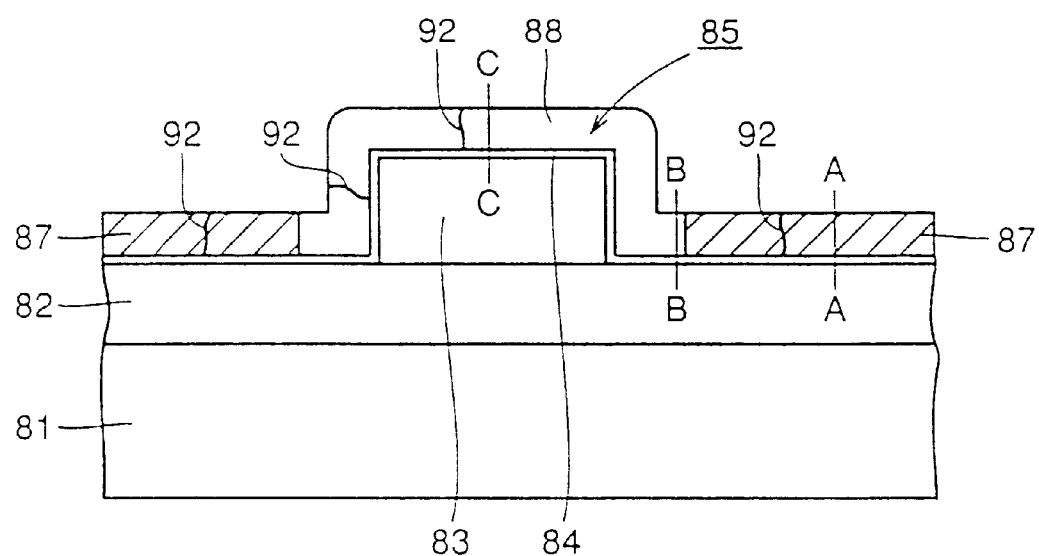
FIG. 31 is a sectional view of a TFT formed according to the eighth embodiment of the manufacturing method of the present invention.

Then, $BF_2^+$ is ion implanted (not shown) at an impurity concentration of $1\times10^{12}$–$1\times10^{13}$/cm$^2$ at an implantation energy of 30 keV into polysilicon film 85. Ion implantation is carried out to control the threshold voltage. Polysilicon film 85 is then patterned (not shown) by photolithography and anisotropic etching. A resist (not shown) is deposited by photolithography at a predetermined region of the patterned polysilicon film. Using this resist as a mask, ion implantation of arsenic is carried out into the patterned polysilicon film at an impurity concentration of $4\times10^{15}$/cm$^2$ and an implantation energy of 30 keV. Then, a heat treatment is carried out at 850° C. for 20 minutes to activate the implanted ions. As a result, an N type source/drain region 87 is formed as shown in FIG. 31. Thus, an NMOS type TFT is formed. Although the 8th embodiment was described in which an NMOS type TFT is formed, the above-described nitrogen ion implantation may be carried out for a PMOS type TFT. The above-described process may be used in the formation of a CMOS-TFT. The present invention is not limited to the manufacturing process of the eighth embodiment where recrystallization is carried out by a heat treatment of a laser annealing method, and recrystallization may be carried out by a heat treatment by means of a diffusion chamber used in the reflow step of an interlayer insulation film or a heat treatment employing lamp annealing.

In the manufacturing method of a TFT according to the eighth embodiment of the present invention, polysilicon is rendered amorphous by ion implanting nitrogen of high impurity concentration into polysilicon film 85 with the portion at the sidewall of gate electrode 83 remaining. Then, a heat treatment is applied to recrystallize amorphous silicon 85a with the remaining polycrystalline silicon film 85 as the seed crystal. Therefore, the grain size of the recrystallized polysilicon film can be increased uniformly, so that the number of grain boundaries is reduced in the polysilicon film where at least the channel region and the source/drain region are formed. This reduces the localized level which becomes the capture trap of carriers and the generation center of an electron-hole pair. As a result, the problem of reduction in ON current and increase in OFF current can be suppressed to form a TFT superior in electric characteristics.

Because nitrogen is used as the implantation ion, the subsequent heat treatment causes nitrogen to be segregated at the interface of polysilicon film 85 and gate oxide film 84. Therefore, generation of interfacial level can be suppressed to prevent the generated hot carriers from being trapped.

Figure 32:
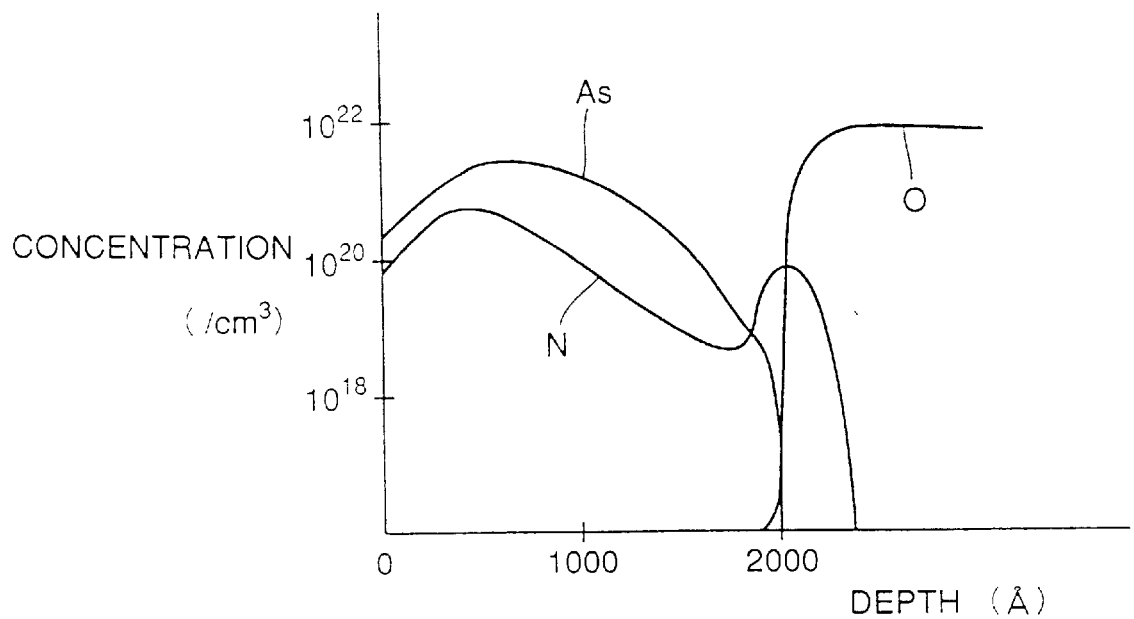
FIGS. 32–34 are diagrams showing the profile of impurities taken along lines A—A, B—B, and C—C, respectively, of the NMOS type TFT shown in FIG. 31.
Figure 33:
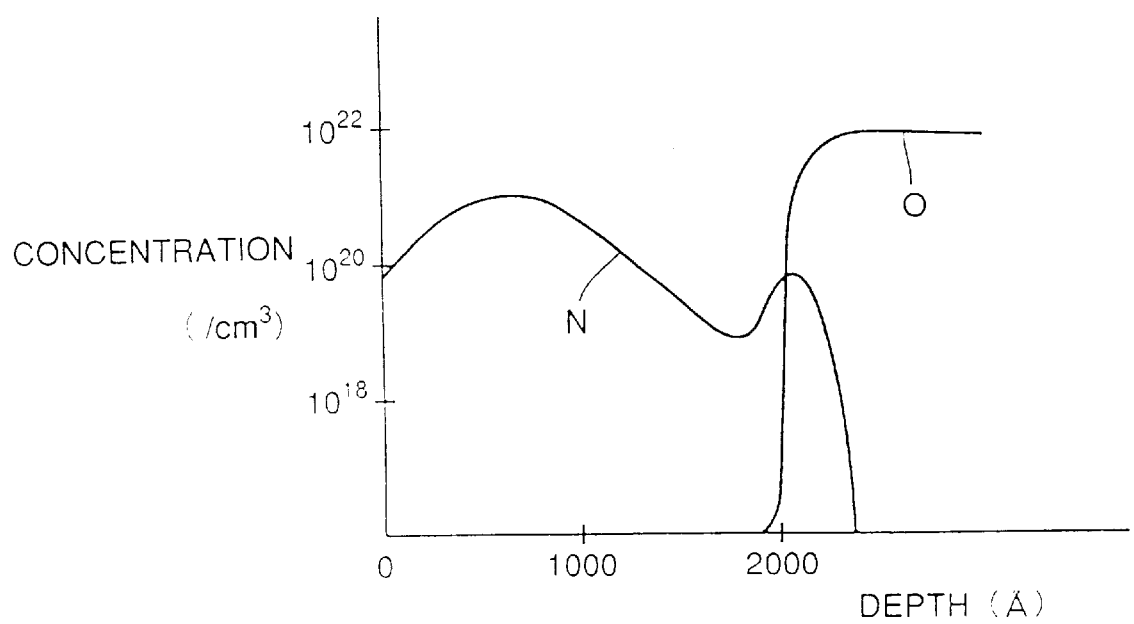
Figure 34:
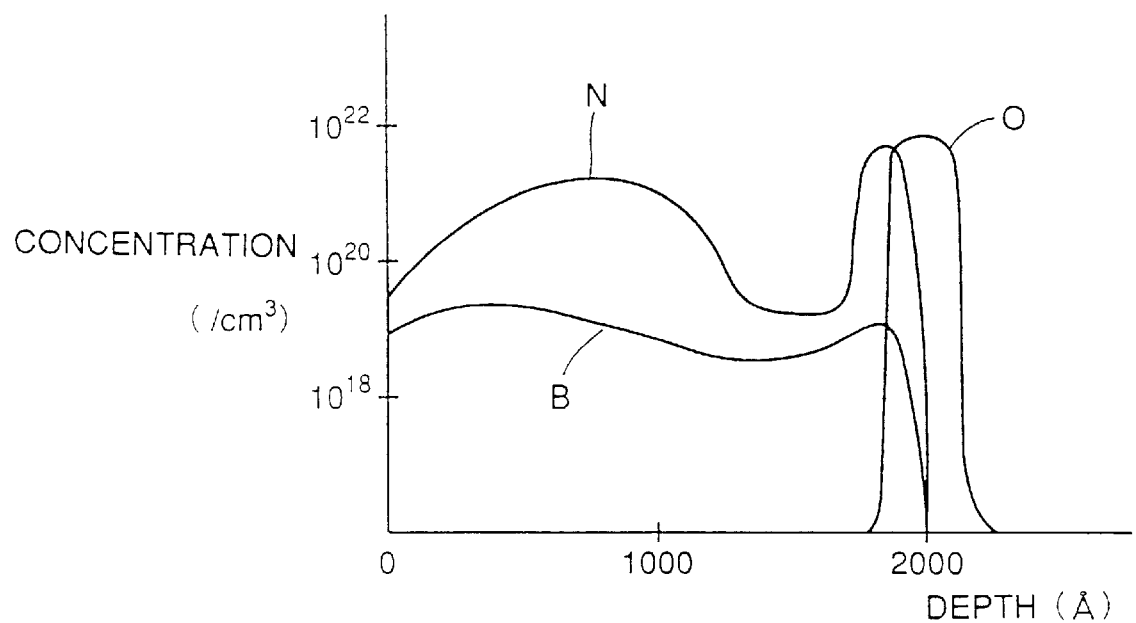

FIGS. 32–34 are diagrams of the impurity profile taken along lines A—A, B—B, and C—C, respectively, of the NMOS type TFT shown in FIG. 31. Referring to FIG. 32, arsenic (As) is implanted as the N type impurity into source/drain region 87. Oxygen O is included in gate insulating film 84 and insulating film 82. The boundary between source/drain region 87 and gate insulating film 84 is located at the depth of 2000 Å. It is appreciated that nitrogen (N) is segregated in the proximity of this boundary. Therefore, hot carriers can be effectively prevented from being trapped. The impurity profile shown in FIG. 33 is basically similar to that of FIG. 32. It is also appreciated from the impurity profile of FIG. 34 that nitrogen (N) is segregated in the proximity of the boundary between channel region 88 and gate insulating film 84. It is also appreciated that boron (B) is doped into channel region 88.

Figure 35:
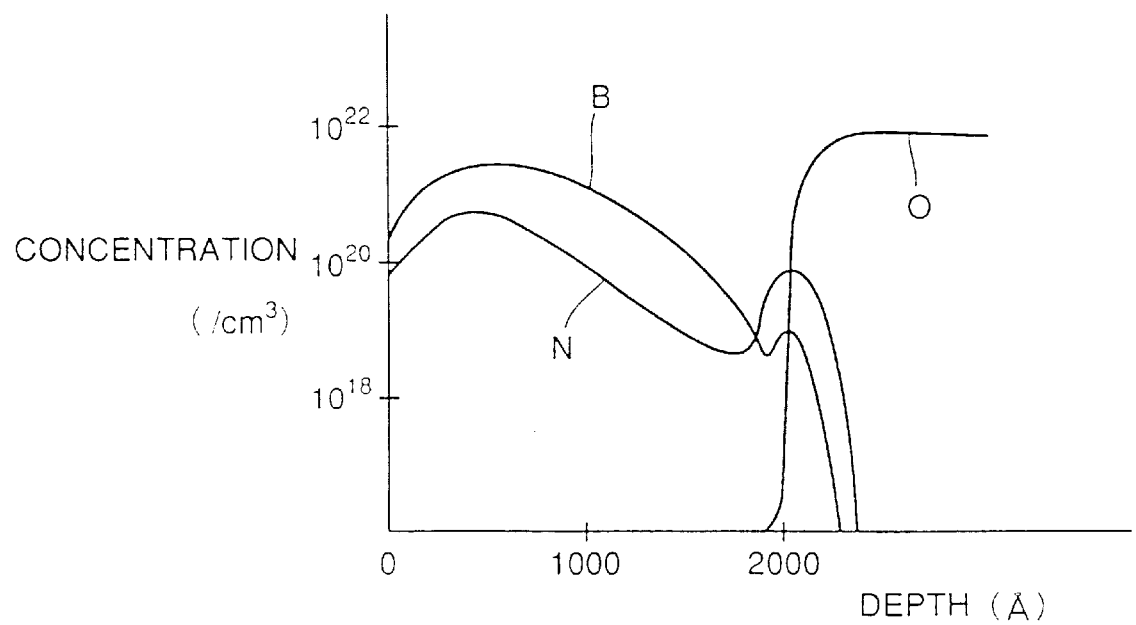
FIGS. 35–37 are diagrams showing the profile of impurities taken along lines A—A, B—B, and C—C, respectively, when the TFT shown in FIG. 31 is a PMOS type TFT.
Figure 36:
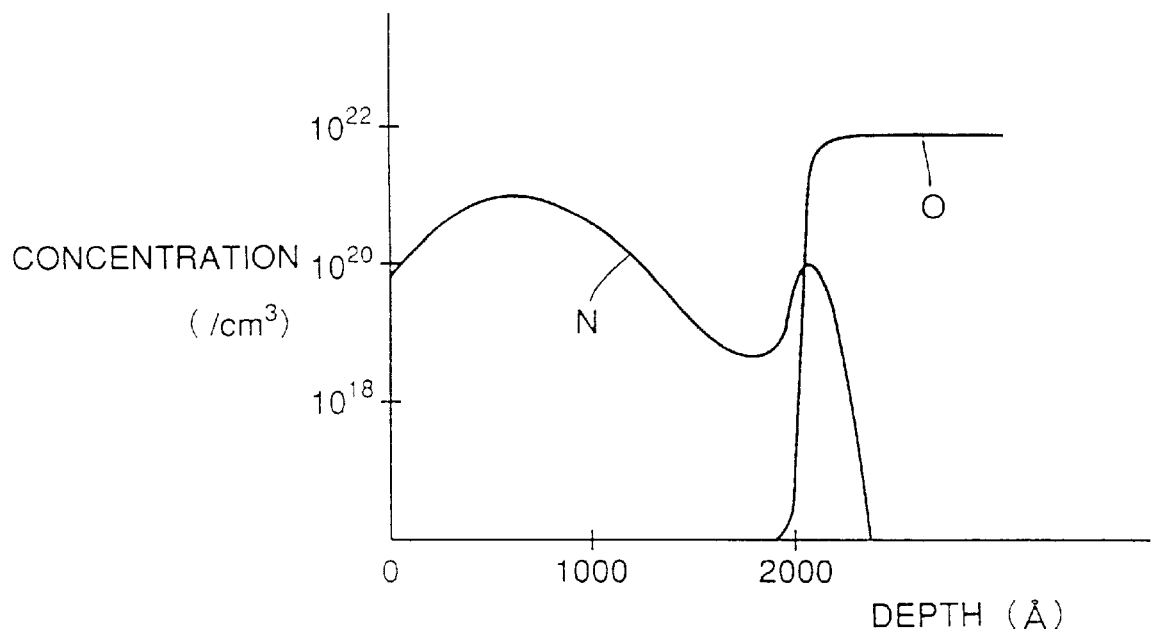
Figure 37:
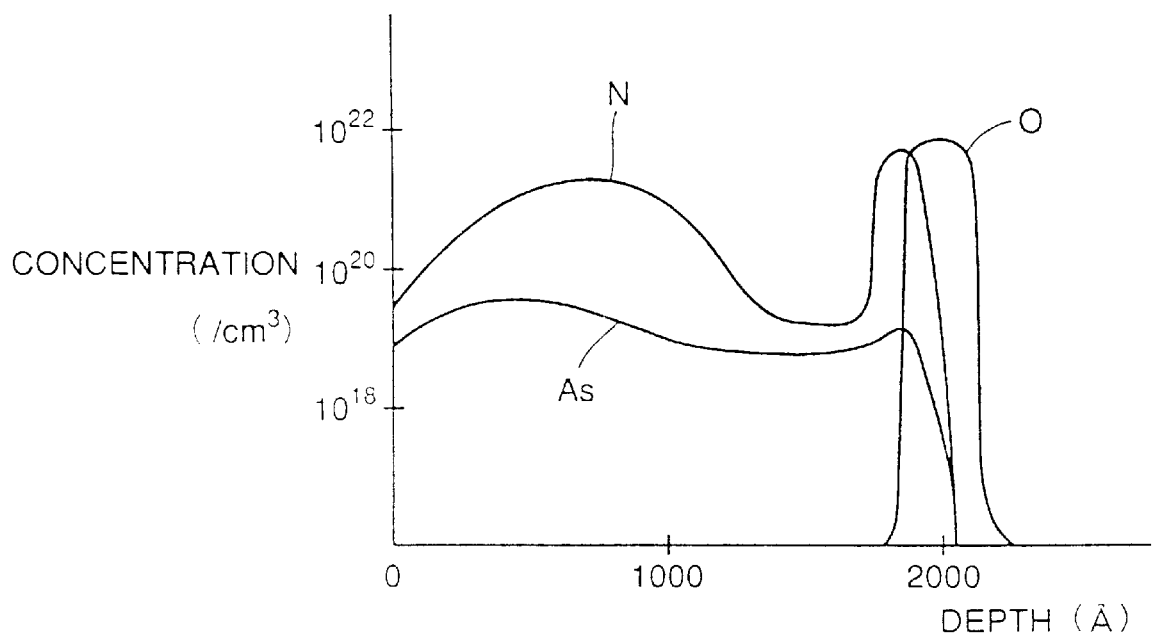

In comparison to FIGS. 32–34 showing the impurity profile of an NMOS type TFT, the impurity profile of a PMOS type TFT is shown in FIGS. 35–37 taken along lines A—A, B—B, and C—C, respectively, of the TFT shown in FIG. 31 in the case of a PMOS type TFT.

Referring to FIG. 35, nitrogen (N) is segregated at the boundary between source/drain region 87 and gate insulating film 84 also in a PMOS-TFT. Boron (B) which is a P type impurity is introduced into source/drain region 87. The impurity profile diagram of FIG. 36 taken along line B—B of FIG. 31 is basically similar to that of FIG. 35 taken along line A—A of FIG. 31. It is also appreciated from FIG. 37 that nitrogen (N) is segregated also at the proximity of the boundary of channel region 88 and gate insulating film 84. Arsenic (As) which is an N type impurity is doped into channel region 88.

Ion implantation of nitrogen (N) provides the advantage of facilitating control of the diffusion depth and the impurity concentration.

The above-described advantages of 1st–8th embodiments are significant when the dimension of the field region of a TFT is reduced according to miniaturization of devices to become equal or smaller than the grain size of recrystallized polysilicon 7. The present invention is very effective conforming to the trend of reduction of size in devices.

The basic concept of a method of manufacturing a TFT according to a ninth embodiment of the present invention will be described hereinafter with reference to FIGS. 38–51. The ninth embodiment is characterized in that the position of the grain boundary of polysilicon can be controlled by a combination of the steps of rendering a portion of polysilicon amorphous by silicon implantation and increasing the grain size of polysilicon by solid phase growth.

Figure 38:
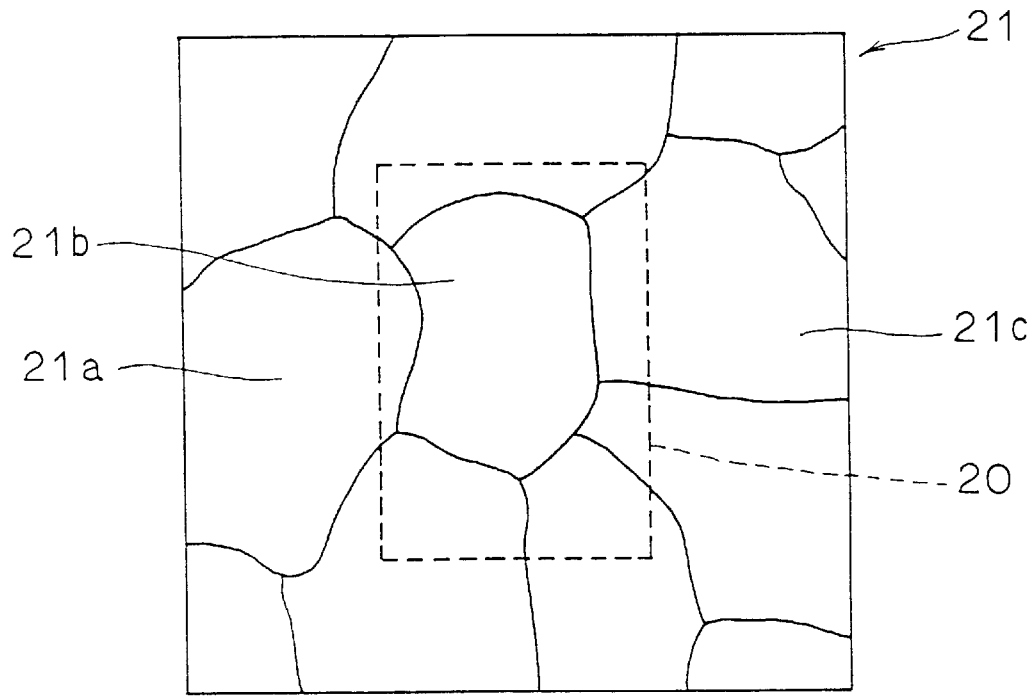
FIGS. 38–51 are plan views of a TFT for describing 1st–14th manufacturing steps according to a ninth embodiment of the present invention.

Referring to FIG. 38, a polysilicon layer 21 is formed to include a TFT formation region 20. Polysilicon layer 21 includes a plurality of polysilicon grains 21a, 21b, 21c, . . .

Figure 39:
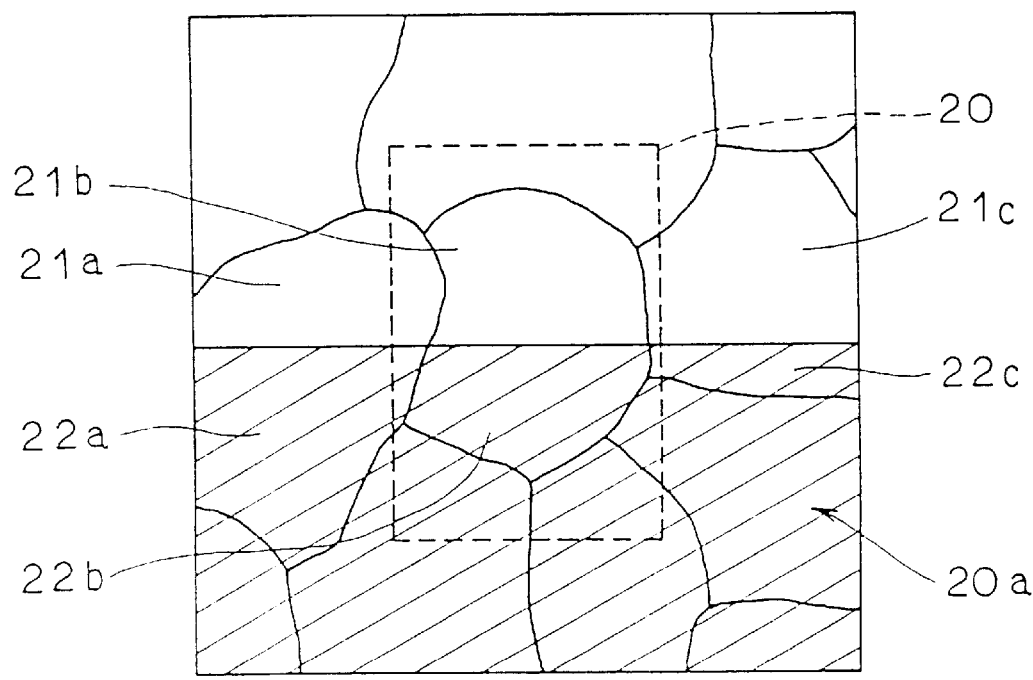
Figure 40:
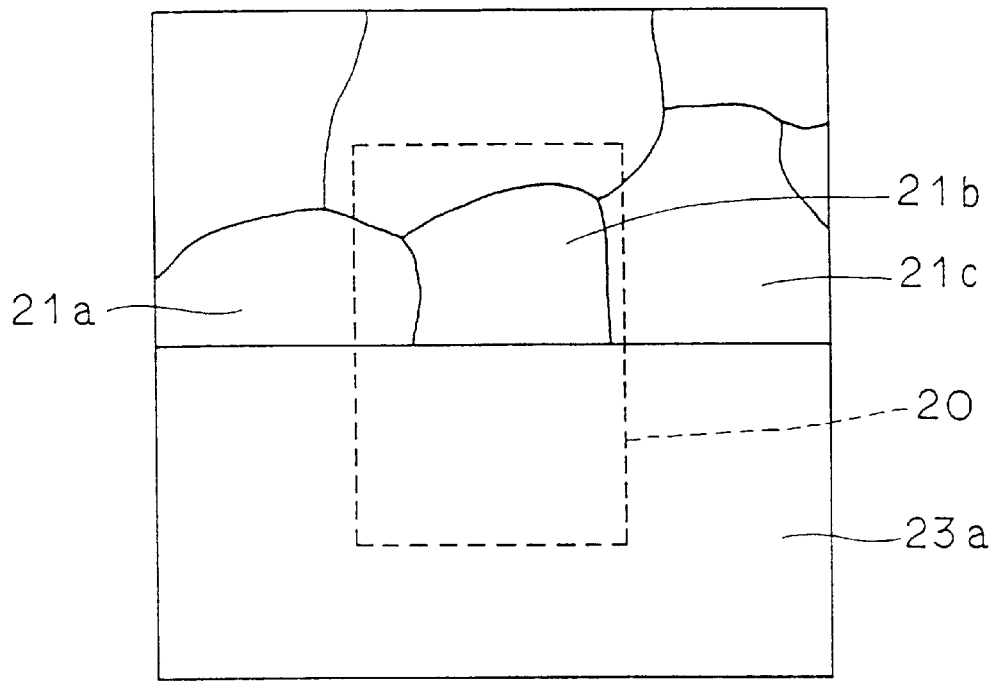
Figure 41:
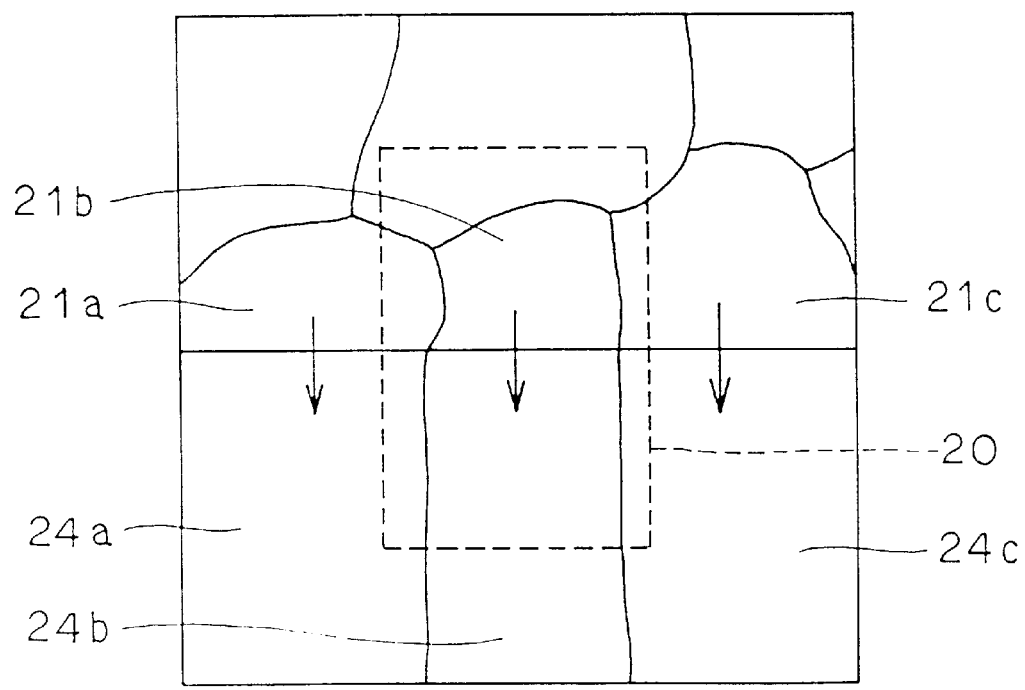

A first silicon implantation step is carried out into a silicon implantation region 20a indicated by the shaded region in FIG. 39. This silicon implantation renders the implanted region of polysilicon amorphous to become amorphous silicon 22a, 22b, and 22c. The grain boundary is eliminated in this region to result in a state shown in FIG. 40. Then, a heat treatment is applied to carry out the first solid phase growth step, whereby regions 24a, 24b and 24c are crystallized with crystal grains 21a, 21b and 21c as nuclei.

Figure 42:
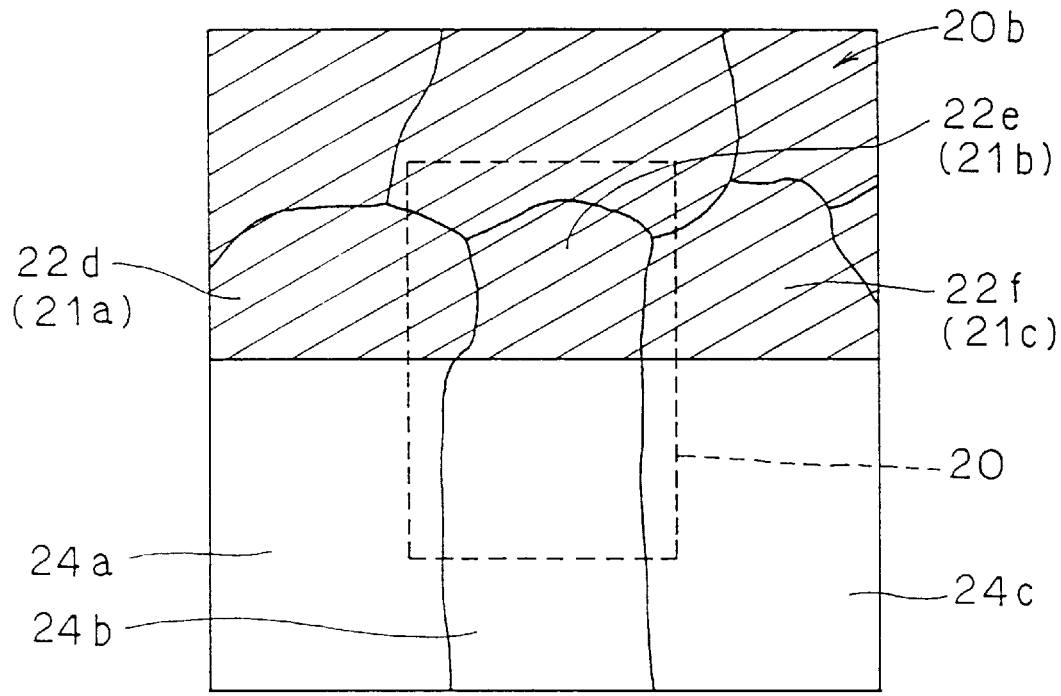
Figure 43:
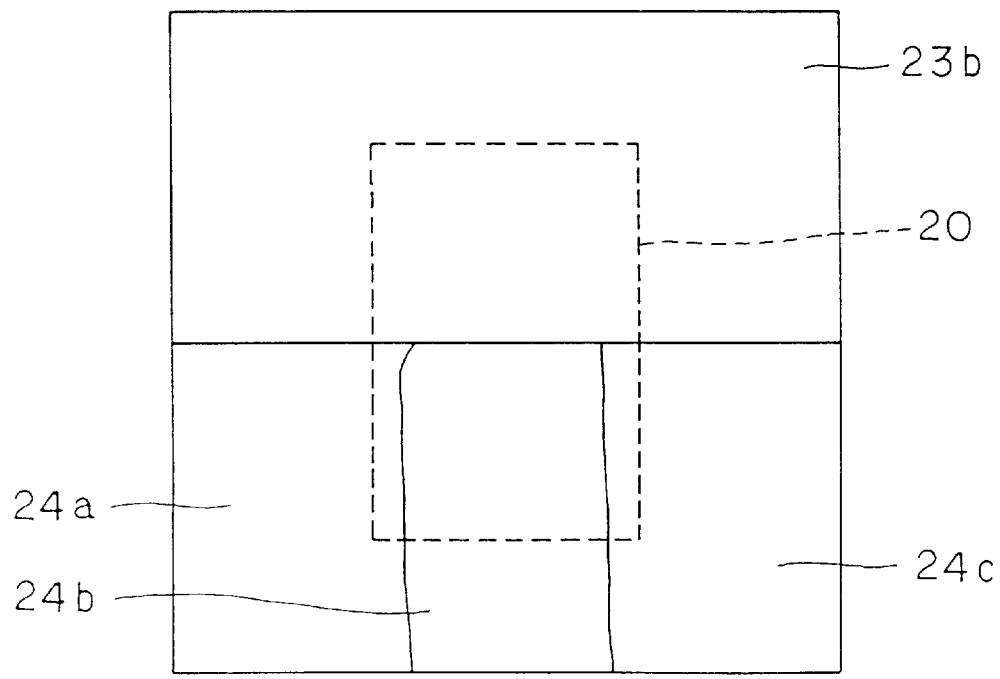

Referring to FIG. 42, a second silicon implantation step is carried out on a second silicon implantation region (shaded area) 20b. Polysilicon in silicon implantation region 20b attains an amorphous state. Also, polysilicon of regions 22d, 22e and 22f is rendered amorphous. As a result, amorphous silicon 23b is formed as shown in FIG. 43.

Figure 44:
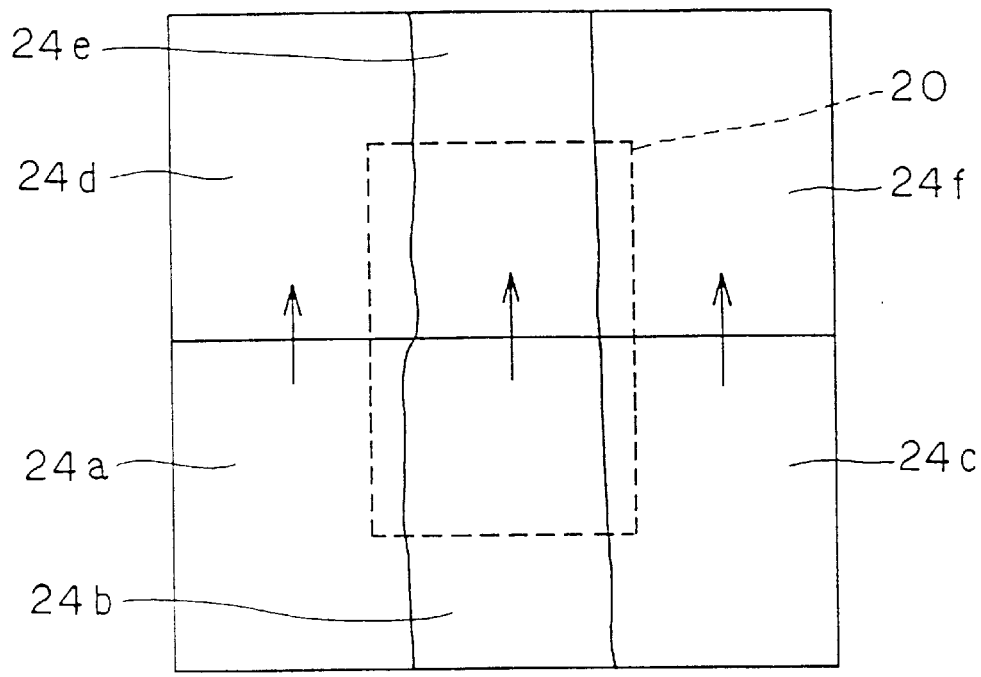

Referring to FIG. 44, a heat treatment is applied to carry out a second solid phase growth step, whereby regions 24d, 24e, 24f are crystallized with polysilicon grains 24a, 24b, 24c as nuclei.

Figure 45:
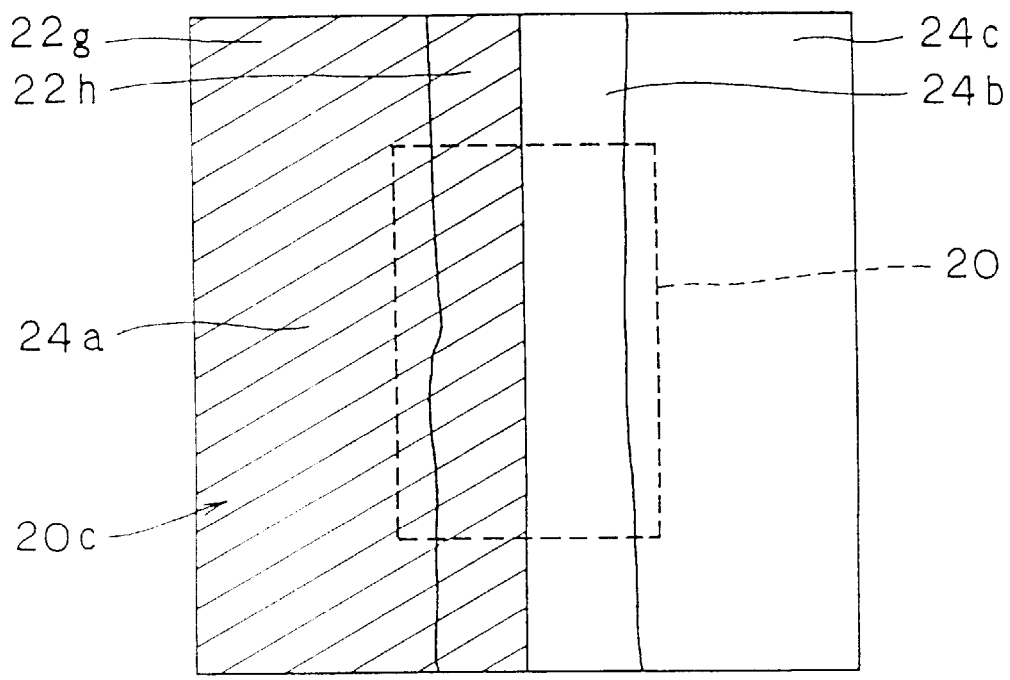
Figure 46:
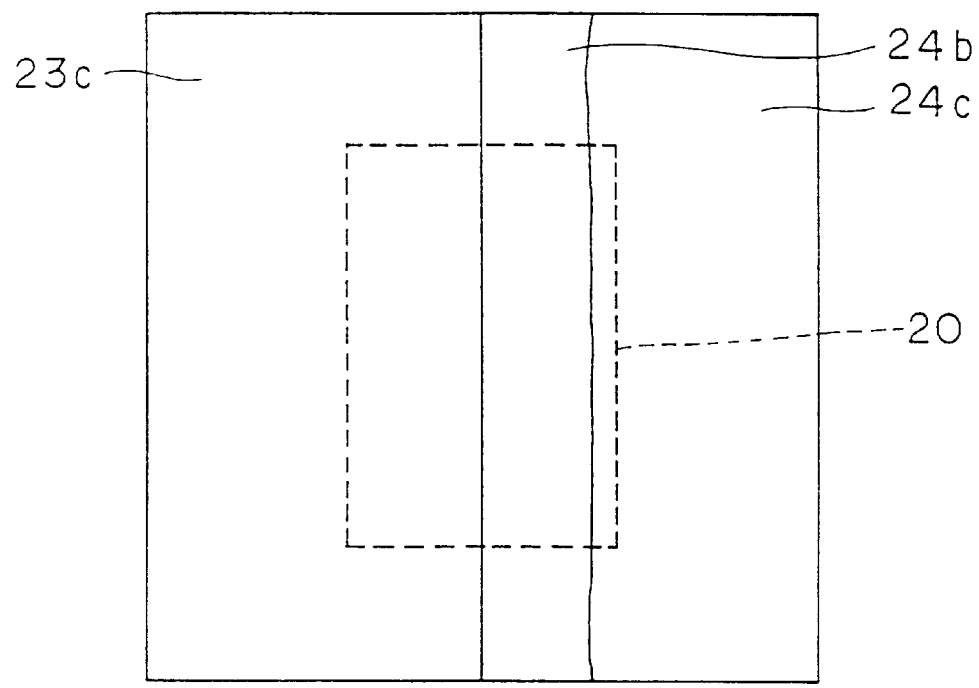

Referring to FIG. 45, a third silicon implantation step is carried out into a silicon implantation region (shaded area) 20c. The regions of 22g and 22h are rendered amorphous out of polysilicon grains 24a, 24b and 24c. As a result, amorphous silicon 23c is formed as shown in FIG. 46.

Figure 47:
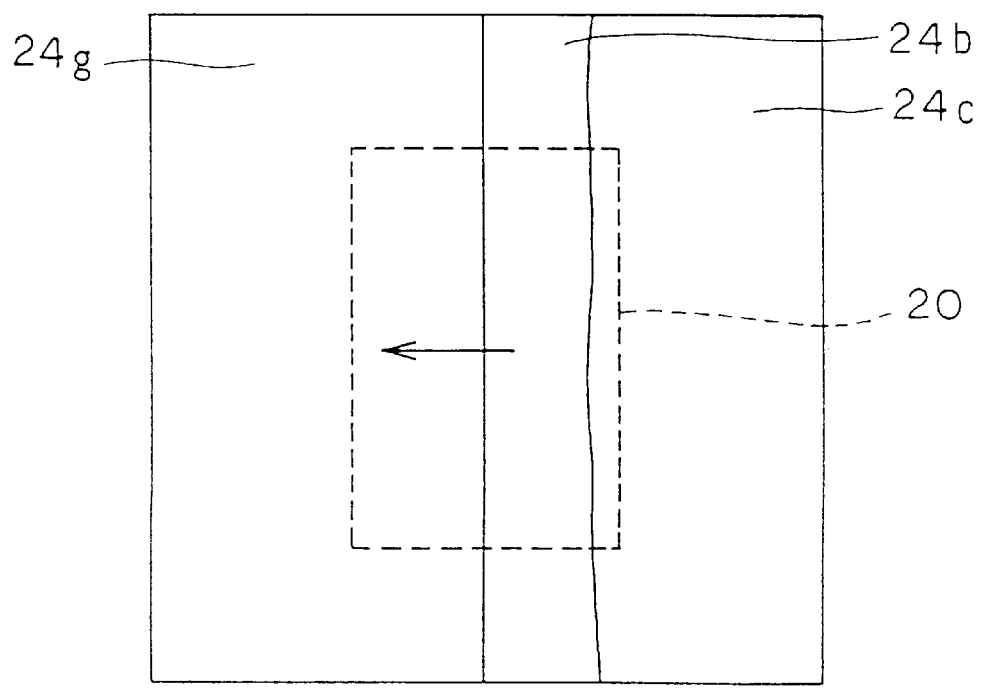

Referring to FIG. 47, a third solid phase growth step is carried out, whereby region 24g is crystallized with crystal grain 24b as a nucleus.

Figure 48:
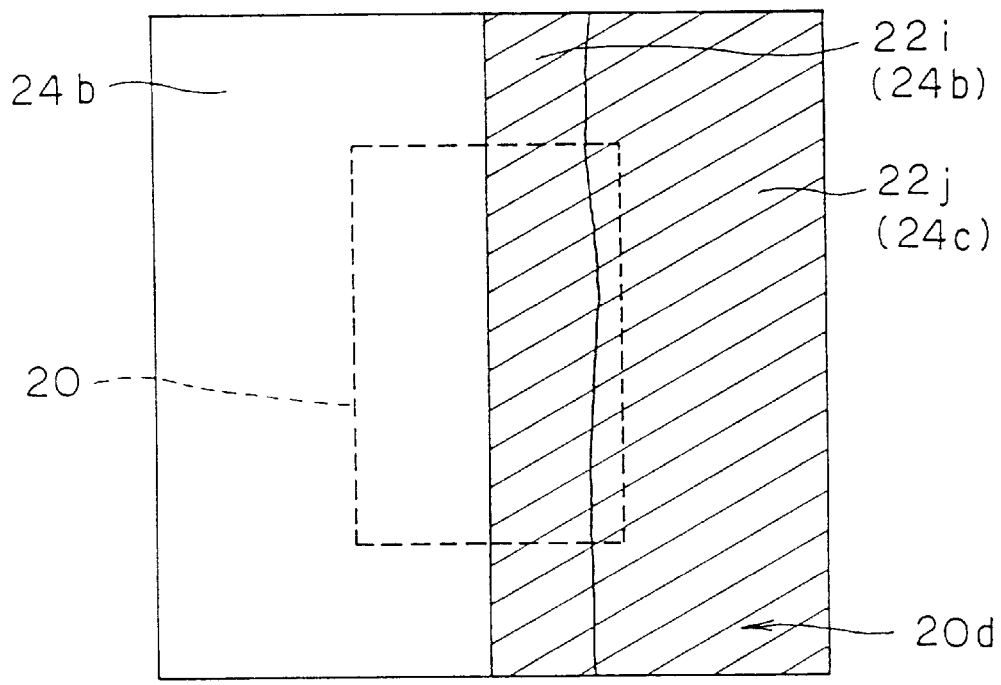
Figure 49:
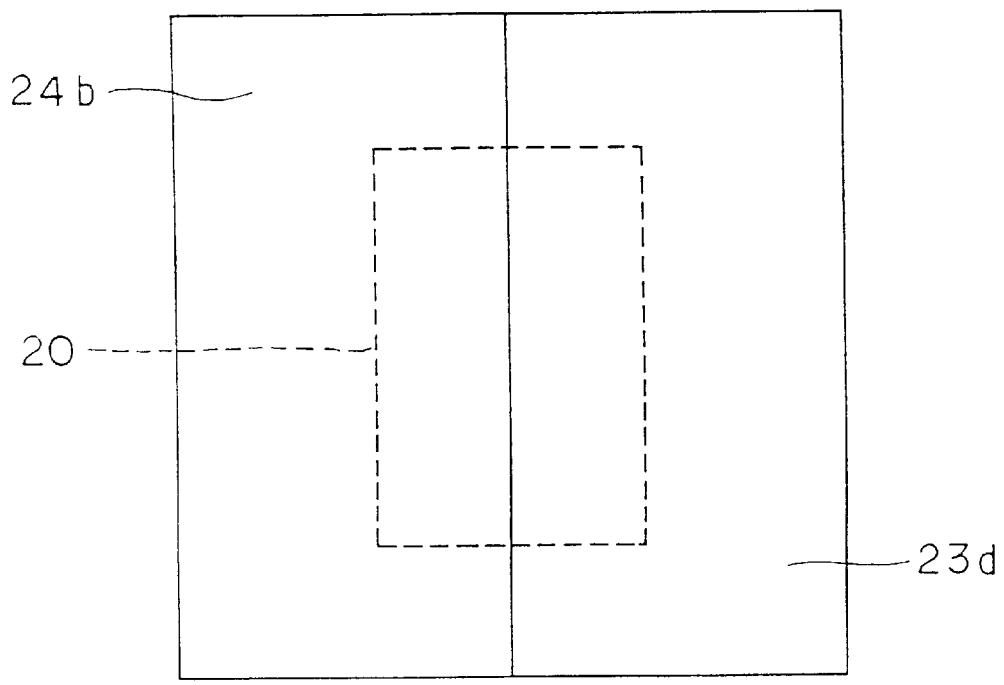

Referring to FIG. 48, a fourth silicon implantation step is carried out onto a silicon implantation region (shaded area) 20d. As a result, region 22i of grain 24b and region 22j of crystal 24c are rendered amorphous to form amorphous silicon 23d as shown in FIG. 49.

Figure 50:
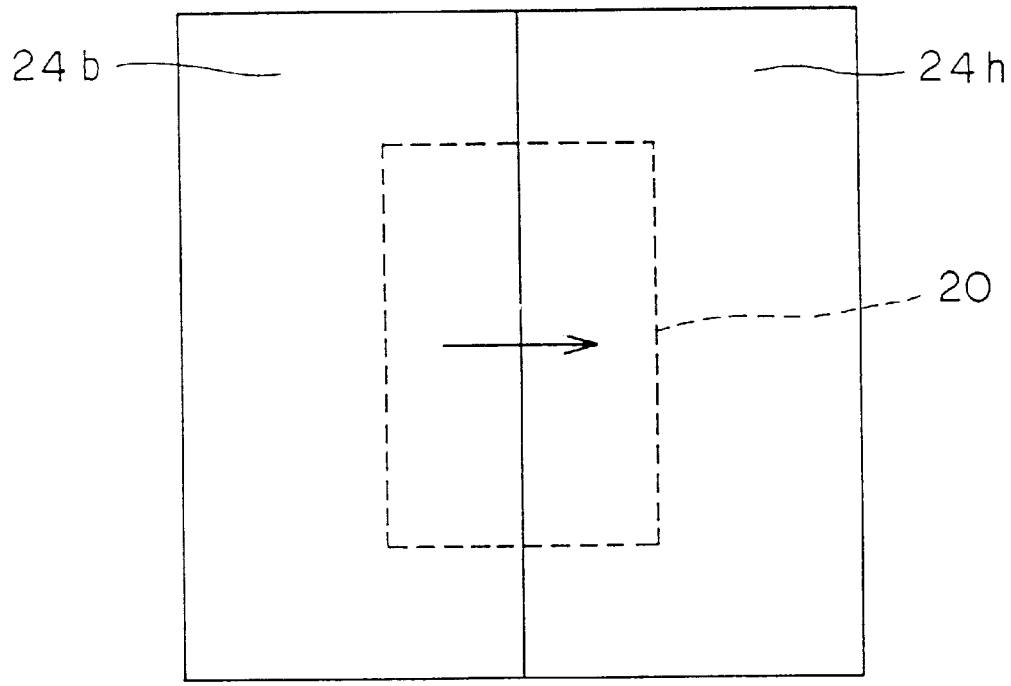
Figure 51:
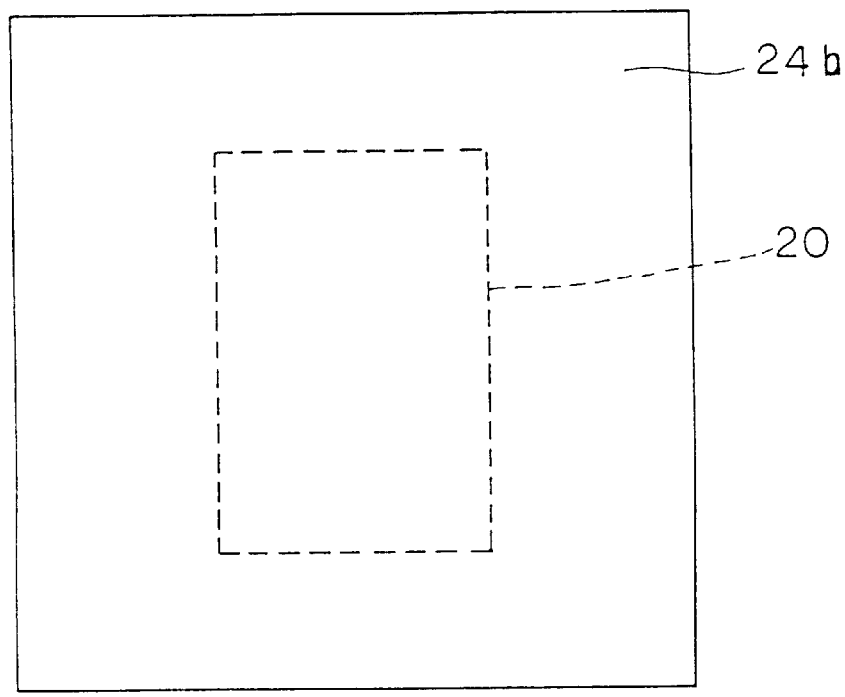

Referring to FIG. 50, a heat treatment is applied to carry out a fourth solid phase growth step, whereby region 24h is crystallized with crystal grain 24b as a nucleus. By repeating silicon implantation on the polysilicon film and solid phase growth for 4 times as described above, TFT formation region 20 becomes one grain 24b as shown in FIG. 51. Thus, a grain boundary can be eliminated from a TFT formation region. A TFT formed in the above-described manner has favorable electric characteristics of a great ON current and a small OFF current. Furthermore, there is no difference in the electric characteristics between each TFT.

The grain size of polysilicon formed by the above-described 4 stages of solid phase growth is approximately 1.3 $\mu$m. By applying the 4-stage solid phase growth step in a TFT having a channel region of L/W=0.8/0.4 $\mu$m, a TFT can be reliably formed within one crystal grain.

The manufacturing process of a top gate type TFT according to the above ninth embodiment will be described hereinafter.

Figure 52:
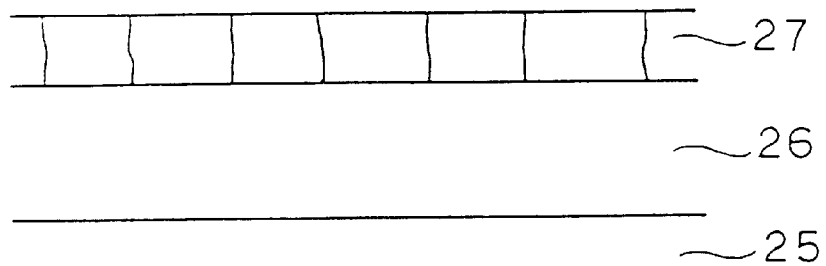
FIG. 52 is a sectional view for describing a first manufacturing step when the manufacturing method of the ninth embodiment shown in FIGS. 38–51 is applied to a top gate type TFT.

Referring to FIG. 52, an insulating film 26 is formed on a substrate 25. A polysilicon film 27 is formed to a thickness of approximately 2000 Å on insulating film 26 by CVD. The grain size of polysilicon film 27 must be greater than the overlay accuracy of the mask (approximately 0.1 $\mu$m). It is to be noted that polysilicon film 27 may be formed by solid phase growing the amorphous silicon.

Figure 53:
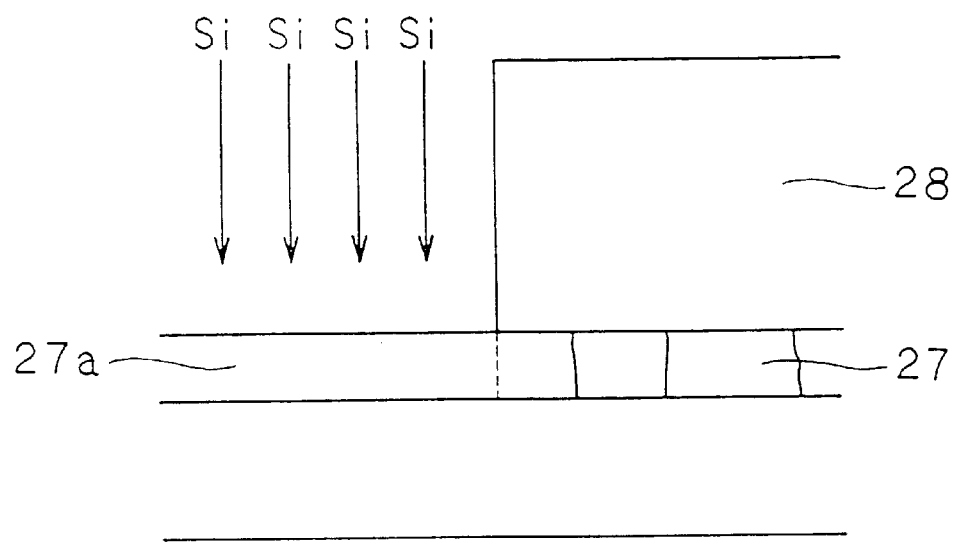
FIGS. 53–56 are sectional views for describing 2nd–5th manufacturing steps when the manufacturing method of a ninth embodiment shown in FIGS. 38–51 is applied to a top gate type TFT.

Referring to FIG. 53, a resist 28 is formed on a predetermined region on polysilicon film 27. Using resist 28 as a mask, silicon ions are implanted at an implantation energy of 130 keV and an implantation amount of 5×10$^{15}$/cm$^2$. The implantation energy must be altered so that the implantation peak is at the proximity of the boundary of polysilicon film 27 and insulating film 26 when the film thickness of polysilicon film 27 differs partially. By this silicon implantation, the portion of polysilicon film 27 not covered with resist 28 is rendered amorphous to result in amorphous silicon 27a. Then, resist 28 is removed.

Figure 54:
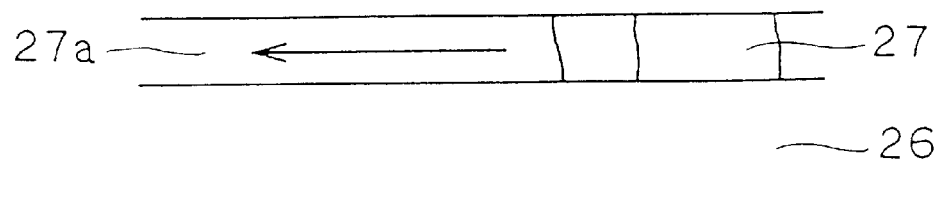
Figure 55:
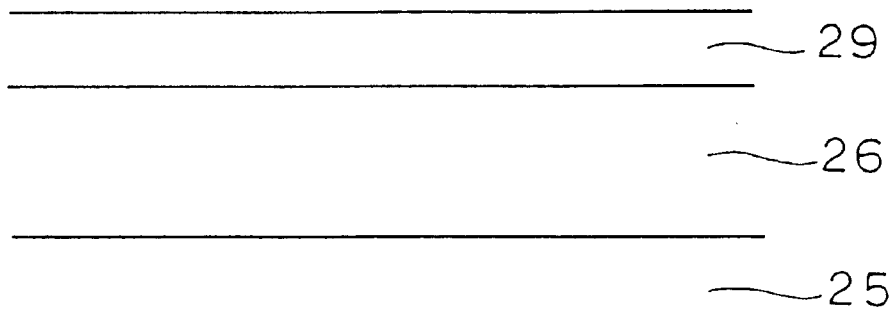

Referring to FIG. 54, solid phase growth is carried out for 12 hours at a temperature condition of approximately 600° C., whereby amorphous silicon 27a (refer to FIG. 53) is crystallized. By repeating the steps described in FIGS. 53 and 54 four times, polysilicon film 29 without a grain boundary in the TFT formation portion as shown in FIG. 55 can be formed.

Figure 56:
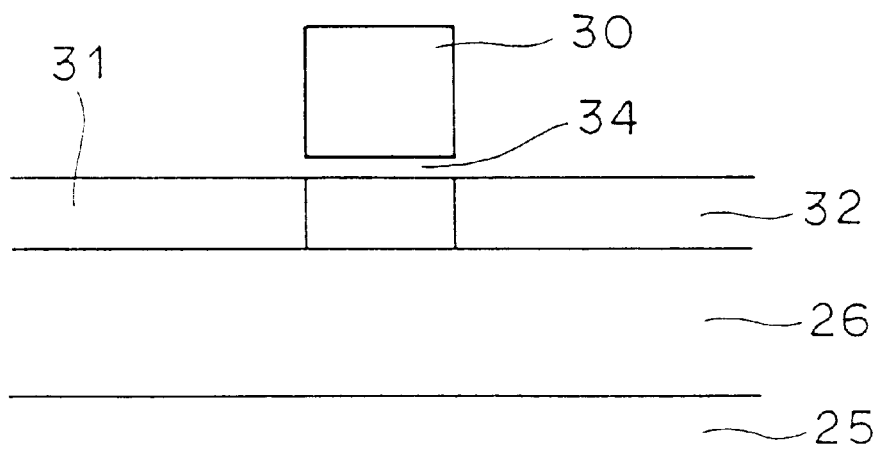

Referring to FIG. 56, a gate insulating film 34 and a gate electrode 30 are formed. Using gate electrode 30 as a mask, impurities are implanted to form a source region 31 and a drain region 32. Thus, a top gate type TFT is formed with no grain boundary in the active region.

Figure 57:
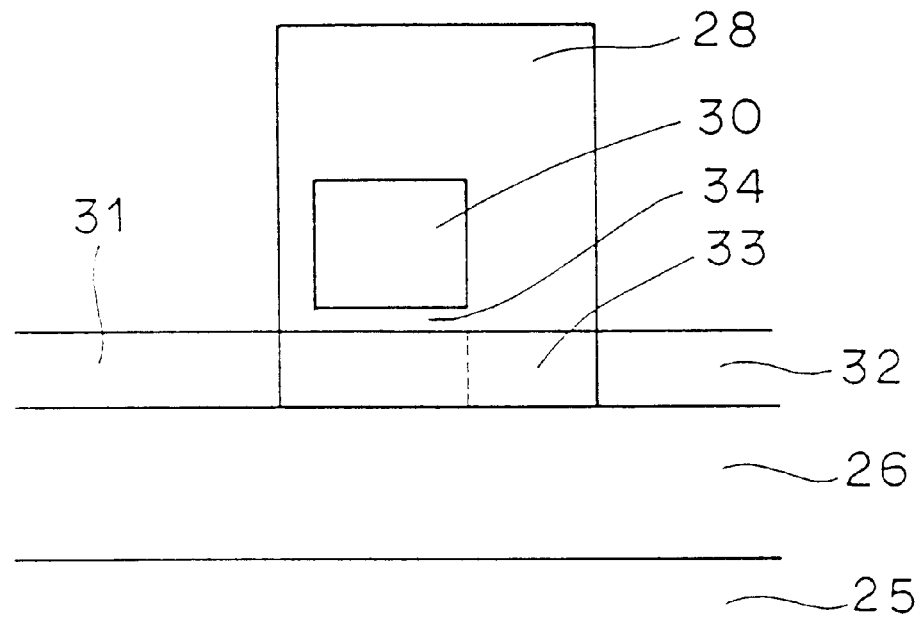
FIG. 57 is a sectional view indicating a manufacturing process where the structure of the top gate type TFT shown in FIG. 56 has a drain offset structure.

In order to obtain an offset structure of drain region 32 in the top gate type TFT shown in FIG. 56, a resist mask 28 is formed, and ion implantation is carried out using resist 28 as a mask as shown in FIG. 57. Thus, an offset structure of drain region 32 is obtained. It is to be noted that source region 31 and drain region 32 may take a LDD structure.

A manufacturing process of applying the method of the ninth embodiment in a bottom gate type TFT will be described hereinafter with reference to FIGS. 58–62.

Figure 58:
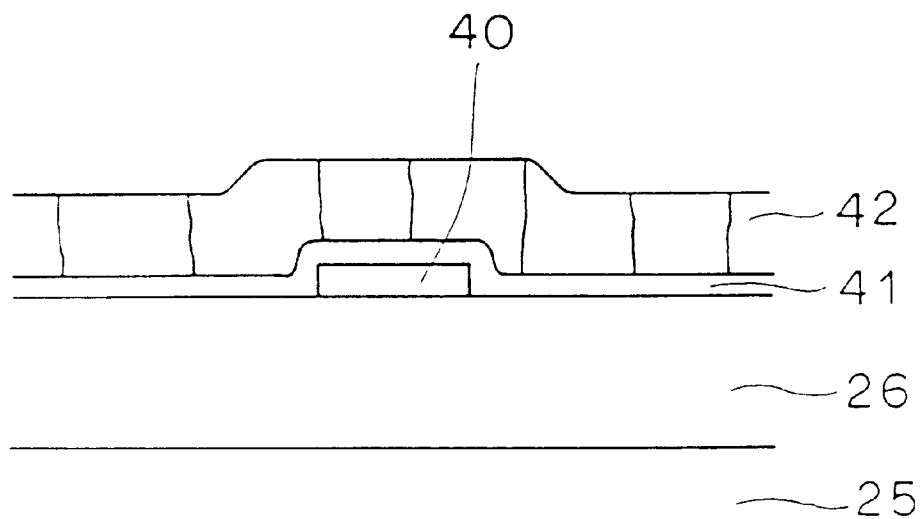
FIGS. 58–60 are sectional views for describing 1st–3rd manufacturing steps when the manufacturing method of the ninth embodiment shown in FIGS. 38–51 is applied to a bottom gate type TFT.

Referring to FIG. 58, an insulating film 26 is formed on a substrate 25. A gate electrode 40 is formed at a predetermined region on insulating film 26. A gate insulating film 41 is formed to cover gate electrode 40. A polysilicon film 42 is formed to a thickness of approximately 2000 Å by CVD to cover gate insulating film 41.

Figure 59:
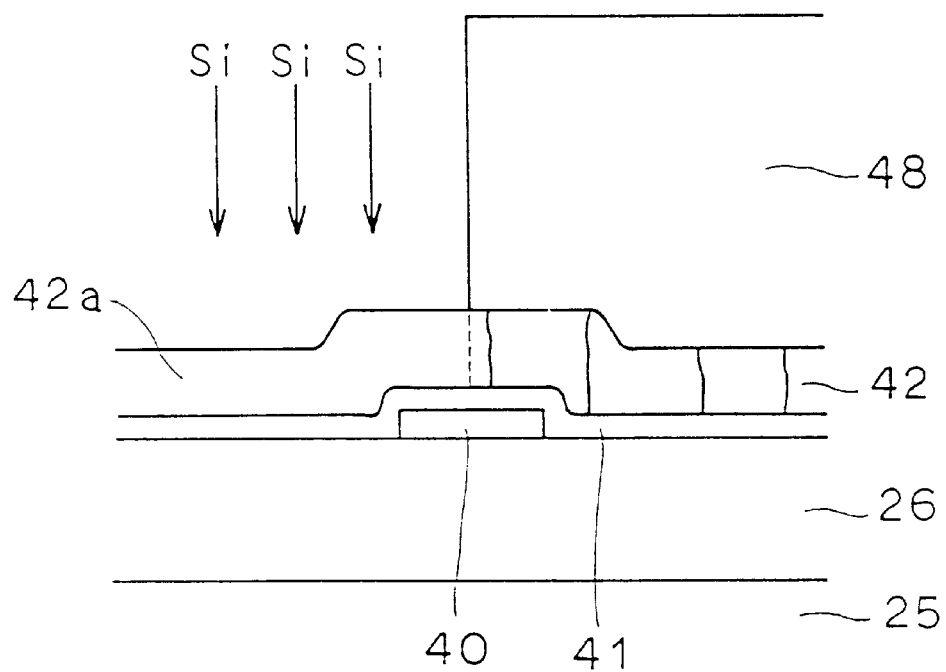

Referring to FIG. 59, a resist 48 is formed at a predetermined region on polysilicon film 42. Using resist 48 as a mask, silicon is implanted into polysilicon film 42 to form amorphous silicon 42a.

Figure 60:
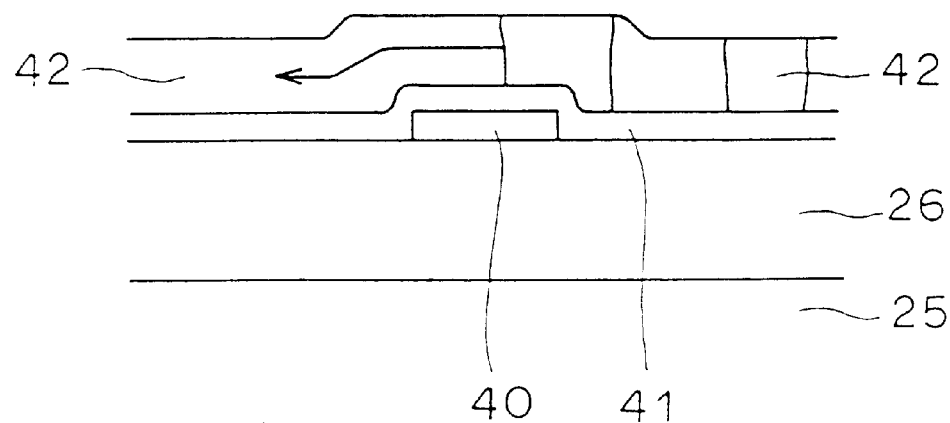
Figure 61:
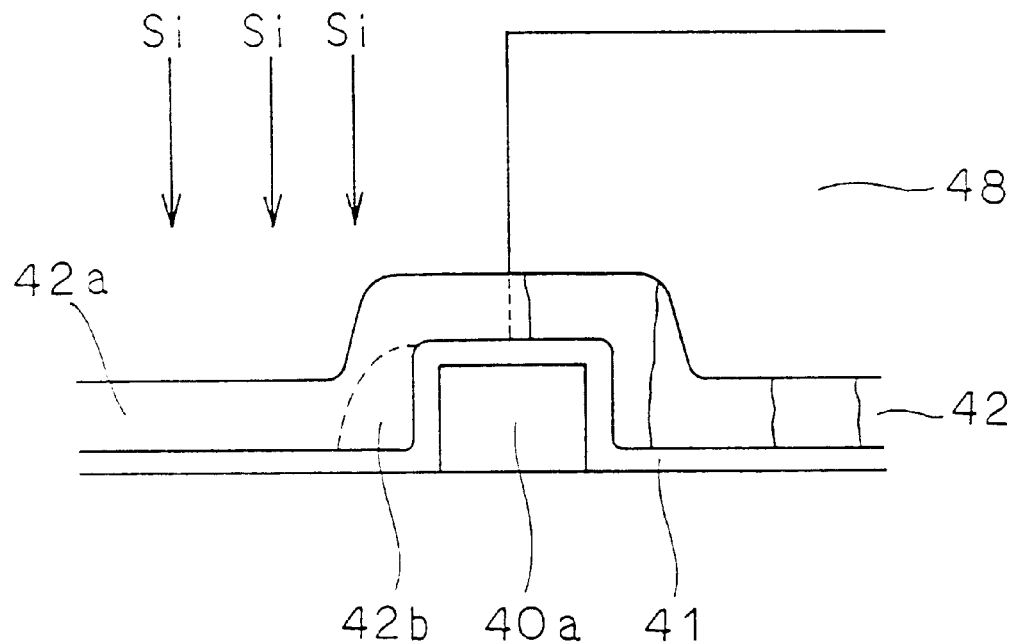
FIG. 61 is a sectional view for describing the disadvantage when the film thickness of the gate electrode is great in the process shown in FIG. 59.

Referring to FIG. 60, resist 48 is removed and amorphous silicon 42a (refer to FIG. 59) is recrystallized. By repeating the manufacturing process described in FIGS. 59 and 60 four times, a bottom gate type TFT with no grain boundary in the active region can be formed.

Figure 62:
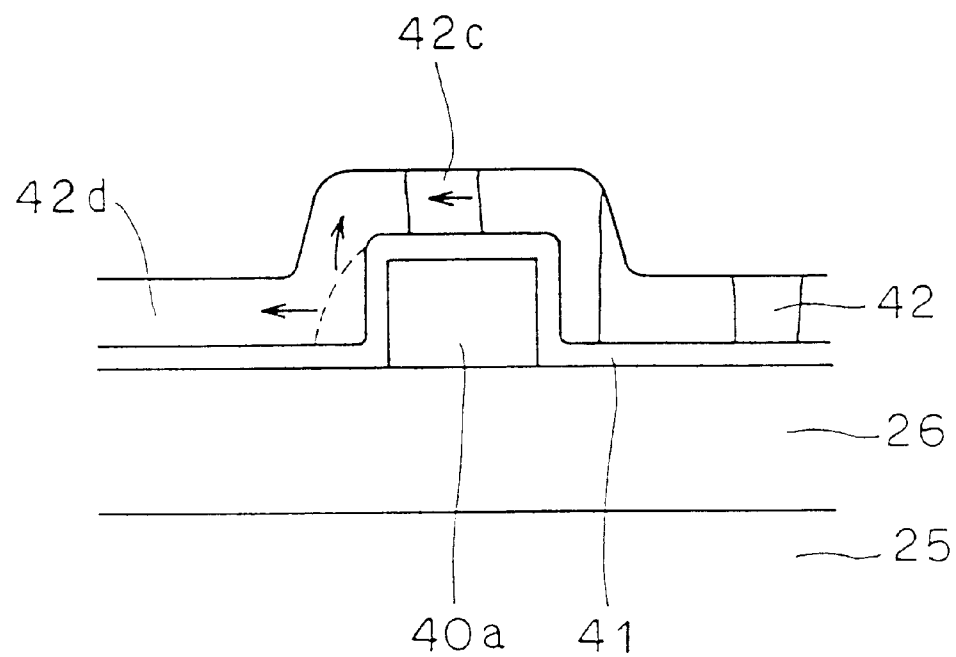
FIG. 62 is a sectional view showing the state of recrystallization from the state shown in FIG. 61.

When the thickness of gate electrode 40a is great, a portion of polysilicon not rendered amorphous is left at the sidewall of gate electrode 40a as sidewall polysilicon 42b when silicon is implanted with resist 48 as a mask. The standard deviation of distribution in the depth direction of silicon atoms implanted at the implantation energy of 130 keV is approximately 700 Å. If the film thickness of gate electrode 40a is smaller than the standard deviation, a sidewall polysilicon 42b will not be formed. A sidewall polysilicon 42b is formed if the thickness of gate electrode 40a is greater than the standard deviation. There is a problem that the region having silicon implanted will result in two polysilicon grains 42d and 42c as shown in FIG. 62 if recrystallization is carried out with such sidewall polysilicon 42b remaining.

In such a case, sidewall polysilicon 42b must be eliminated by carrying out silicon implantation two times with different depth of silicon implantation, or by carrying out silicon implantation in an oblique manner.

Although the present embodiment was described in which resist 48 is used as a mask in silicon implantation, a patterned oxide film may alternatively be used.

The manufacturing process according to the ninth embodiment shown in FIGS. 38–51 basically requires 4 masks in order to carry out silicon implantation four times. However, the first silicon implantation (refer to FIG. 39) and the second silicon implantation (refer to FIG. 42) can share a common mask. Furthermore, the third silicon implantation (refer to FIG. 45) and the fourth silicon implantation (refer to FIG. 48) can share a common mask. More specifically, if the mask pattern used in the first silicon implantation is transferred to a positive resist, the mask pattern to be used in the second silicon implantation is transferred to a negative resist with the same mask. Thus, the number of masks required for the four solid phase growth steps can be reduced to half.

The boundary of the masks shown in FIGS. 39, 42, 45 and 48 may not necessarily be linear. Although the respective masks in the 4 silicon implantation steps do not have to be perpendicular to each other, the preferable crossing angle is around 90°.

A method of manufacturing a TFT according to a tenth embodiment of the present invention will be described hereinafter with reference to FIGS. 63–67.

Figure 63:
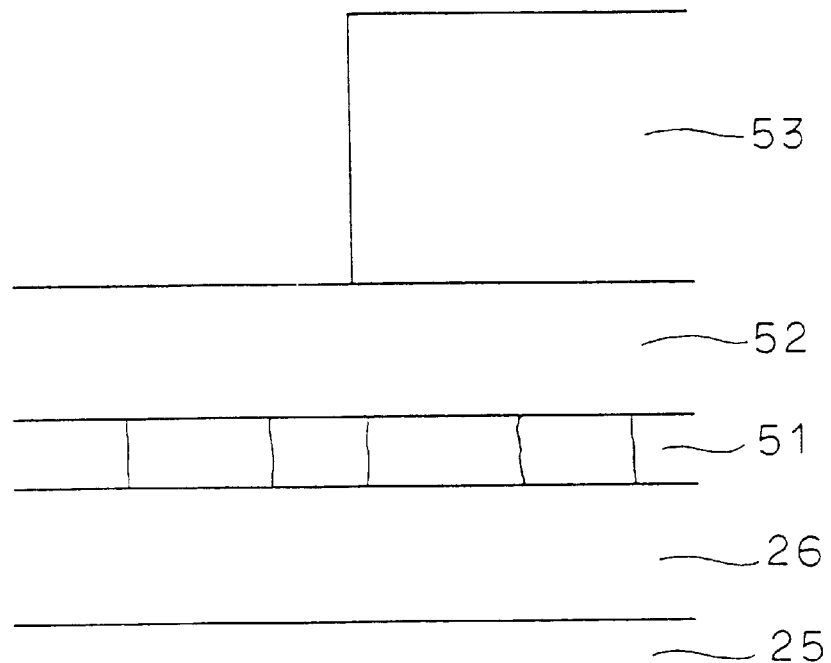
FIGS. 63–67 are sectional views of a TFT for describing 1st–5th manufacturing steps according to a tenth embodiment of the present invention.
Figure 64:
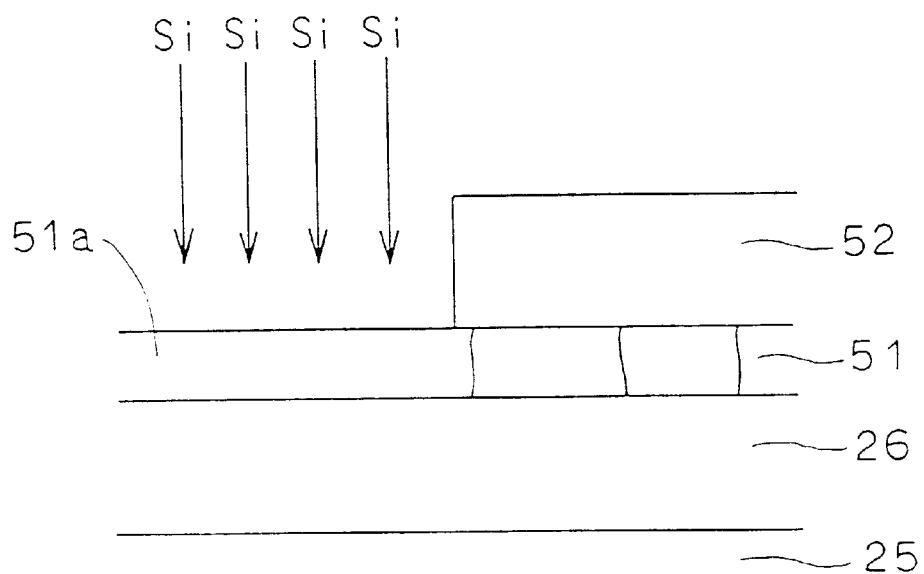

Referring to FIG. 63, an insulating film 26 is formed on a substrate 25. A polysilicon film 51 is formed to a thickness of approximately 2000 Å on insulating film 26 by CVD. An oxide film 52 is formed to a thickness of approximately 4000 Å on polysilicon film 51 by CVD. A resist 53 is formed at a predetermined on oxide film 52. Using resist 53 as a mask, oxide film 52 is etched to result in a patterned oxide film 52 as shown in FIG. 64. Then, resist 53 (refer to FIG. 64) is removed. Using oxide film 52 as a mask, a first silicon implantation step is carried out at implantation conditions of 130 keV and $5 \times 10^{15}/cm^2$. As a result, amorphous silicon 51a is formed.

Figure 65:
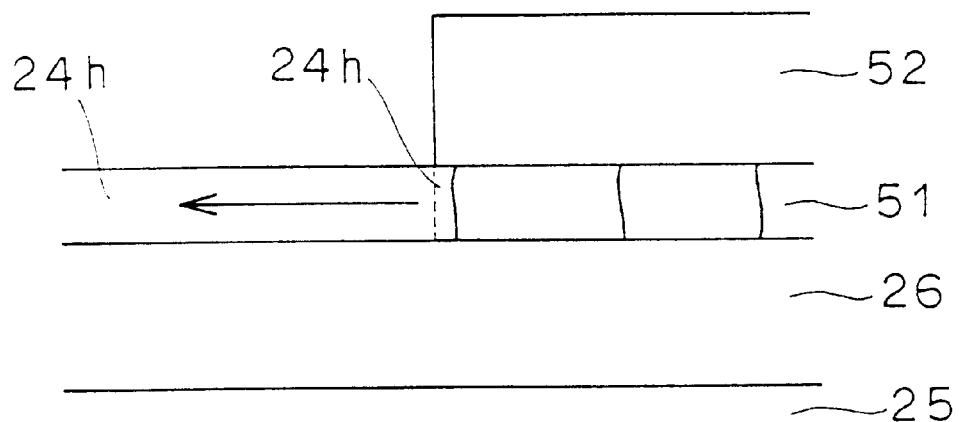

Referring to FIG. 65, a first solid phase growth step is carried out with one grain 24h of polysilicon film 51 as a nucleus. It is not necessary to remove oxide film 52 in the heat treatment of solid phase growth since it is used as the mask for silicon implantation in the present embodiment.

Figure 66:
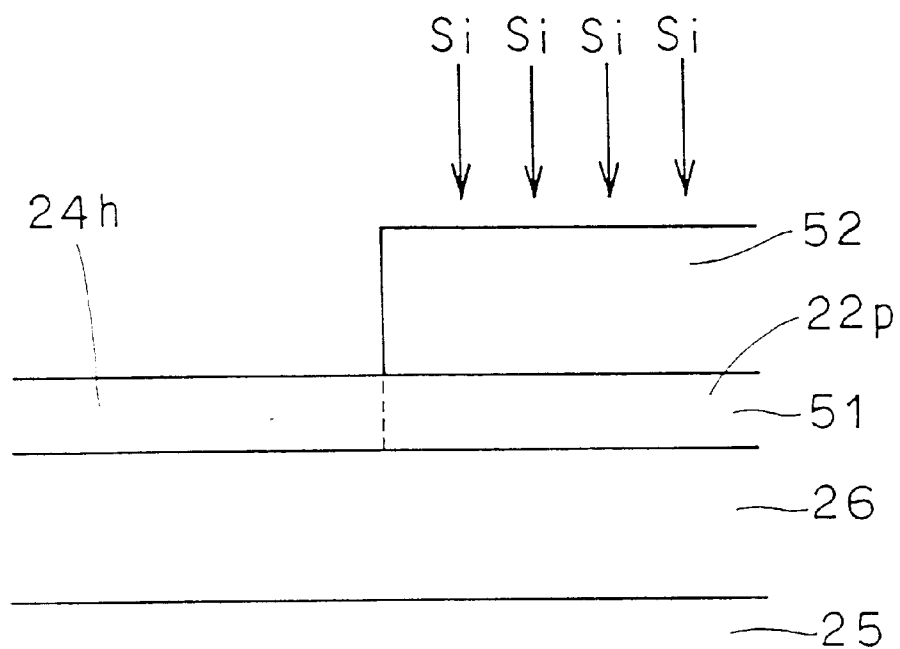

Referring to FIG. 66, a second silicon implantation step is carried out through oxide film 52 at implantation conditions of 380 kev and $5 \times 10^{15}/cm^2$. The portion of polysilicon covered with oxide film 52 is rendered amorphous. The second silicon implantation step is carried out so that the implantation peak comes in the proximity of the boundary of polysilicon film 51 and insulating film 26. There is no danger of the crystal structure of crystal grain 24h formed by the first solid phase growth step being damaged since the second silicon implantation step is carried out at a deep level.

Furthermore, there is no problem of mask disposition since oxide film 52 used in the second silicon implantation step is identical to that used in the first silicon implantation step.

Figure 67:
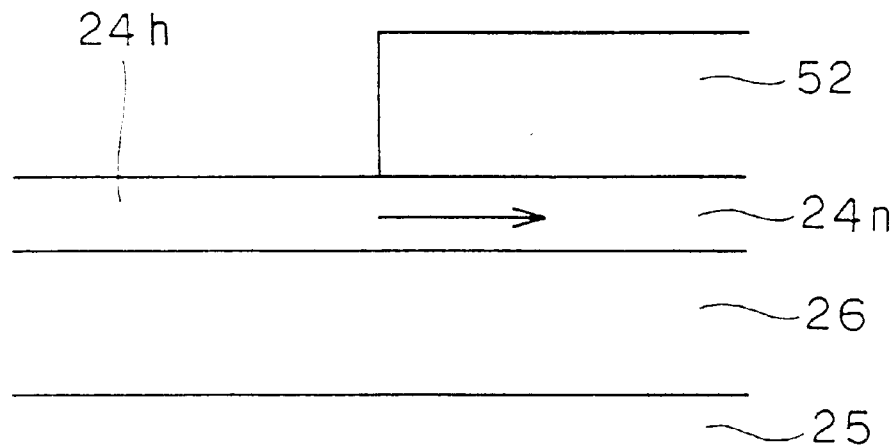

Following the second silicon implantation, a second solid phase growth step is carried out as shown in FIG. 67. By repeating this solid phase growth step for the remaining 2 times, a 4-stage solid phase growth step is achieved.

The sequence of the first and second silicon implantation steps may be opposite. Also, after the second silicon implantation step, oxide film 52 may be removed to carry out an annealing method similar to the process shown in FIG. 54.

The present invention is not limited to oxide film 52, and any film may be used as long as it can easily be processed on silicon 51. For example, a film may be used in which polysilicon is further layered on an oxide film.

A method of manufacturing a TFT according to an eleventh embodiment of the present invention will be described hereinafter with reference to FIGS. 68–71.

Figure 68:
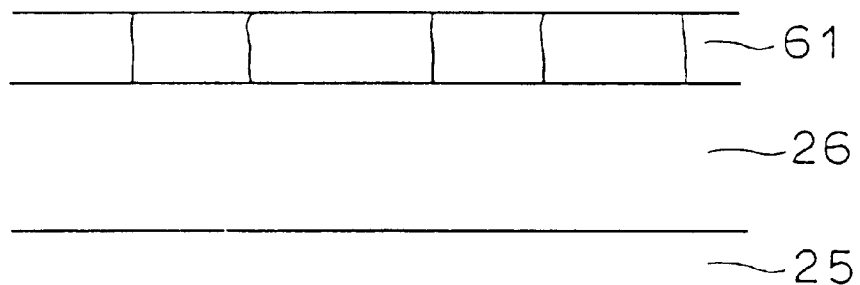
FIGS. 68–71 are sectional views of a TFT for describing 1st–4th manufacturing steps according to an eleventh embodiment of the present invention.
Figure 69:
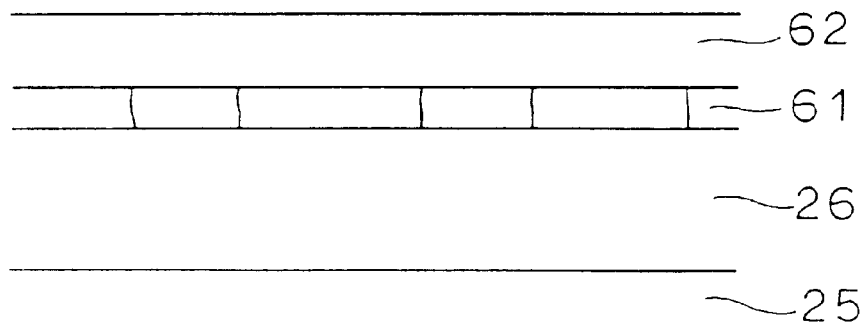

Referring to FIG. 68, an insulating film 26 is formed on a substrate 25. A polysilicon film 61 is formed to a thickness of approximately 2000 Å on insulating film 26 by CVD. An oxide film 62 is formed as shown in FIG. 69 by oxidation of polysilicon film 61 in an ambient including moisture for 180 minutes under a temperature condition of 820° C. By this formation of oxide film 62, the film thickness of polysilicon film 61 becomes approximately 1000 Å.

Figure 70:
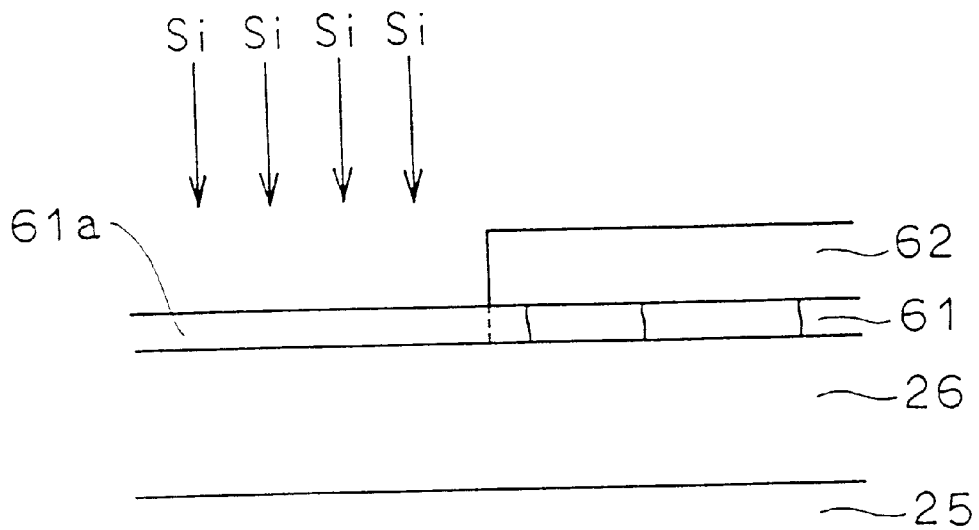

Referring to FIG. 70, after oxide film 62 is patterned, a first silicon implantation step is carried out using the patterned oxide film 62 as a mask. The implantation energy is 70 keV. As a result, amorphous silicon 61a is formed. Then, a first solid phase growth step is carried out to render amorphous silicon 61a into polysilicon 61.

Figure 71:
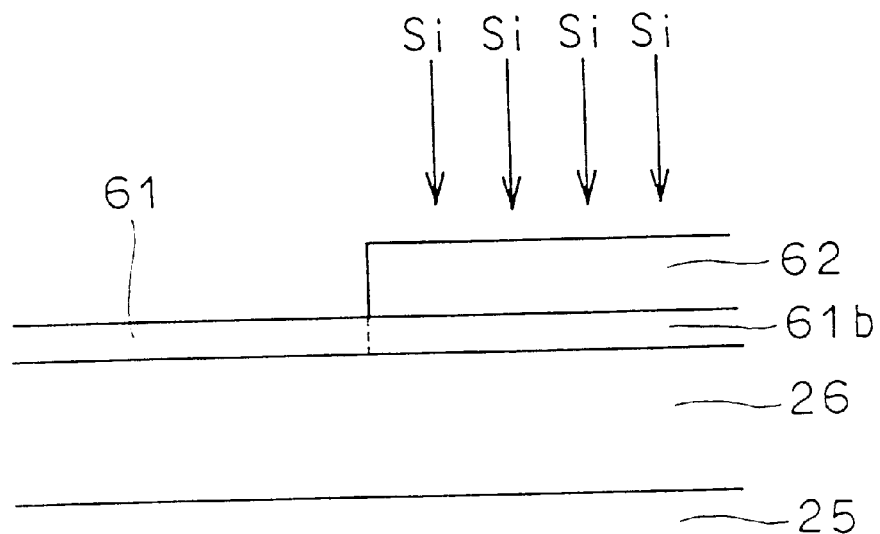

Referring to FIG. 71, a second silicon implantation step is carried out through the same patterned oxide film 62 at an implantation energy of 250 keV so that the implantation peak is established at the boundary of polysilicon 61 and insulating film 62. As a result, amorphous silicon 61b is formed. Next, a second solid phase growth step is carried out. A third silicon implantation and solid phase growth step and a fourth silicon implantation and solid phase growth step are carried out to achieve a 4-stage solid phase growth process. The present embodiment is characterized in that oxide film 62 is formed by oxidation of polysilicon 61, so that the crystal characteristics of the grain of polysilicon film 61 is improved. There is also an advantage that the leakage current is reduced due to the reduction in the film thickness of polysilicon film 61.

A method of manufacturing a TFT according to a twelfth embodiment of the present invention will be described whereinafter with reference to FIGS. 72–77. The twelfth embodiment shows the mask allocation and silicon implantation for a TFT array. In the above-described ninth embodiment using a 4-stage solid phase growth process, a grain boundary is eliminated from a TFT region. In the present 12th embodiment, the number of silicon implantation steps is reduced to 2 times utilizing the feature of the TFT array.

Figure 72:
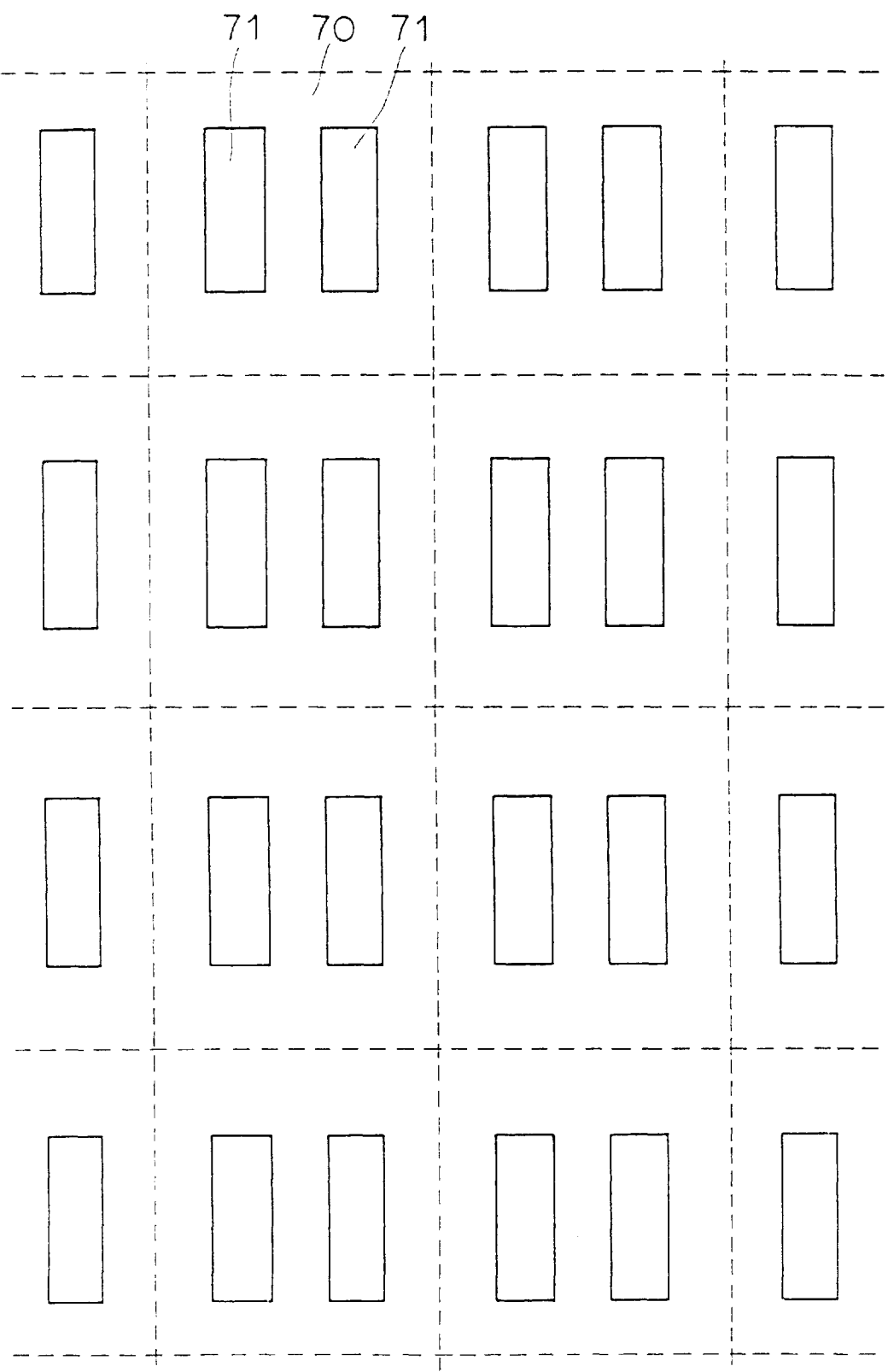

FIG. 72 is a plan view showing the allocation of TFTs in a TFT array. When a TFT is to be used in a SRAM cell 70, two TFTs 71 are used for one SRAM cell 70. The dotted line in the drawing indicates the boundary of one SRAM cell 70.

Figure 73:
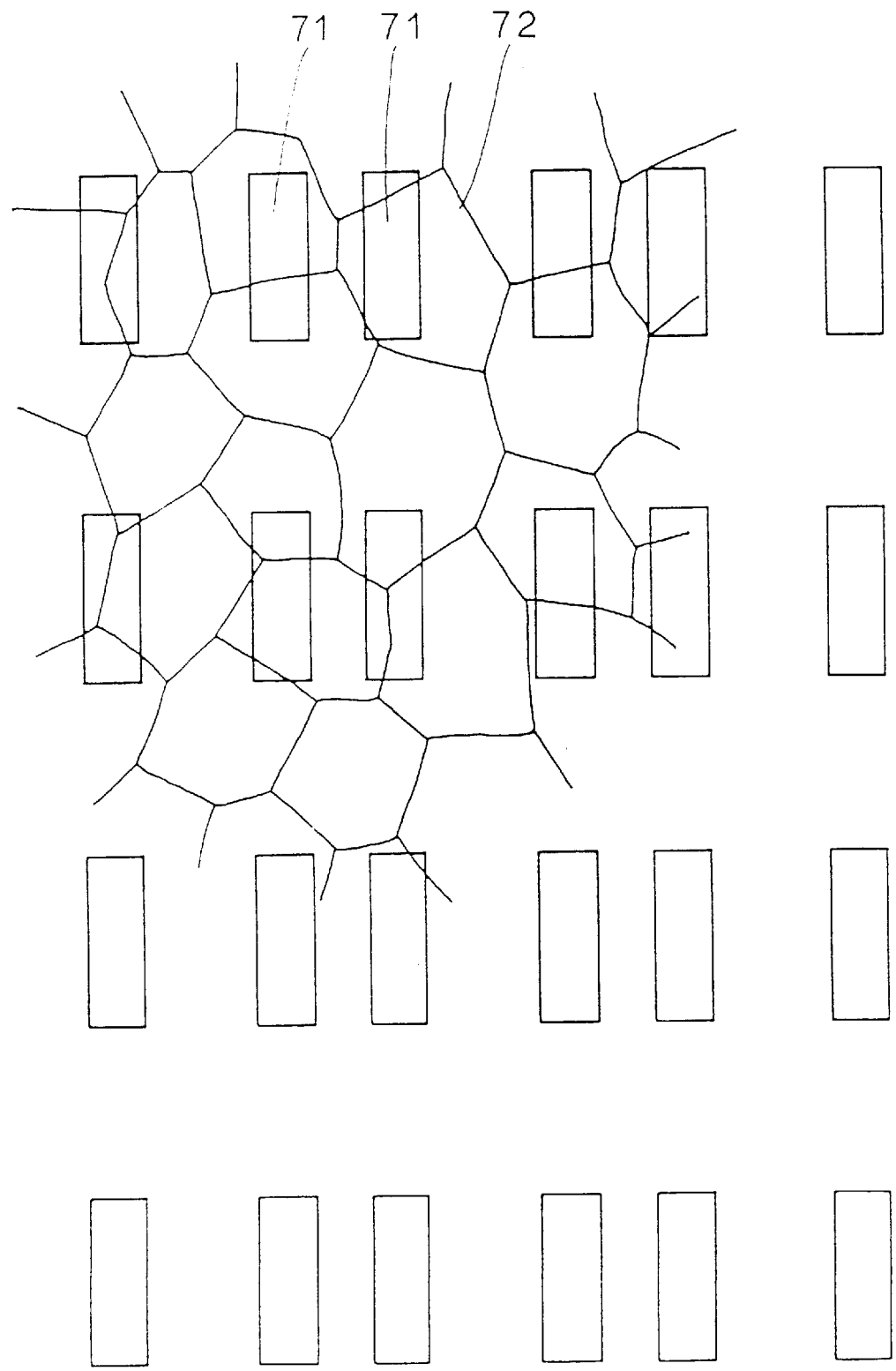

FIG. 73 shows a grain boundary 72 of a portion of polysilicon which becomes the channel region of TFT 71.

Figure 74:
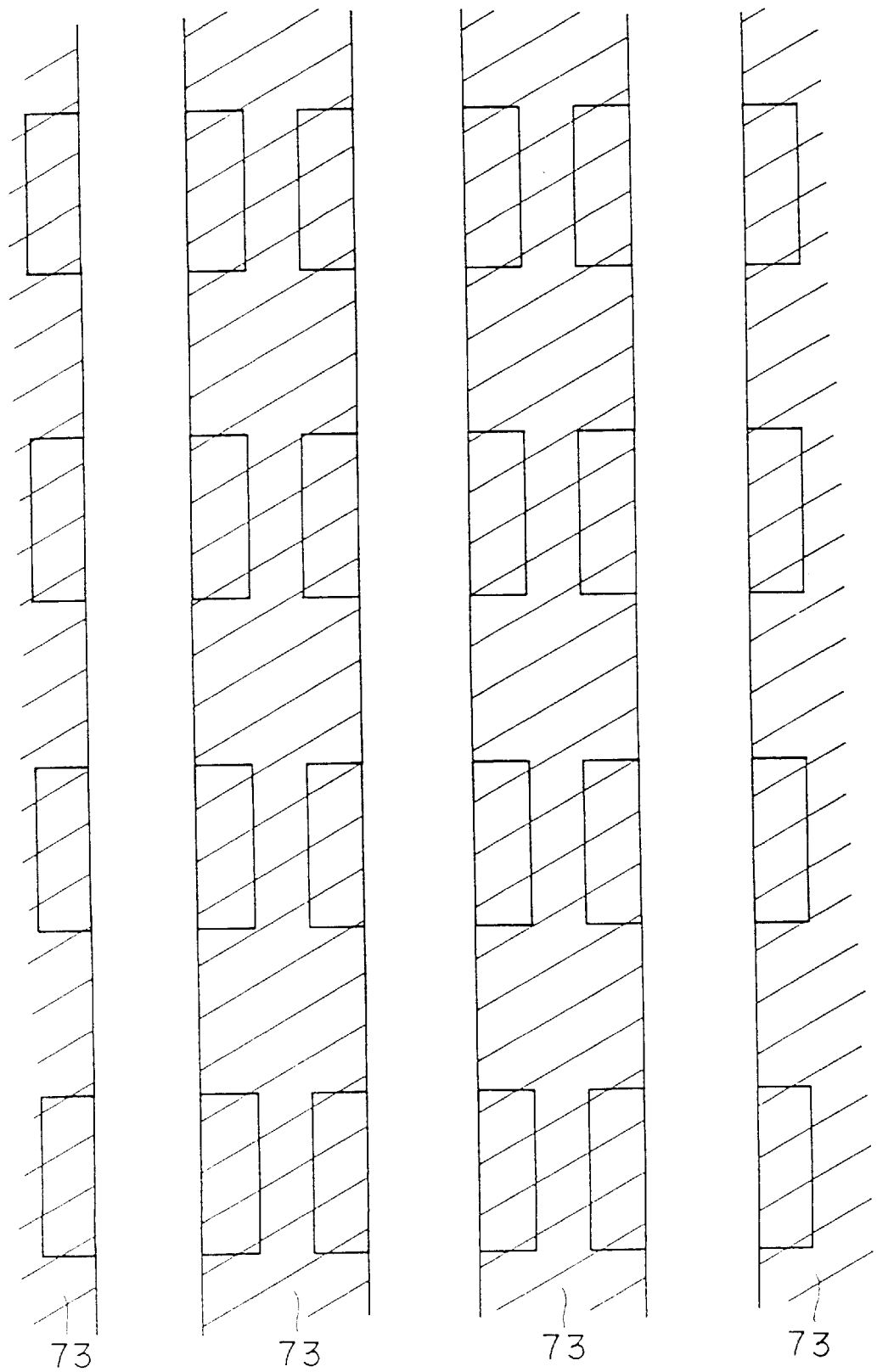

FIG. 74 is a plan view showing the region where the first silicon implantation step is to be carried out. The first silicon implantation step is carried out into a silicon implantation region (shaded area) 73 in FIG. 74.

Figure 75:
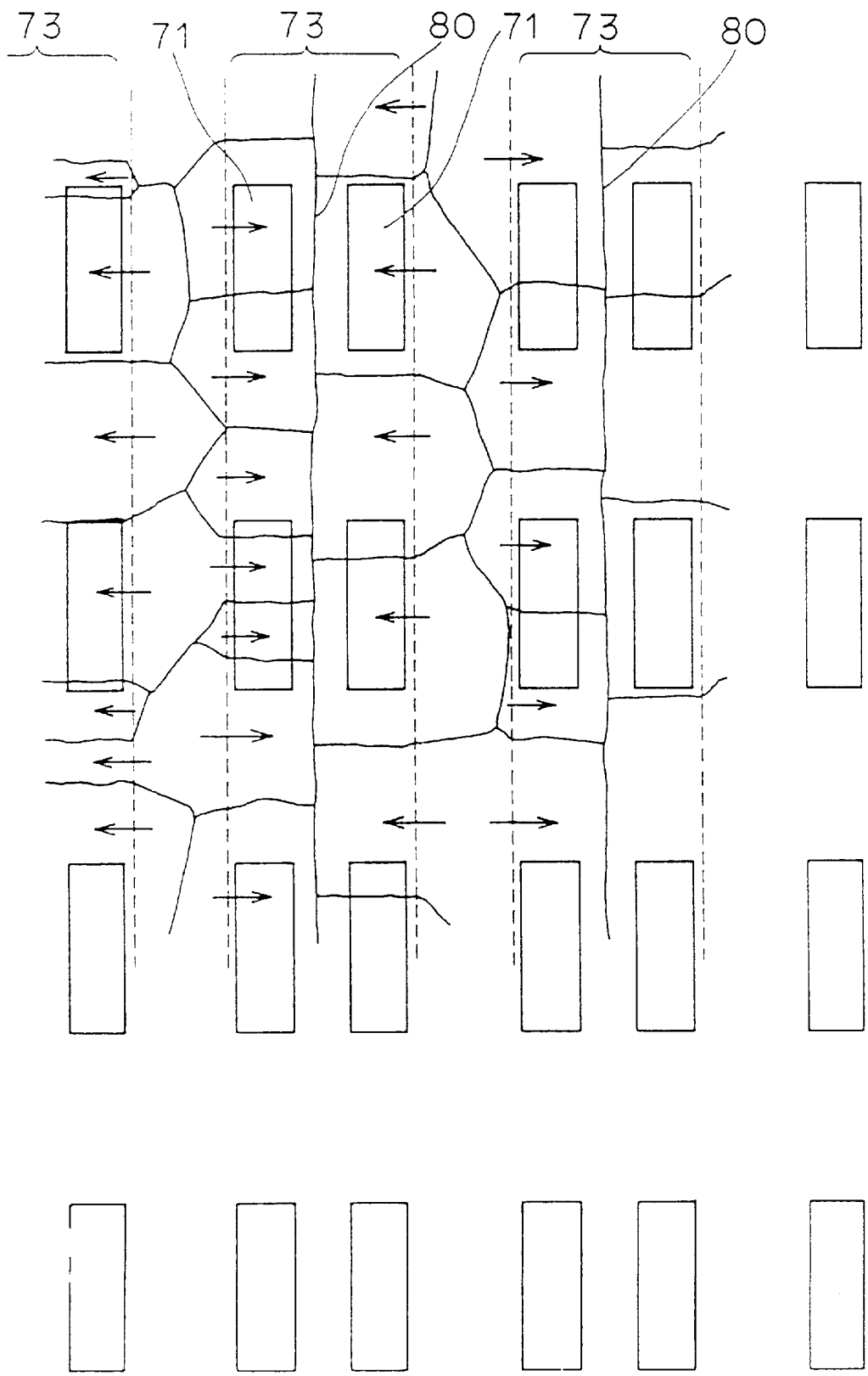

Referring to FIG. 75, a first solid phase growth step is carried out. During this first solid phase growth step, crystal growth occurs with crystal grains in the region other than silicon implantation region 73 as nuclei. Because crystal growth occurs from both sides of the region (silicon implantation region 73) rendered amorphous by silicon implantation, grain boundary 80 is always located between the two TFTs 71. By this step, polysilicon can be obtained in which a grain boundary 80 parallel to the longitudinal direction of TFT 71 does not exist in the region of TFT 71.

Referring to FIG. 76, a second silicon implantation step is carried out into a silicon implantation region (shaded region) 74.

Figure 77:
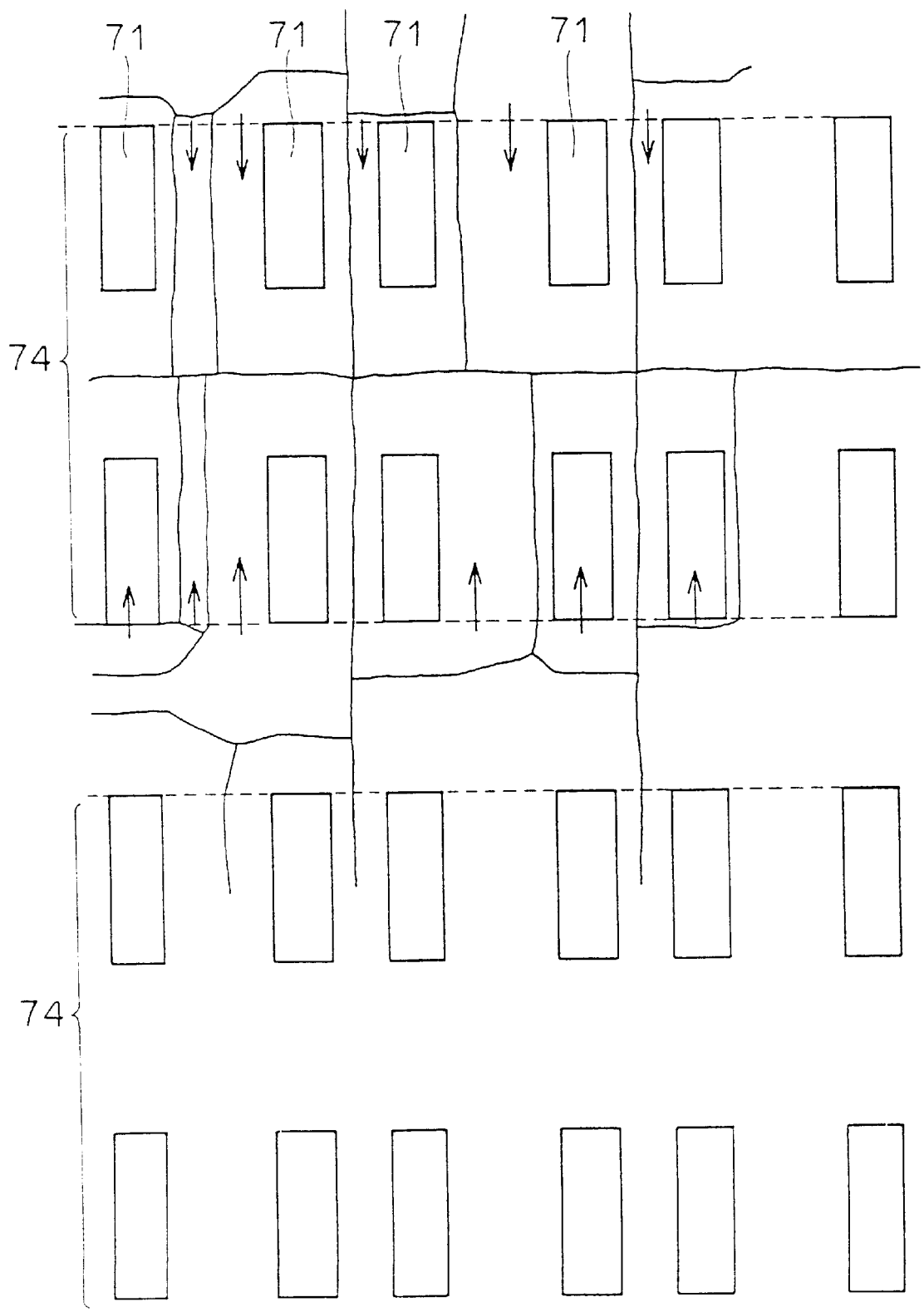

Referring to FIG. 77, a second solid phase growth step is carried out whereby the grain boundary parallel in the direction of the short side of TFT 71 can be eliminated. Thus, TFT 71 with no grain boundary in the TFT region can be formed by two stages of a silicon implantation and solid phase growth step.

Figure 78:
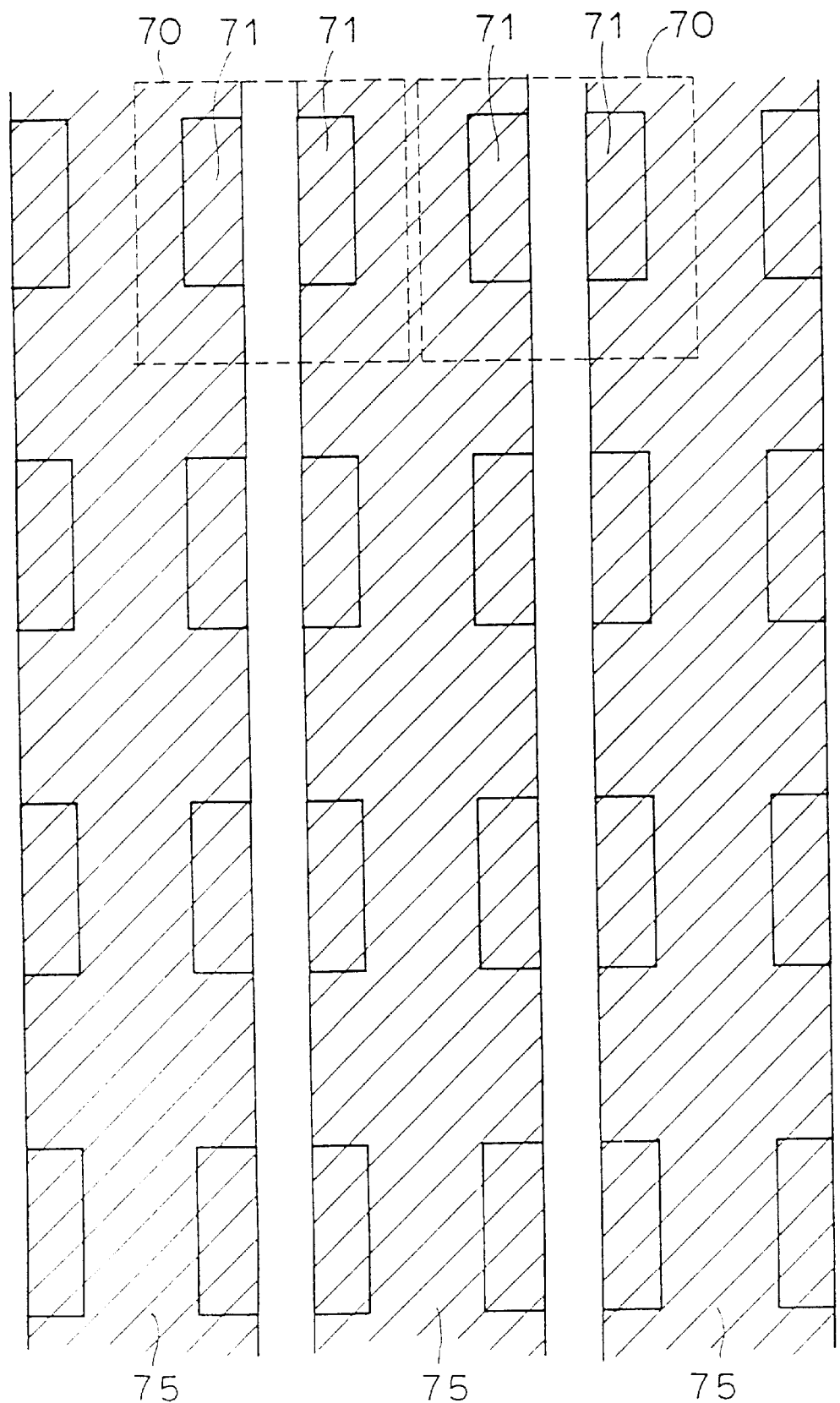
FIGS. 78 and 79 are plan views of a TFT for describing 13th and 14th embodiments of the present invention.

A method of manufacturing a TFT according to a thirteenth embodiment of the present invention is shown in FIG. 78. In comparison to the eleventh embodiment shown in FIG. 74, silicon implantation region (shaded area) 75 may be set so as to include TFT 71 of an adjacent SRAM cell 71.

Figure 79:
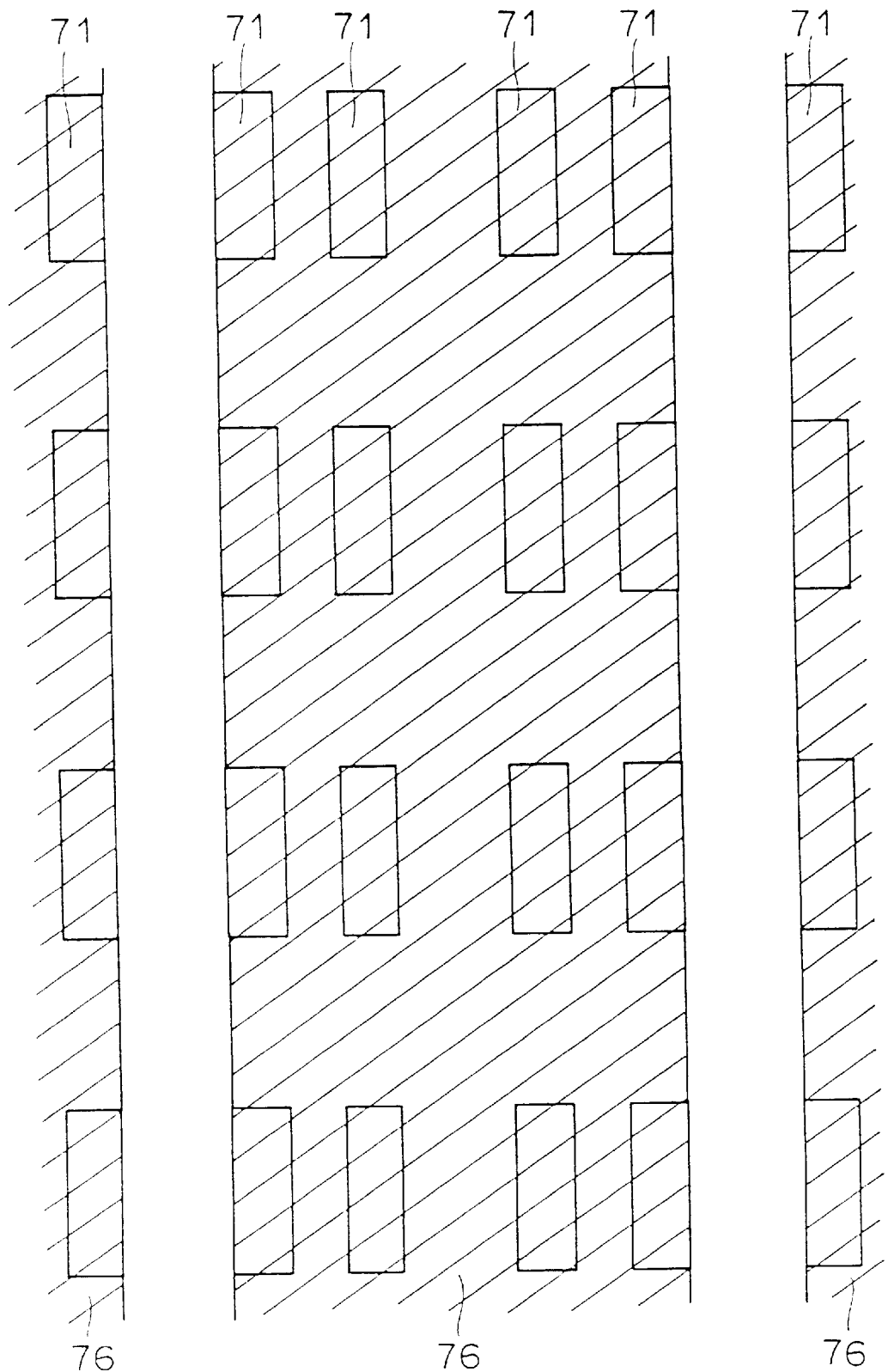
Figure 80:
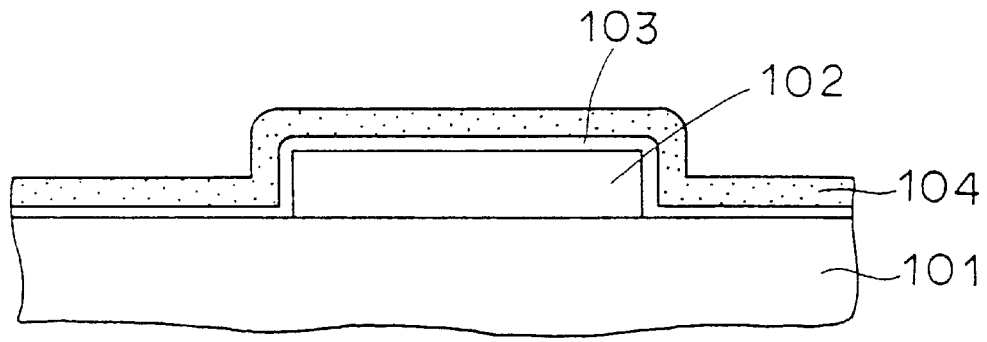
FIG. 80 is a sectional view for describing a conventional manufacturing method of a TFT.
Figure 81:
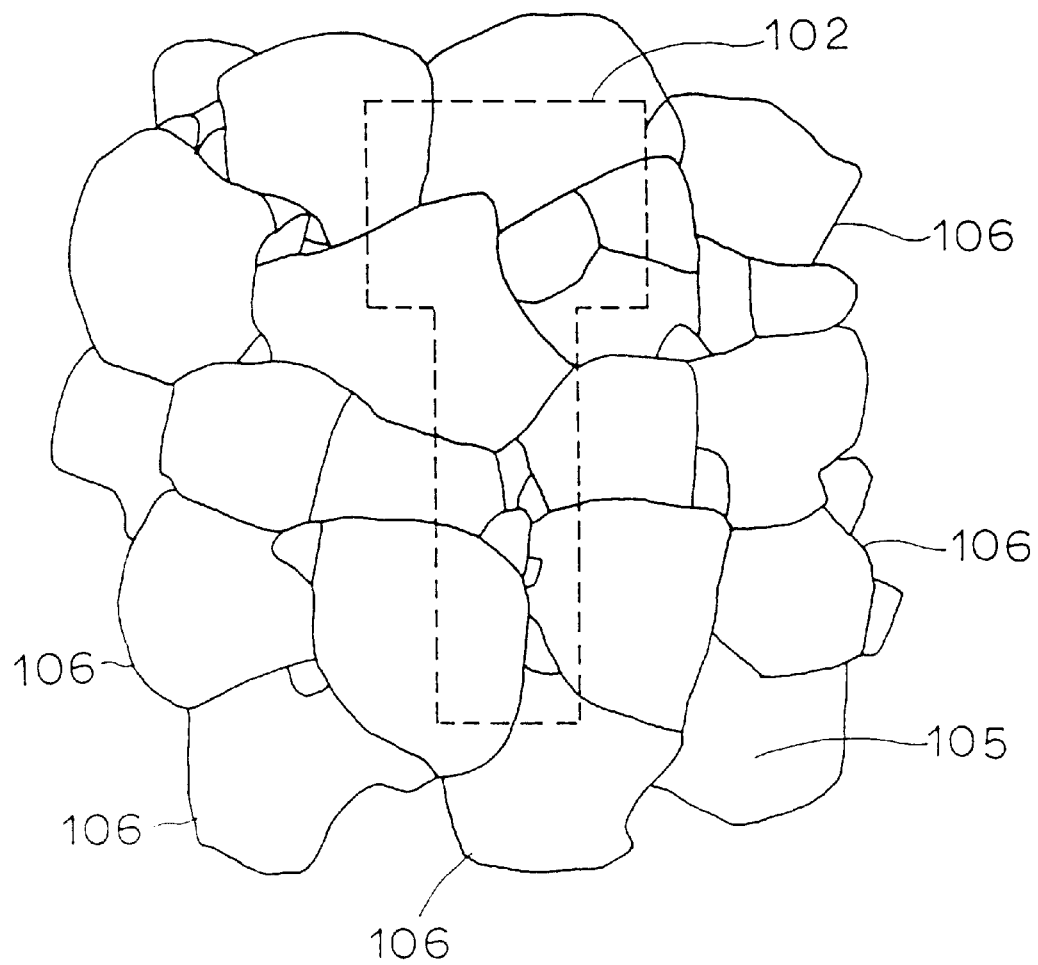
FIG. 81 is a plan view of the TFT of FIG. 80.
Figure 82:
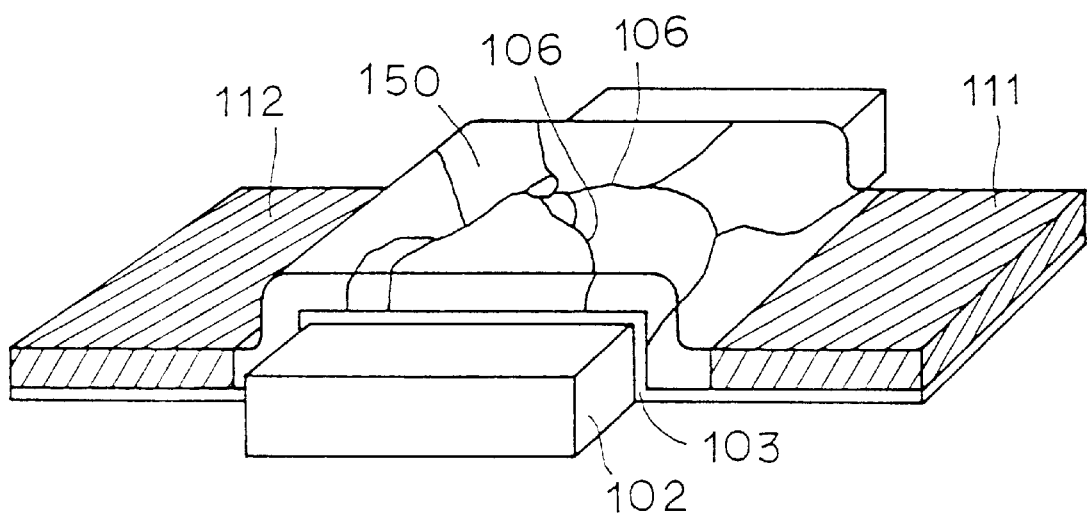
FIG. 82 is a perspective view showing a TFT formed by a conventional TFT manufacturing method.
Figure 83:
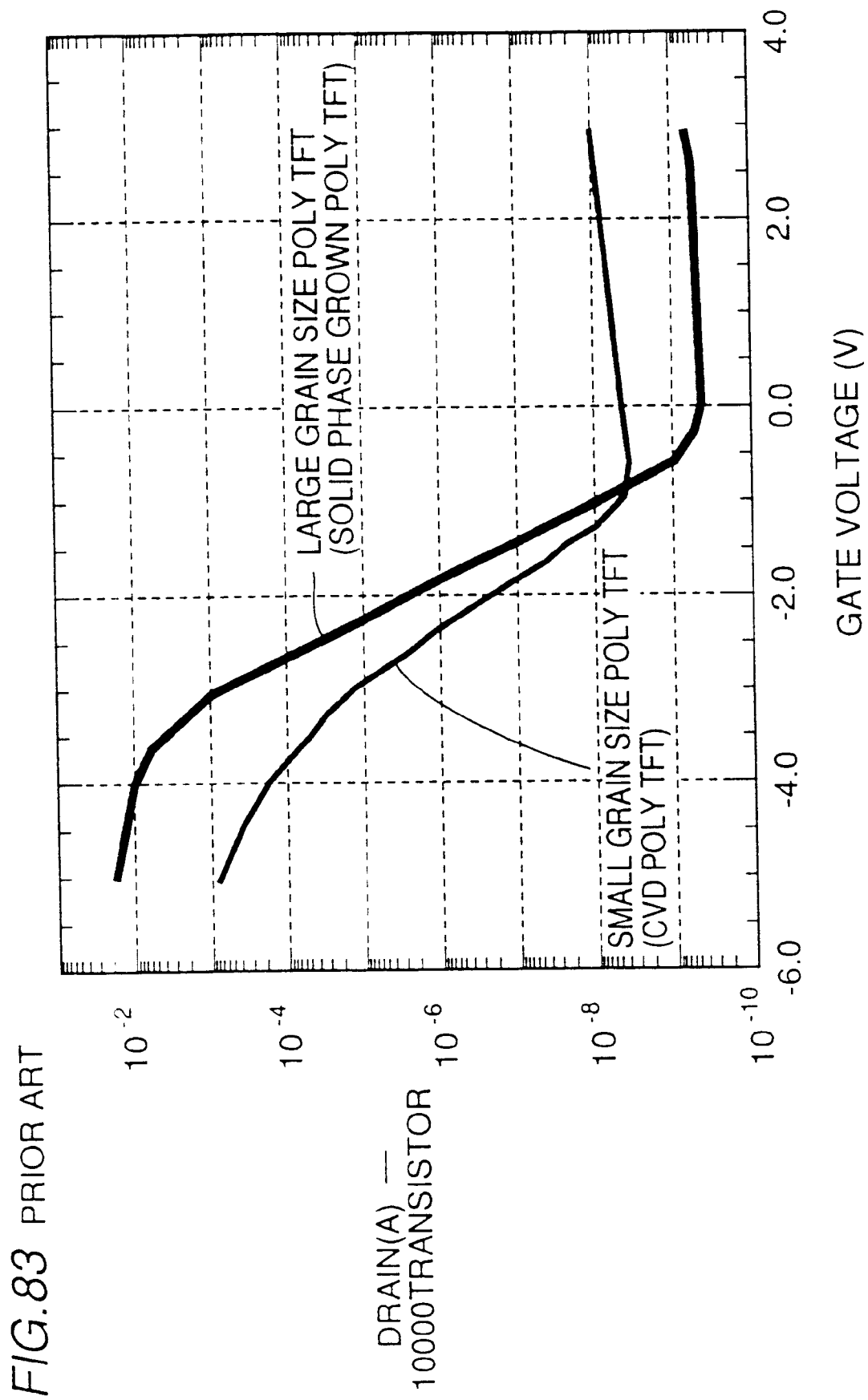
FIG. 83 is a diagram showing the electric characteristics of a TFT formed by a conventional TFT manufacturing method.
Figure 84:
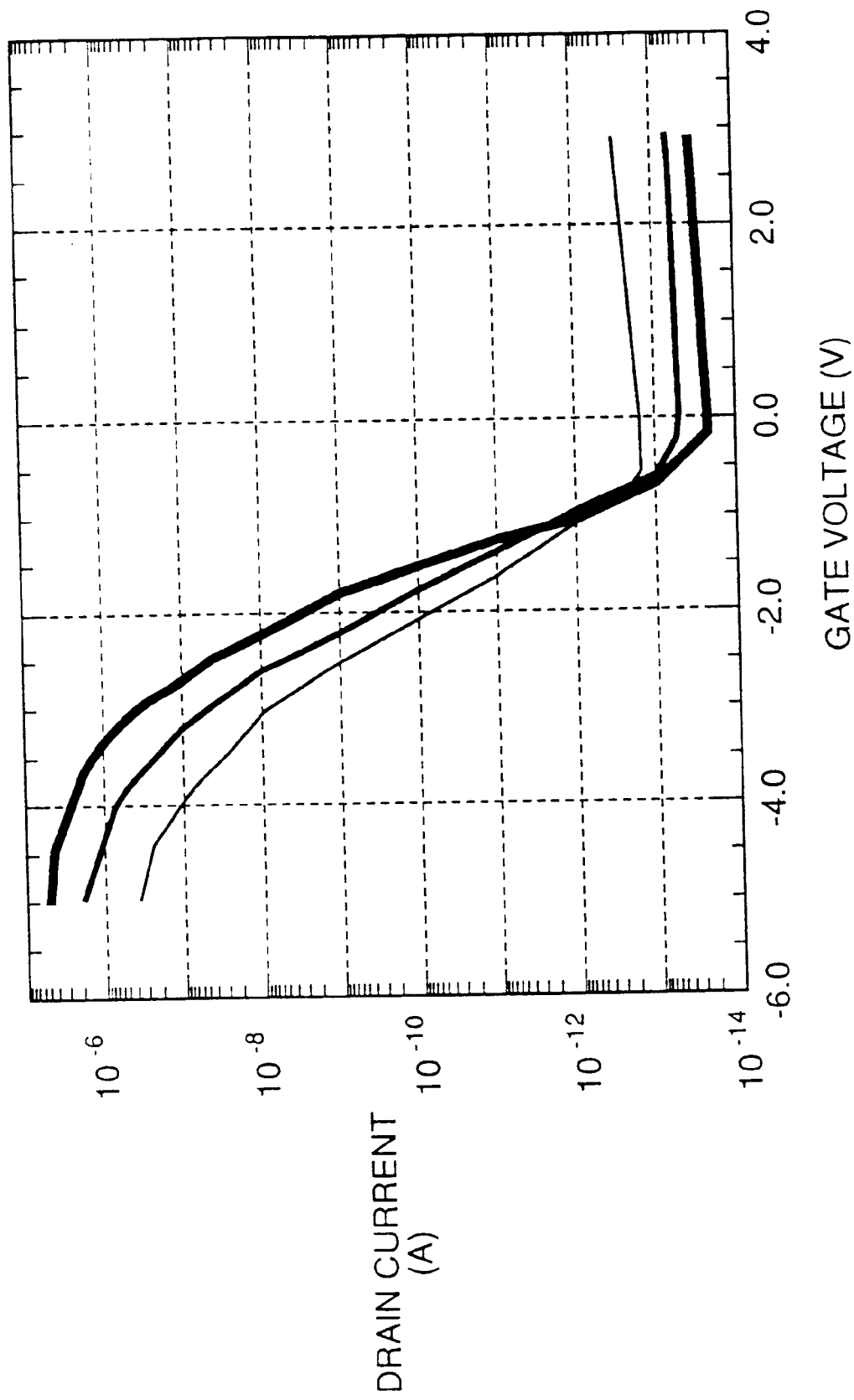
FIG. 84 is a diagram showing the electric characteristics of each TFT formed by a conventional TFT manufacturing method.

A method of manufacturing a TFT according to a fourteenth embodiment of the present invention is shown in FIG. 79 wherein a silicon implantation region (shaded area) 76 is set including a column of four TFTs 71. This structure is effective when TFT 71 is smaller than the grain size. The number of columns of TFTs 71 included in a silicon implantation region is not limited to 2 columns or 4 columns, and may be an arbitrary even number of columns. In the above-described first to seventh and ninth to fourteenth embodiments, nitrogen may be implanted instead of silicon.

According to an aspect of the present invention, a method of manufacturing a thin film transistor is characterized by forming a gate insulating film to cover a gate electrode on an insulating film, forming a polysilicon film on the gate insulating film, forming amorphous silicon by ion implanting either silicon or nitrogen into a predetermined region of the polysilicon film to render a portion of the polysilicon film amorphous with the polysilicon film partially remaining, and applying a heat treatment to convert the amorphous silicon into polysilicon with the remaining amorphous film as a seed crystal. As a result, polysilicon of a great grain size is formed in uniform with the selectively remaining polysilicon film serving as a seed crystal. Thus, the electric characteristics of a TFT is improved with no difference in the electric characteristics between each TFT.

According to another aspect of the present invention, a method of manufacturing a thin film transistor is characterized by forming a first mask layer in a first region of a polysilicon film, forming a first amorphous silicon by implanting either silicon or nitrogen into the polysilicon film using the first mask layer as a mask to render the region of the polysilicon film other than the first region amorphous, converting the first amorphous silicon into polysilicon with the polysilicon film of the first region as a seed crystal, forming a second mask layer in a second layer of the polysilicon film, forming a second amorphous silicon by implanting either silicon or nitrogen into the polysilicon film using the second mask layer as a mask in the region of the polysilicon film other than the second region, and converting the second amorphous silicon into polysilicon with the polysilicon film in the second region as the seed crystal. As a result, a TFT with eventually no grain boundary in the channel region can easily be formed by appropriately disposing the first and second regions. Thus, the electric characteristics of a TFT can easily be improved.

According to a further aspect of the present invention, a method of manufacturing a thin film transistor is characterized by forming a first mask layer at a first region of a polysilicon film, forming first amorphous silicon by ion implanting either silicon or nitrogen into the polysilicon film using the first mask layer as a mask to render the region of the polysilicon film amorphous except for the first region, and converting the first amorphous silicon into polysilicon with the polysilicon film in the first region as a seed crystal, whereby polysilicon of a great grain size can be formed in the region other than the first region. Then, ion implantation of either silicon or nitrogen is carried out through the first mask layer at an implantation energy that renders the first region beneath the first mask layer amorphous. The first region of the polysilicon film becomes second amorphous silicon, and a heat treatment is applied to convert the second amorphous silicon into polysilicon with the polysilicon film other than the first region as a seed crystal, whereby polysilicon of a great grain size can be formed in both the first region and the region other than the first region using only the first mask layer. Thus, polysilicon of a great grain size can easily be formed without increasing the number of mask layers.

According to a thin film transistor of still another aspect of the present invention, all the crystals have a grain size of at least 1000 Å in at least the channel region and the source/drain region of the polysilicon film formed on the gate insulating film, with nitrogen in at least the channel region and the source/drain region of the polysilicon film. Thus, a thin film transistor of superior electric characteristics can be formed while effectively preventing hot carriers from being trapped.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a thin film transistor comprising the steps of:

forming a gate electrode on an insulating film, forming a gate insulating film to cover said gate electrode, forming a polysilicon film on said gate insulating film, ion implanting one of silicon and nitrogen into a predetermined region of said polysilicon film to render a potion of said polysilicon film amorphous to form amorphous silicon with said polysilicon film partially remaining, and applying a heat treatment to convert said amorphous silicon into polysilicon with said remaining polysilicon film as a seed crystal, wherein said step of forming amorphous silicon comprises the step of rendering said polysilicon film amorphous except for a region of said polysilicon film in the proximity of at least one sidewall of said gate electrode.

2. A method of manufacturing a thin film transistor comprising the steps of:

forming a gate electrode on an insulating film, forming a gate insulating film to cover said gate electrode, forming a polysilicon film on said gate insulating film, ion implanting one of silicon and nitrogen into a predetermined region of said polysilicon film to render a portion of said polysilicon film amorphous to form amorphous silicon with said polysilicon film partially remaining, and applying a heat treatment to convert said amorphous silicon into polysilicon with said remaining polysilicon film as a seed crystal, wherein said step of ion implantation is carried out after an insulating film is formed on a region of said polysilicon film located in the proximity of a sidewall of said gate electrode.

3. A method of manufacturing a thin film transistor comprising the steps of:

forming a gate electrode on an insulating film, forming a gate insulating film to cover said gate electrode, forming a polysilicon film on said gate insulating film, ion implanting one of silicon and nitrogen into a predetermined region of said polysilicon film to render a portion of said polysilicon film amorphous to form amorphous silicon with said polysilicon film partially remaining, and applying a heat treatment to convert said amorphous silicon into polysilicon with said remaining polysilicon film as a seed crystal, wherein said step of forming amorphous silicon comprises the steps of forming an oxide film on a region of said polysilicon film to be rendered amorphous, and carrying out ion implantation in an oblique direction at an implantation energy so that ions of said ion implantation penetrate said oxide film to render said polysilicon film under said oxide film amorphous.

4. The method of manufacturing a thin film transistor according to claim 3, further comprising a step of patterning said polysilicon film using said oxide film as a mask.

5. A method of manufacturing a thin film transistor comprising the steps of:

forming a gate electrode on an insulating film, forming a gate insulating film to cover said gate electrode, forming a polysilicon film on said gate insulating film, ion implanting one of silicon and nitrogen into a predetermined region of said polysilicon film to render a portion of said polysilicon film amorphous to form amorphous silicon with said polysilicon film partially remaining, and applying a heat treatment to convert said amorphous silicon into polysilicon with said remaining polysilicon film as a seed crystal, wherein said step of forming amorphous silicon comprises the steps of forming an oxide film on a region of said polysilicon film to be rendered amorphous, carrying out ion implantation at an implantation energy so that ions of said ion implantation are penetrated through said oxide film to render said polysilicon film under said oxide film amorphous, whereby the polysilicon film beneath said oxide film is rendered amorphous except for a portion located at a sidewall of said gate electrode, and carrying out ion implantation at an implantation energy so that ions of said ion implantation do not penetrate said oxide film, whereby said polysilicon film is rendered amorphous except for the region located beneath said oxide film.

* * * * *